United States Patent
Tanizawa

(10) Patent No.: US 6,518,880 B2
(45) Date of Patent: Feb. 11, 2003

(54) PHYSICAL-QUANTITY DETECTION SENSOR

(75) Inventor: Yukihiko Tanizawa, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/880,791

(22) Filed: Jun. 15, 2001

(65) Prior Publication Data
US 2002/0067255 A1 Jun. 6, 2002

(30) Foreign Application Priority Data

Jun. 28, 2000 (JP) ........................... 2000-195139
Jun. 28, 2000 (JP) ........................... 2000-195140
Dec. 6, 2000 (JP) ........................... 2000-371928

(51) Int. Cl.[7] ................................. G08B 29/00
(52) U.S. Cl. ............. 340/514; 340/540; 340/551; 340/653; 340/657; 340/661; 340/663; 340/664
(58) Field of Search .................. 340/514, 661, 340/653, 563, 566, 657, 660, 663, 664, 662, 614, 540, 551

(56) References Cited

U.S. PATENT DOCUMENTS

| | | | | |
|---|---|---|---|---|
| 4,845,435 A | * | 7/1989 | Bohan, Jr. | 340/660 |
| 4,947,309 A | * | 8/1990 | Jonsson | 363/17 |
| 5,734,269 A | * | 3/1998 | Sakai et al. | 324/706 |
| 6,040,779 A | * | 3/2000 | Pfaff et al. | 340/661 |
| 6,188,340 B1 | * | 2/2001 | Matsumoto et al. | 341/110 |
| 6,289,738 B1 | * | 9/2001 | Zabler et al. | 73/726 |

FOREIGN PATENT DOCUMENTS

| | | |
|---|---|---|
| EP | 0962748 | 12/1999 |
| JP | 61-155931 | 7/1986 |
| JP | 62-95485 | 5/1987 |
| JP | 3-210047 | 9/1991 |
| JP | 8-247881 | 9/1996 |
| JP | 9-304427 | 11/1997 |
| JP | 10-506718 | 6/1998 |
| JP | 10-300615 | 11/1998 |
| JP | 2000-146991 | 5/2000 |
| WO | WO 96/22515 | 7/1996 |

* cited by examiner

Primary Examiner—Daniel J. Wu
Assistant Examiner—Daniel Previl
(74) Attorney, Agent, or Firm—Law Offices of David G. Posz

(57) ABSTRACT

A physical-quantity detection sensor includes a sensor portion (10) for generating and outputting a voltage depending on a physical quantity. A signal processing circuit (4) operates for processing the voltage outputted from the sensor portion (10) to generate and output a voltage depending on the voltage outputted from the sensor portion (10) during a physical-quantity sensing mode of operation. A reference voltage is inputted into the signal processing circuit (4) during a checking mode of operation which differs from the physical-quantity sensing mode of operation. The reference voltage is different from the voltage outputted from the sensor portion (10). During the checking mode of operation, a malfunction of the signal processing circuit (4) is detected on the basis of an output signal from the signal processing circuit (4) which responds to the reference voltage inputted thereinto.

48 Claims, 19 Drawing Sheets

PHYSICAL-QUANTITY DETECTION SENSOR

BACKGROUND OF THE INVENTION

1. Field of the Invention

This invention relates to a physical-quantity detection sensor such as a pressure sensor. This invention also relates to a physical-quantity detection apparatus. This invention further relates to a sensor-signal processing apparatus.

2. Description of the Related Art

U.S. Pat. No. 6,040,779 discloses monitoring of the function of a symmetrical sensor bridge circuit which is performed in that the signal from the positive or negative half-bridge is subtracted from half the bridge supply voltage in a summing member and is subsequently amplified by an amplifier in such a way that it corresponds to the full bridge signal. The full bridge signal is compared with the amplified difference signal in a comparator. If the difference signal deviates in an unacceptable manner from the full bridge signal, the comparator switches an alarm signal on the output signal of the sensor so that this output signal is placed into a range which lies outside of the normal operational range of the sensor.

PCT application publication number WO 96/22515 discloses a semiconductor pressure transducer which comprises a silicon die having a topside and a bottom side. The silicon die further has a cavity in the bottom side, thereby forming a diaphragm. Four piezoresistive elements are disposed on the topside of the silicon die on a periphery of the diaphragm and connected via metalized conductors disposed on the silicon die in the form of a Wheatstone bridge. A plurality of bonding pads disposed on the topside of the silicon die provides external access to the Wheatstone bridge circuit. A diagnostic conductor is disposed on the topside of the silicon die such that the periphery of the diaphragm is crossed, the diagnostic conductor being connected to corresponding bonding pads at each of the diagnostic conductor. Thus, when the diaphragm ruptures, the diagnostic conductor ruptures thereby providing a positive indication of the rupture of the diaphragm by external circuitry in which the diagnostic conductor is used.

Japanese patent application publication number 2000-146991 corresponding to European patent application EP 0962748 A1 discloses monitoring of the function of a sensor component. The monitoring in Japanese application 2000-146991 is of an extended version designed to identify a change of ambient conditions and to timely take a countermeasure against an operation stop. In Japanese application 2000-146991, a sensor component is formed in a monolithic integral circuit, and has a sensor and at least one measurement amplifier. The sensor component is provided with external terminals for at least the feed of a current and an output measurement signal. Furthermore, an evaluation circuit is provided in the sensor component, and is connected to at least a circuit internal measurement point. The evaluation circuit is connected to a modulator for modulating at least one of a fed current, a fed voltage, and the output measurement signal. A diagnosis signal generated from circuit internal measurement values is fed out from an existing external connection terminal in the sensor component.

Japanese patent application publication number 10-506718 corresponding to PCT application publication number WO 97/05464 discloses a sensor having a diaphragm. In the sensor of Japanese application 10-506718, first and second resistance measurement bridges are placed on first and second half areas of the diaphragm, respectively. Two bridge signals generated by the first and second resistance measurement bridges are compared to check the function of the sensor and to detect a malfunction of the sensor.

Japanese patent application publication number 61-155931 discloses a pressure sensor including a first diaphragm and a second diaphragm. The first diaphragm supports a sensor member, and can deform in response to a pressure to be detected. The first diaphragm defines a reference pressure chamber. The second diaphragm supports a checking sensor member for generating a signal corresponding to a leakage from the reference chamber. The second diaphragm separates the reference pressure chamber from a checking pressure chamber. The checking sensor member is placed in the reference pressure chamber.

Japanese patent application publication number 8-247881 discloses a pressure difference sensor with a diagnosis function. In the sensor of Japanese application 8-247881, a bridge is composed of gauge resistors whose resistances vary in response to a distortion depending on a pressure to be detected. An energizing power supply is connected with the bridge. Two signals which appear at respective legs of the bridge are added into an addition result signal. The addition result signal is compared with a threshold level. When the addition result signal exceeds the threshold level, it is diagnosed that the sensor is abnormal.

Japanese patent application publication number 62-95485 discloses an apparatus designed so that an abnormality-indicating signal is outputted to an external when operation of a sensor is wrong. The apparatus of Japanese application 62-95485 includes a sensor power supply and a sensor portion which are connected to each other via a power feed line and an output signal line. The sensor portion has a carrier generation circuit and a carrier superimposing circuit. The carrier generation circuit acts to generate a radio-frequency signal (a carrier). The carrier generation circuit is activated and deactivated in response to whether or not a sensor circuit is normal. The carrier superimposing circuit operates to superimpose the radio-frequency signal (the carrier) on electric power supplied along the power feed line. The sensor power supply has a carrier sensing circuit for detecting the presence and absence of the carrier superimposed on the electric power supplied along the power feed line. The carrier sensing circuit outputs a signal to an external which indicates whether or not the sensor is normal.

Japanese patent application publication number 10-300615 discloses an on-line self diagnosis on a semiconductor pressure sensor including a diaphragm. In Japanese application 10-300615, the sensor is designed to output two signals. The two output signals from the sensor are inputted into a microcomputer on a time sharing basis, and are processed thereby. The signal processing by the microcomputer is designed to detect a damage to the diaphragm, a damage to a sensor connector, ageing-based variations in the conditions of a sensing portion and a circuit portion of the sensor, an ageing-based variation in the sensor sensitivity, and a variation in the zero point of the sensor.

Japanese patent application publication number 3-210047 discloses a sensor abnormality diagnosis apparatus. In the apparatus of Japanese application 3-210047, a sensor uses a power supply voltage as a reference voltage, and a pull-up resistor is subjected to the power supply voltage. The pull-up resistor may be replaced by a pull-down resistor connected to the ground. A current driven into the sensor is changed by varying the resistance of the pull-up resistor or the pull-down resistor. Detection is made as to a quantity of a variation in an output voltage from the sensor which occurs when the current driven into the resistor is changed. The detected variation quantity is compared with a reference variation quantity represented by data stored in a memory. The reference variation quantity is available when the sensor is normal. When the detected variation quantity is greater than the reference variation quantity, the sensor is diagnosed as being abnormal.

Japanese patent application publication number 9-304427 discloses a physical-quantity detecting apparatus which includes an acceleration sensor having a sensing portion and a diagnosing portion. The sensing portion detects an acceleration as a physical quantity, and outputs a signal depending on the detected acceleration. The diagnosing portion implements a diagnosing process of deciding whether the sensing portion is normal or abnormal in response to the output signal therefrom. On the basis of the result of the diagnosing process, the diagnosing portion changes a current flowing through a power supply terminal. From a voltage depending on the current flowing through the power supply terminal, a microcomputer gets information of the result of the diagnosing process.

SUMMARY OF THE INVENTION

It is a first object of this invention to provide an improved physical-quantity detection sensor.

It is a second object of this invention to provide an improved physical-quantity detection apparatus.

It is a third object of this invention to provide an improved sensor-signal processing apparatus.

A first aspect of this invention provides a physical-quantity detection sensor comprising a sensor portion (10) for generating and outputting a voltage depending on a physical quantity; a signal processing circuit (4) for processing the voltage outputted from the sensor portion (10) to generate and output a voltage depending on the voltage outputted from the sensor portion (10) during a physical-quantity sensing mode of operation; means for inputting a reference voltage into the signal processing circuit (4) during a checking mode of operation which differs from the physical-quantity sensing mode of operation, the reference voltage being different from the voltage outputted from the sensor portion (10); and means for, during the checking mode of operation, detecting a malfunction of the signal processing circuit (4) on the basis of an output signal from the signal processing circuit (4) which responds to the reference voltage inputted thereinto.

A second aspect of this invention provides a physical-quantity detection sensor comprising a sensor portion (10) for generating and outputting a voltage depending on a physical quantity; a signal processing circuit (4); a checking signal generation portion (20) for outputting a reference voltage for check; means for, during a physical-quantity sensing mode of operation, inputting the voltage outputted from the sensor portion (10) into the signal processing circuit (4) to implement detection of the physical quantity; means for, during a checking mode of operation which differs from the physical-quantity sensing mode of operation, inputting the reference voltage into the signal processing circuit (4) from the checking signal generation portion (20); and means for, during the checking mode of operation, detecting a malfunction of the signal processing circuit (4) on the basis of an output signal from the signal processing circuit (4) which responds to the reference voltage inputted thereinto.

A third aspect of this invention provides a physical-quantity detection sensor comprising a sensor portion (10) for generating and outputting a voltage depending on a physical quantity; a signal processing circuit (4); a checking signal generation portion (20) for outputting a reference voltage for check; means for, during a physical-quantity sensing mode of operation, selecting the voltage outputted from the sensor portion (10) and inputting the selected voltage into the signal processing circuit (4); and means for, during a checking mode of operation which differs from the physical-quantity sensing mode of operation, selecting the reference voltage outputted from the checking signal generation portion (20) and inputting the reference voltage into the signal processing circuit (4).

A fourth aspect of this invention is based on the second aspect thereof, and provides a physical-quantity detection sensor wherein the checking signal generation portion (20) comprises a Wheatstone bridge circuit including a tetragonal closed circuit having a series combination of resistors, and means for outputting a difference between voltages at opposite junctions in the Wheatstone bridge circuit as the reference voltage.

A fifth aspect of this invention is based on the fourth aspect thereof, and provides a physical-quantity detection sensor wherein the checking signal generation portion (20) comprises a constant-current circuit (21) for controlling a current in the Wheatstone bridge circuit.

A sixth aspect of this invention is based on the fifth aspect thereof, and provides a physical-quantity detection sensor further comprising a memory (22) storing data related to a current, and means for controlling the constant-current circuit (21) in response to the data stored in the memory (22).

A seventh aspect of this invention is based on the second aspect thereof, and provides a physical-quantity detection sensor wherein the checking signal generation portion (20) comprises a D/A conversion circuit of an R-2R ladder structure.

An eighth aspect of this invention is based on the second aspect thereof, and provides a physical-quantity detection sensor further comprising an analog multiplexer for inputting the voltage outputted from the sensor portion (10) into the signal processing circuit (4) during the physical-quantity sensing mode of operation, and for inputting the reference voltage into the signal processing circuit (4) from the checking signal generation portion (20) during the checking mode of operation.

A ninth aspect of this invention is based on the first aspect thereof, and provides a physical-quantity detection sensor wherein the signal processing circuit (4) comprises means for amplifying the voltage outputted from the sensor portion (10), and means for compensating for an offset and an offset-temperature-characteristic of the sensor portion (10).

A tenth aspect of this invention is based on the ninth aspect thereof, and provides a physical-quantity detection sensor further comprising comparing means (33) for, during the checking mode of operation, comparing the output signal from the signal processing circuit (4) with a predetermined reference signal, and means for, during the checking mode of operation, detecting a malfunction of the signal processing circuit (4) on the basis of a result of the comparing by the comparing means.

An eleventh aspect of this invention is based on the tenth aspect thereof, and provides a physical-quantity detection sensor further comprising means (34) for generating an output voltage which depends on whether or not a malfunction of the signal processing circuit (4) is detected on the basis of the result of the comparing by the comparing means (33).

A twelfth aspect of this invention is based on the first aspect thereof, and provides a physical-quantity detection sensor further comprising a diagnosis command signal generating portion for outputting a diagnosis command signal which provides change between the physical-quantity sensing mode of operation and the checking mode of operation.

A thirteenth aspect of this invention is based on the twelfth aspect thereof, and provides a physical-quantity detection sensor wherein the diagnosis command signal generating portion comprises a load (352) subjected to a prescribed power supply voltage; a transistor (351) connected in series with the load; first and second resistors (R1, R2) for generating a voltage which controls the transistor; and means for outputting a voltage at a junction between the load and the transistor as the diagnosis command signal.

A fourteenth aspect of this invention is based on the first aspect thereof, and provides a physical-quantity detection sensor further comprising a first memory for storing corrective data for the signal processing circuit and corrective data for the sensor portion, a second memory for storing corrective data for the signal processing circuit, and means provided in the signal processing circuit for using the corrective data stored in the second memory during the checking mode of operation.

A fifteenth aspect of this invention is based on the fourteenth aspect thereof, and provides a physical-quantity detection sensor further comprising a chip on which the signal processing circuit and the sensor portion are formed.

A sixteenth aspect of this invention is based on the first aspect thereof, and provides a physical-quantity detection sensor further comprising a memory for storing corrective data for the signal processing circuit, and means provided in the signal processing circuit for using the corrective data stored in the memory during the physical-quantity sensing mode of operation and the checking mode of operation.

A seventeenth aspect of this invention is based on the sixteenth aspect thereof, and provides a physical-quantity detection sensor further comprising a first chip on which the sensor portion is formed, a second chip on which the signal processing circuit is formed, the second chip differing from the first chip, the memory being formed on the second chip.

An eighteenth aspect of this invention is based on the first aspect thereof, and provides a physical-quantity detection sensor further comprising an output circuit (34) for generating a voltage signal in response to the output signal from the signal processing circuit (4), a comparator (33) for comparing the voltage signal generated by the output circuit (34) with a predetermined reference signal to detect a malfunction of the signal processing circuit (4) during the checking mode of operation, and means for controlling the output circuit (34) in response to a result of the comparing by the comparator (33) to cause the output circuit (34) to generate an output voltage which depends on whether or not a malfunction of the signal processing circuit (4) is detected.

A nineteenth aspect of this invention is based on the first aspect thereof, and provides a physical-quantity detection sensor further comprising a comparator (33) for comparing the output signal from the signal processing circuit (4) with a predetermined reference signal to detect a malfunction of the signal processing circuit (4) during the checking mode of operation, and outputting a signal representing whether or not a malfunction of the signal processing circuit (4) is detected during the checking mode of operation.

A twentieth aspect of this invention provides a physical-quantity detection sensor comprising a sensor portion (10) for generating and outputting a voltage depending on a physical quantity; a signal processing circuit (4); a checking signal generation portion (20) including a bridge circuit for outputting a reference voltage for check which is insensitive to the physical quantity; means for, during a physical-quantity sensing mode of operation, inputting the voltage outputted from the sensor portion (10) into the signal processing circuit (4) to implement detection of the physical quantity; means for, during a checking mode of operation which differs from the physical-quantity sensing mode of operation, inputting the reference voltage into the signal processing circuit (4) from the checking signal generation portion (20); and a system control circuit for, during the checking mode of operation, detecting a malfunction of the signal processing circuit (4) on the basis of an output signal from the signal processing circuit (4) which responds to the reference voltage inputted thereinto.

A twenty-first aspect of this invention provides a physical-quantity detection sensor comprising a sensor portion (510) for generating and outputting a voltage depending on a physical quantity; a checking signal generation portion (520) for outputting a reference voltage for check; a signal processing circuit (504, 533); means for, during a physical-quantity sensing mode of operation, selecting the voltage outputted from the sensor portion and inputting the selected voltage into the signal processing circuit; means for, during a checking mode of operation after the physical-quantity sensing mode of operation, selecting the reference voltage outputted from the checking signal generation portion and inputting the reference voltage into the signal processing circuit; and means (534) for continuously outputting a sensor output signal during the checking mode of operation, the sensor output signal being an output signal from the signal processing circuit occurring at a moment in the physical-quantity sensing mode of operation which immediately precedes the checking mode of operation.

A twenty-second aspect of this invention is based on the twenty-first aspect thereof, and provides a physical-quantity detection sensor wherein the continuously outputting means comprises means (534) for latching an output signal from the signal processing circuit at a moment in the physical-quantity sensing mode of operation which immediately precedes the checking mode of operation, and continuously outputting the latched signal as the sensor output signal during the checking mode of operation.

A twenty-third aspect of this invention is based on the twenty-second aspect thereof, and provides a physical-quantity detection sensor wherein the checking signal generation portion comprises a Wheatstone bridge circuit including a tetragonal closed circuit having a series combination of resistors (523, 524, 525, 526), and means for outputting a difference between voltages at opposite junctions (529, 530) in the Wheatstone bridge circuit as the reference voltage.

A twenty-fourth aspect of this invention is based on the twenty-third aspect thereof, and provides a physical-quantity detection sensor wherein the checking signal generation portion comprises a constant-current circuit (521) for controlling a current in the Wheatstone bridge circuit.

A twenty-fifth aspect of this invention is based on the twenty-fourth aspect thereof, and provides a physical-quantity detection sensor further comprising a memory (522) storing data related to a current, and means for controlling the constant-current circuit (521) in response to the data stored in the memory (522).

A twenty-sixth aspect of this invention is based on the twenty-second aspect thereof, and provides a physical-quantity detection sensor wherein the checking signal generation portion comprises a D/A conversion circuit of an R-2R ladder structure.

A twenty-seventh aspect of this invention is based on the twenty-second aspect thereof, and provides a physical-quantity detection sensor further comprising an analog multiplexer (503) for inputting the voltage outputted from the sensor portion into the signal processing circuit during the physical-quantity sensing mode of operation, and for inputting the reference voltage into the signal processing circuit from the checking signal generation portion during the checking mode of operation.

A twenty-eighth aspect of this invention provides a physical-quantity detection sensor comprising a sensor portion (510) for generating and outputting a voltage depending on a physical quantity; a checking signal generation portion (520) for outputting a reference voltage for check; a signal processing circuit (504, 533); means for, during a physical-quantity sensing mode of operation, inputting the voltage outputted from the sensor portion into the signal processing circuit; means for, during a checking mode of operation after the physical-quantity sensing mode of operation, inputting the reference voltage into the signal processing circuit from the checking signal generation portion; means for, during the checking mode of operation, detecting a malfunction of the signal processing circuit on the basis of an output signal from the signal processing circuit which responds to the reference voltage inputted thereinto; and means (534) for latching the output signal from the signal processing circuit at a moment in the physical-quantity sensing mode of operation which immediately precedes the checking mode of operation, and continuously outputting the latched signal during the checking mode of operation.

A twenty-ninth aspect of this invention is based on the twenty-eighth aspect thereof, and provides a physical-quantity detection sensor wherein the signal processing circuit comprises an amplifier (504) for amplifying the voltage outputted from the sensor portion, and an A/D converter (533) for converting an output signal of the amplifier into a corresponding digital signal, and the latching means comprises means for latching the digital signal generated by the A/D converter at a moment in the physical-quantity sensing mode of operation which immediately precedes the checking mode of operation, and continuously outputting the latched digital signal during the checking mode of operation.

A thirtieth aspect of this invention is based on the twenty-ninth aspect thereof, and provides a physical-quantity detection sensor further comprising a memory (537) for storing reference data, a comparator (538) for comparing the digital signal generated by the A/D converter with the reference data stored in the memory, and means for detecting a malfunction of the signal processing circuit in response to a result of the comparing by the comparator.

A thirty-first aspect of this invention is based on the thirtieth aspect thereof, and provides a physical-quantity detection sensor further comprising a D/A converter (535) for converting the digital signal generated by the A/D converter into an analog signal, an output circuit (536) for generating a voltage depending on the analog signal generated by the D/A converter, and means for, when a malfunction of the signal processing circuit is detected in response to the result of the comparing by the comparator, controlling the output circuit to output a voltage indicating the malfunction of the signal processing circuit.

A thirty-second aspect of this invention is based on the thirty-first aspect thereof, and provides a physical-quantity detection sensor wherein the voltage outputted by the output circuit when a malfunction of the signal processing circuit is detected is outside a prescribed range for the voltage generated by the output circuit during the physical-quantity sensing mode of operation.

A thirty-third aspect of this invention is based on the twenty-first aspect thereof, and provides a physical-quantity detection sensor further comprising a first memory for storing corrective data for the signal processing circuit and corrective data for the sensor portion, a second memory for storing corrective data for the signal processing circuit, and means provided in the signal processing circuit for using the corrective data stored in the second memory during the checking mode of operation.

A thirty-fourth aspect of this invention is based on the thirty-third aspect thereof, and provides a physical-quantity detection sensor further comprising a chip on which the signal processing circuit and the sensor portion are formed.

A thirty-fifth aspect of this invention provides a physical-quantity detection apparatus comprising a first sensor circuit (710) including a first sensing portion (711) for generating and outputting a signal depending on a physical quantity; reference generation means (720) for generating a reference signal (V1, V2) depending on the physical quantity; comparing means (730) for comparing the signal outputted by the first sensor circuit with the reference signal generated by the reference generation means; and means for generating a malfunction detection signal on the basis of a result of the comparing by the comparing means.

A thirty-sixth aspect of this invention is based on the thirty-fifth aspect thereof, and provides a physical-quantity detection apparatus wherein the reference generation means (720) comprises a second sensor circuit (720) including a second sensing portion (721) for generating a signal representing an upper-limit reference value (V1) and a signal representing a lower-limit reference value (V2), and the comparing means comprises means for determining whether or not the signal outputted by the first sensor circuit is in a range between the upper-limit reference value and the lower-limit reference value.

A thirty-seventh aspect of this invention is based on the thirty-sixth aspect thereof, and provides a physical-quantity detection apparatus wherein the reference generation means (720) comprises a positive power supply terminal (701a) subjected to a power supply voltage, a series combination of resistors connected between the positive power supply terminal and an output terminal of the second sensor circuit for executing voltage division to generate the signal representing the upper-limit reference value, a ground terminal (701c), and a series combination of resistors connected between the ground terminal and the output terminal of the second sensor circuit for executing voltage division to generate the signal representing the lower-limit reference value.

A thirty-eighth aspect of this invention is based on the thirty-fifth aspect thereof, and provides a physical-quantity detection apparatus further comprising a first terminal (701a), means for applying a power supply voltage (Vcc) to the first sensor circuit via the first terminal, and current controlling means (740) connected to the first terminal for varying a current in response to the result of the comparing by the comparing means, and generating the malfunction detection signal on the basis of a variation in a current flowing through the first terminal.

A thirty-ninth aspect of this invention is based on the thirty-eighth aspect thereof, and provides a physical-quantity detection apparatus further comprising a second terminal (701*b*) for the signal outputted by the first sensor circuit, and a third terminal (701*c*) connected to a ground.

A fortieth aspect of this invention is based on the thirty-eighth aspect thereof, and provides a physical-quantity detection apparatus wherein the reference generation means (720) comprises a second sensor circuit (720) including a second sensing portion (721) for generating a signal representing an upper-limit reference value (V1) and a signal representing a lower-limit reference value (V2), and the comparing means comprises means for determining whether or not the signal outputted by the first sensor circuit is in a range between the upper-limit reference value and the lower-limit reference value, and wherein the current controlling means comprises a first element (742), a second element (743, 744), means responsive to the result of the comparing by the comparing means for enabling a current to flow through the first element and inhibiting a current from flowing through the second element when the signal outputted by the first sensor circuit is in the range between the upper-limit reference value and the lower-limit reference value, means responsive to the result of the comparing by the comparing means for inhibiting a current from flowing through the first element and enabling a current to flow through the second element when the signal outputted by the first sensor circuit is not in the range between the upper-limit reference value and the lower-limit reference value, and means for generating the malfunction detection signal on the basis of a variation in a current flowing through the first element and a variation in a current flowing through the second element.

A forty-first aspect of this invention provides a physical-quantity detection apparatus comprising a first sensor circuit (710) including a first sensing portion (711) for generating and outputting a signal depending on a physical quantity; reference generation means (720) for generating a reference signal (V1, V2) depending on the physical quantity; comparing means (730) for comparing the signal outputted by the first sensor circuit with the reference signal generated by the reference generation means; and means for outputting information of a result of the comparing by the comparing means via power fed to the first sensor circuit.

A forty-second aspect of this invention is based on the forty-first aspect thereof, and provides a physical-quantity detection apparatus further comprising a first terminal (701*a*), means for applying a power supply voltage (Vcc) to the first sensor circuit via the first terminal, and current controlling means (740) connected to the first terminal for varying a current in response to the result of the comparing by the comparing means, and generating the information of the result of the comparing by the comparing means on the basis of a variation in a current flowing through the first terminal.

A forty-third aspect of this invention is based on the forty-first aspect thereof, and provides a physical-quantity detection apparatus wherein the reference generation means (720) comprises a second sensor circuit (720) including a second sensing portion (721) for generating a signal representing an upper-limit reference value (V1) and a signal representing a lower-limit reference value (V2), and the comparing means comprises means for determining whether or not the signal outputted by the first sensor circuit is in a range between the upper-limit reference value and the lower-limit reference value, and wherein the reference generation means (720) further comprises a positive power supply terminal (701*a*) subjected to a power supply voltage, a series combination of resistors connected between the positive power supply terminal and an output terminal of the second sensor circuit for executing voltage division to generate the signal representing the upper-limit reference value, a ground terminal (701*c*), and a series combination of resistors connected between the ground terminal and the output terminal of the second sensor circuit for executing voltage division to generate the signal representing the lower-limit reference value.

A forty-fourth aspect of this invention is based on the forty-third aspect thereof, and provides a physical-quantity detection apparatus wherein the second sensor circuit is higher in sensitivity than the first sensor circuit.

A forty-fifth aspect of this invention provides a sensor-signal processing apparatus comprising a power supply terminal; means for feeding, via the power supply terminal, a power supply voltage for operating a sensor; means for monitoring an output voltage from the sensor; current detecting means (759, 760) for generating a voltage depending on a current flowing through the power supply terminal; signal converting means (761) for converting the output voltage from the sensor into a first conversion-resultant signal, and converting the voltage generated by the current detecting means into a second conversion-resultant signal; and signal processing means (762) for processing the first conversion-resultant signal generated by the signal converting means, and detecting a malfunction of the sensor in response to the second conversion-resultant signal generated by the signal converting means.

DETAILED DESCRIPTION OF THE INVENTION

First Embodiment

Figure 1:
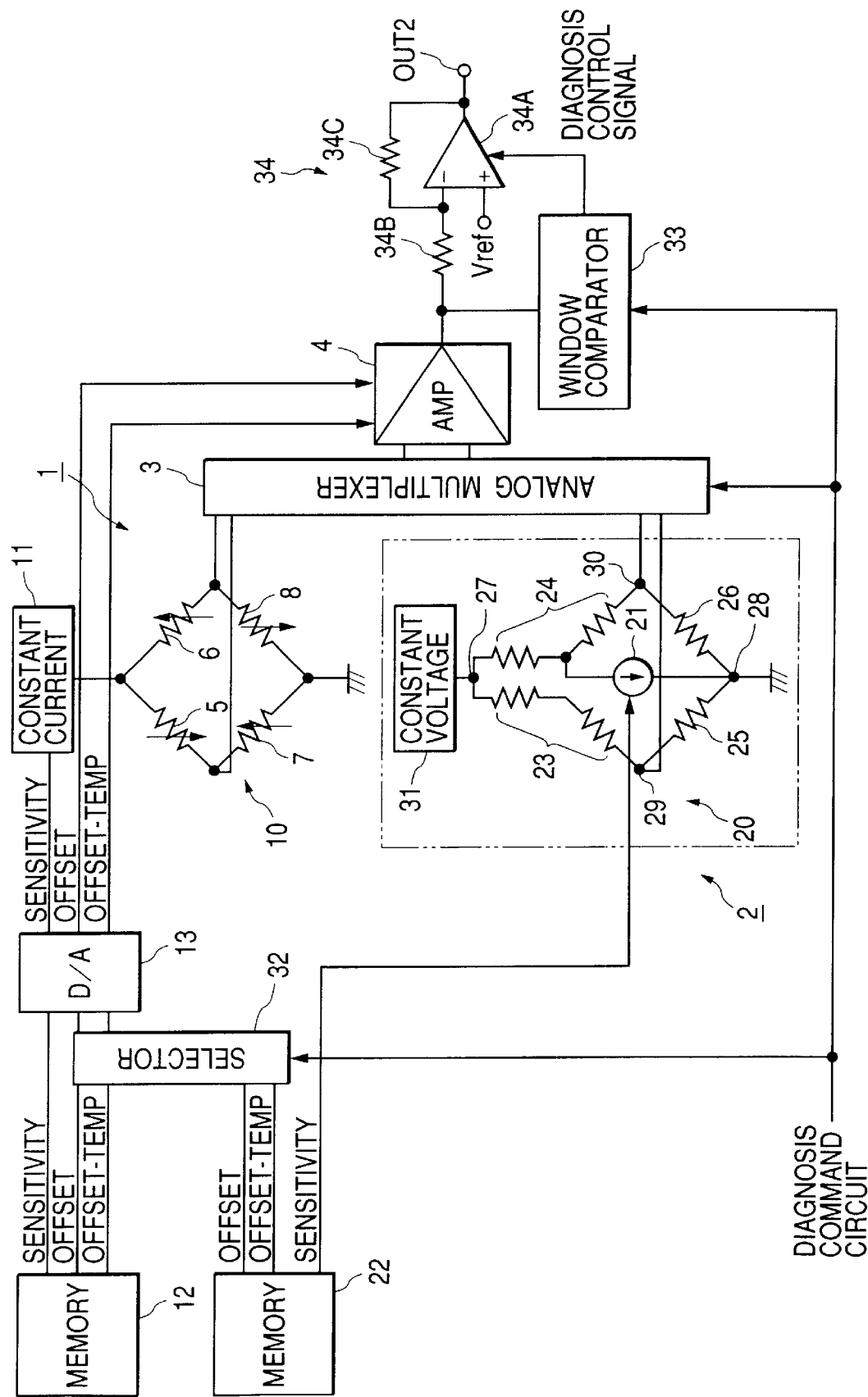
FIG. 1 is a diagram of a pressure sensor according to a first embodiment of this invention.

FIG. 1 shows a pressure sensor according to a first embodiment of this invention. The pressure sensor of FIG. 1 includes a sensing portion (a sensor portion) 10. A pressure to be detected is applied to the sensing portion 10.

The pressure sensor of FIG. 1 further includes a pressure sensing circuit 1 and a checking circuit 2. The pressure sensing circuit 1 contains the sensing portion 10. The pressure sensing circuit 1 generates and outputs a signal representing the pressure applied to the sensing portion 10. The checking circuit 2 generates and outputs a signal used for a check (a diagnosis) on a specified portion of the pressure sensor.

An analog multiplexer 3 is connected to the pressure sensing circuit 1 and the checking circuit 2. The multiplexer 3 is also connected to an amplifier 4. The multiplexer 3 receives the output signal of the pressure sensing circuit 1. The multiplexer 3 receives the output signal of the checking circuit 2. The multiplexer 3 receives a diagnosis command signal from a system control circuit (not shown). The system control circuit may include an electronic control unit (ECU). The diagnosis command signal is binary. The multiplexer 3 selects one of the output signal from the pressure sensing circuit 1 and the output signal from the checking circuit 2 in accordance with the state of the diagnosis command signal, and passes the selected signal to the amplifier 4. Operation of the pressure sensor is changed between a pressure sensing mode and a checking mode by the diagnosis command signal. During the pressure sensing mode of operation, the diagnosis command signal is in its state which causes the multiplexer 3 to transmit the output signal of the pressure sensing circuit 1 to the amplifier 4. During the checking mode of operation, the diagnosis command signal is in its sate which causes the multiplexer 3 to transmit the output signal of the checking circuit 2 to the amplifier 4. Preferably, the timing of a change of the diagnosis command signal to its state for the checking mode of operation of the pressure sensor is in a time range where suspension of pressure detection is allowed.

As previously mentioned, the pressure sensing circuit 1 includes the sensing portion 10. The pressure sensing circuit 1 further includes a constant-current circuit 11, a memory 12, and a D/A (digital-to-analog) converter 13. The sensing portion 10 includes a bridge circuit having a combination of four diffusion layer resistors (four strain gauges) 5, 6, 7, and 8 formed on a diaphragm subjected to the pressure to be detected. The sensing portion 10 is connected to the multiplexer 3 and the constant-current circuit 11. The constant-current circuit 11 causes a constant current to flow through the sensing portion 10. The constant current flowing through the sensing portion 10 is determined by a control signal fed to the constant-current circuit 11. The constant-current circuit 11 is connected to the D/A converter 13. The D/A converter 13 is connected to the memory 12. The memory 12 stores digital data related to sensitivity (detection-resultant signal span). The memory 12 outputs the sensitivity-related digital data to the D/A converter 13. The D/A converter 13 changes the sensitivity-related digital data into a corresponding sensitivity-related analog signal. The D/A converter 13 outputs the sensitivity-related analog signal to the constant-current circuit 11 as a control signal.

During the pressure sensing mode of operation, the difference between the voltages at opposite inter-resistor junctions in the bridge circuit of the sensing portion 10 depends on the pressure applied to the sensing portion 10. The voltages at the opposite inter-resistor junctions in the bridge circuit of the sensing portion 10 are applied to the multiplexer 3 as the output signal of the pressure sensing circuit 1 or the output signal of the sensing portion 10. As previously mentioned, the constant-current circuit 11 causes a constant current to flow through the sensing portion 10. The constant current is determined by the control signal fed to the constant-current circuit 11 from the D/A converter 13. Since the control signal depends on the sensitivity-related digital data outputted from the memory 12, the constant current flowing through the sensing portion 10 is determined by the sensitivity-related digital data outputted from the memory 12. Preferably, the sensitivity-related digital data outputted from the memory 12 are designed to suit with temperature compensation for the sensitivity of the pressure sensor.

The impurity concentration in the diffusion layer resistors 5, 6, 7, and 8 composing the bridge circuit in the sensing portion 10 is optimized to provide temperature compensation for the sensitivity of the pressure sensor. The temperature characteristic of the diffusion layer resistors 5, 6, 7, and 8 and the temperature dependency of the sensitivity of the pressure sensor are set so as to cancel each other. This setting enables temperature compensation for the sensitivity of the pressure sensor to be provided when a constant current flows through the bridge circuit in the sensing potion 10. Specifically, in the case where the temperature coefficient of the sensitivity of the pressure sensor is equal to about $-1600$ ppm/°C., the temperature coefficient of the diffusion layer resistors 5, 6, 7, and 8 is set to about $+1600$ ppm/°C. In this case, the impurity concentration in the diffusion layer resistors 5, 6, 7, and 8 is set to, for example, about $10^{20}$ cm$^{-3}$.

A selector 32 is connected between the memory 12 and the D/A converter 13. The D/A converter 13 is connected to the amplifier 4. The memory 12 stores digital data related to an offset in the bridge circuit of the sensing portion 10 and an offset in the amplifier 4. In addition, the memory 12 stores digital data related to an offset temperature characteristic (an offset temperature dependency) of the bridge circuit of the sensing portion 10 and an offset temperature characteristic (an offset temperature dependency) of the amplifier 4. The offset-related digital data and the offset-temperature-characteristic digital data can be transmitted from the memory 12 to the D/A converter 13 via the selector 32. Specifically, the selector 32 receives the diagnosis command signal. The selector 32 responds to the diagnosis command signal. During the pressure sensing mode of operation, the selector 32 is controlled by the diagnosis command signal to select the offset-related digital data and the offset-temperature-characteristic digital data outputted from the memory 12. In this case, the selector 32 passes the offset-related digital data and the offset-temperature-characteristic digital data from the memory 12 to the D/A converter 13. The D/A converter 13 changes the offset-related digital data into a corresponding offset-related analog signal. The D/A converter 13 outputs the offset-related analog signal to the amplifier 4. The D/A converter 13 changes the offset-temperature-characteristic digital data into a corresponding offset-temperature-characteristic analog signal. The D/A converter 13 outputs the offset-temperature-characteristic analog signal to the amplifier 4. During the pressure sensing mode of operation, the output signal of the sensing portion 10 is transmitted to the amplifier 4 via the multiplexer 3. Thus, the device 4 amplifies the output signal of the sensing portion 10 (that is, the difference between the voltages at the opposite inter-resistor junctions in the bridge circuit of the sensing portion 10) in response to the offset-related analog signal and the offset-temperature-characteristic analog signal, thereby compensating for the offset and the offset temperature dependency of the bridge circuit in the sensing portion 10 and also the offset and the offset temperature dependency of the amplifier 4.

As will be mentioned later, the amplifier 4 includes a first circuit for controlling the offset-temperature-characteristic analog signal in accordance with temperature, and a second circuit for adjusting the output signal of the sensing portion 10 in response to the controlled offset-temperature-characteristic analog signal to implement desired temperature compensation.

The checking circuit 2 includes a checking bridge circuit 20, a memory 22, and a constant-voltage circuit 31. The checking bridge circuit 20 includes a constant-current circuit 21. The memory 22 is connected to the constant-current circuit 21 and the selector 32. The memory 22 stores sensitivity-related digital data for determining a current driven by the constant-current circuit 21. The constant-voltage circuit 31 is connected to the checking bridge circuit 20.

The checking bridge circuit 20 has a combination of resistors 23, 24, 25, and 26 whose resistances hardly depend on temperature. The resistors 23, 24, 25, and 26 are of a structure different from a strain gauge. The resistors 23, 24, 25, and 26 are formed on a substrate of a design different from a diaphragm so that the checking bridge circuit 20 is insensitive to the pressure applied to the sensing portion 10. Preferably, the resistors 23, 24, 25, and 26 include thin film resistors of CrSi. The resistors 23, 24, 25, and 26 are connected in a tetragonal closed circuit (a Wheatstone bridge circuit) which has a junction 27 between the resistors 23 and 24, a junction 28 between the resistors 25 and 26, a junction 29 between the resistors 23 and 25, and a junction 30 between the resistors 24 and 26. The junction 27 is connected to the positive output terminal of the constant-voltage circuit 31. The negative output terminal of the constant-voltage circuit 31 is grounded. The junction 28 is grounded. The junctions 29 and 30 are connected to the multiplexer 3. The voltages at the junctions 29 and 30 are applied to the multiplexer 3 as the output signal of the checking circuit 2 or the output signal of the checking bridge circuit 20. The junction 27 is called a power supplied junction. The junction 28 is called a grounded junction. The junctions 29 and 30 are called first and second output junctions, respectively.

The input side of the constant-current circuit 21 is connected to an intermediate point in the resistor 24 located between the power supplied junction 27 and the second output junction 30. The output side of the constant-current circuit 21 is connected to the grounded junction 28.

For example, the constant-current circuit 21 includes a D/A converter and a current control portion. The D/A converter receives the sensitivity-related digital data from the memory 22. The D/A converter changes the sensitivity-related digital data into a corresponding analog signal. The D/A converter outputs the analog signal to the current control portion as a control signal. The current control portion regulates a current flowing through the constant-current circuit 21 at a constant level determined by the control signal. Thus, the constant current driven by the constant-current circuit 21 is determined by the sensitivity-related digital data outputted from the memory 22. Preferably, the constant current driven by the constant-current circuit 21 is chosen so that the difference between the voltages at the first and second output junctions 29 and 30 will be equal to a desired value. The difference between the voltages at the first and second output junctions 29 and 30 corresponds to a reference voltage for check.

During the checking mode of operation, the output signal of the checking bridge circuit 20 is transmitted to the amplifier 4 via the multiplexer 3, and hence the device 4 amplifies the output signal of the checking bridge circuit 20. Specifically, the device 4 amplifies the difference between the voltages at the first and second output junctions 29 and 30 in the checking bridge circuit 20. Preferably, the output signal of the checking bridge circuit 20 has a span equal to the span of the output signal of the bridge circuit in the sensing portion 10. For example, in the case where the sensitivity-related digital data in the memory 22 correspond to a range of several mV to 200 mV, the output signal of the checking bridge circuit 20 has a resolution corresponding to 8 bits to 10 bits.

The constant-voltage circuit 31 derives a constant voltage from a power supply voltage. The constant-voltage circuit 31 applies the constant voltage between the power supplied junction 27 and the grounded junction 28. The power supply voltage may be directly applied between the power supplied junction 27 and the grounded junction 28. In this case, the voltage applied between the power supplied junction 27 and the grounded junction 28 has a ratio with the power supply voltage.

The selector 32 is connected between the memory 22 and the D/A converter 13. The memory 22 stores digital data related to an offset in the amplifier 4. In addition, the memory 22 stores digital data related to an offset temperature characteristic (an offset temperature dependency) of the amplifier 4. The offset-related digital data and the offset-temperature-characteristic digital data can be transmitted from the memory 22 to the D/A converter 13 via the selector 32. As previously mentioned, the selector 32 responds to the diagnosis command signal. During the checking mode of operation, the selector 32 is controlled by the diagnosis command signal to select the offset-related digital data and the offset-temperature-characteristic digital data outputted from the memory 22. In this case, the selector 32 passes the offset-related digital data and the offset-temperature-characteristic digital data from the memory 22 to the D/A converter 13. The D/A converter 13 changes the offset-related digital data into a corresponding offset-related analog signal. The D/A converter 13 outputs the offset-related analog signal to the amplifier 4. The D/A converter 13 changes the offset-temperature-characteristic digital data into a corresponding offset-temperature-characteristic analog signal. The D/A converter 13 outputs the offset-temperature-characteristic analog signal to the amplifier 4. During the checking mode of operation, the output signal of the checking bridge circuit 20 is transmitted to the amplifier 4 via the multiplexer 3. Thus, the device 4 amplifies the output signal of the checking bridge circuit 20 in response to the offset-related analog signal and the offset-temperature-characteristic analog signal, thereby compensating for the offset and the offset temperature dependency of the amplifier 4.

As will be mentioned later, the amplifier 4 includes a first circuit for controlling the offset-temperature-characteristic analog signal in accordance with temperature, and a second circuit for adjusting the output signal of the checking bridge circuit 20 in response to the controlled offset-temperature-characteristic analog signal to implement desired temperature compensation.

The pressure sensor of FIG. 1 further includes a window comparator 33 and an output circuit 34 which are connected to the amplifier 4. The comparator 33 is connected to the output circuit 34. The amplifier 4 outputs the amplification-resultant voltage signal to the window comparator 33 and the output circuit 34.

The window comparator 33 receives the diagnosis command signal. The window comparator 33 is activated in response to the diagnosis command signal during the checking mode of operation. An upper-limit reference voltage and a lower-limit reference voltage are provided in the window comparator 33. The upper-limit and lower-limit reference voltages define, therebetween, a normal range for the voltage of the output signal from the amplifier 4. The device 33 compares the voltage of the output signal from the amplifier 4 with the upper-limit and lower-limit reference voltages. The window comparator 33 determines whether or not the voltage of the output signal from the amplifier 4 is in the normal range. The window comparator 33 generates a diagnosis control signal representing the result of the determination (the result of the comparison). The diagnosis control signal means a diagnosis result signal. The diagnosis control signal represents whether a specified portion of the pressure sensor is normal or wrong. The specified portion of the pressure sensor includes the amplifier 4. Specifically, the diagnosis control signal is in its low level state when the voltage of the output signal from the amplifier 4 is outside the normal range. The diagnosis control signal is in its high level state when the voltage of the output signal from the amplifier 4 is in the normal range. The window comparator 33 outputs the diagnosis control signal to the output circuit 34. During the checking mode of operation, when the voltage of the output signal from the amplifier 4 is outside the normal range, the output circuit 34 is controlled by the diagnosis control signal to output a signal indicating that the amplifier 4 is wrong. On the other hand, when the voltage of the output signal from the amplifier 4 is in the normal range, the output circuit 34 is controlled by the diagnosis control signal to output a signal indicating that the amplifier 4 is normal. The amplifier 4 corresponds to a signal processing circuit. The amplifier 4 and the output circuit 34 may correspond to a signal processing circuit.

The window comparator 33 is inactive during the pressure sensing mode of operation. In this case, the amplification-resultant signal is transmitted from the amplifier 4 to an external device (not shown) via the output circuit 34.

The output circuit 34 includes an operational amplifier 34A and resistors 34B and 34C. The inverting input terminal of the operational amplifier 34A is connected via the resistor 34B to the output terminal of the amplifier 4. The non-inverting input terminal of the operational amplifier 34A is subjected to a predetermined reference voltage Vref. The output terminal of the operational amplifier 34A is connected to a sensor output terminal OUT2. Also, the output terminal of the operational amplifier 34A is connected to the inverting input terminal thereof via the resistor 34C.

Figure 2:
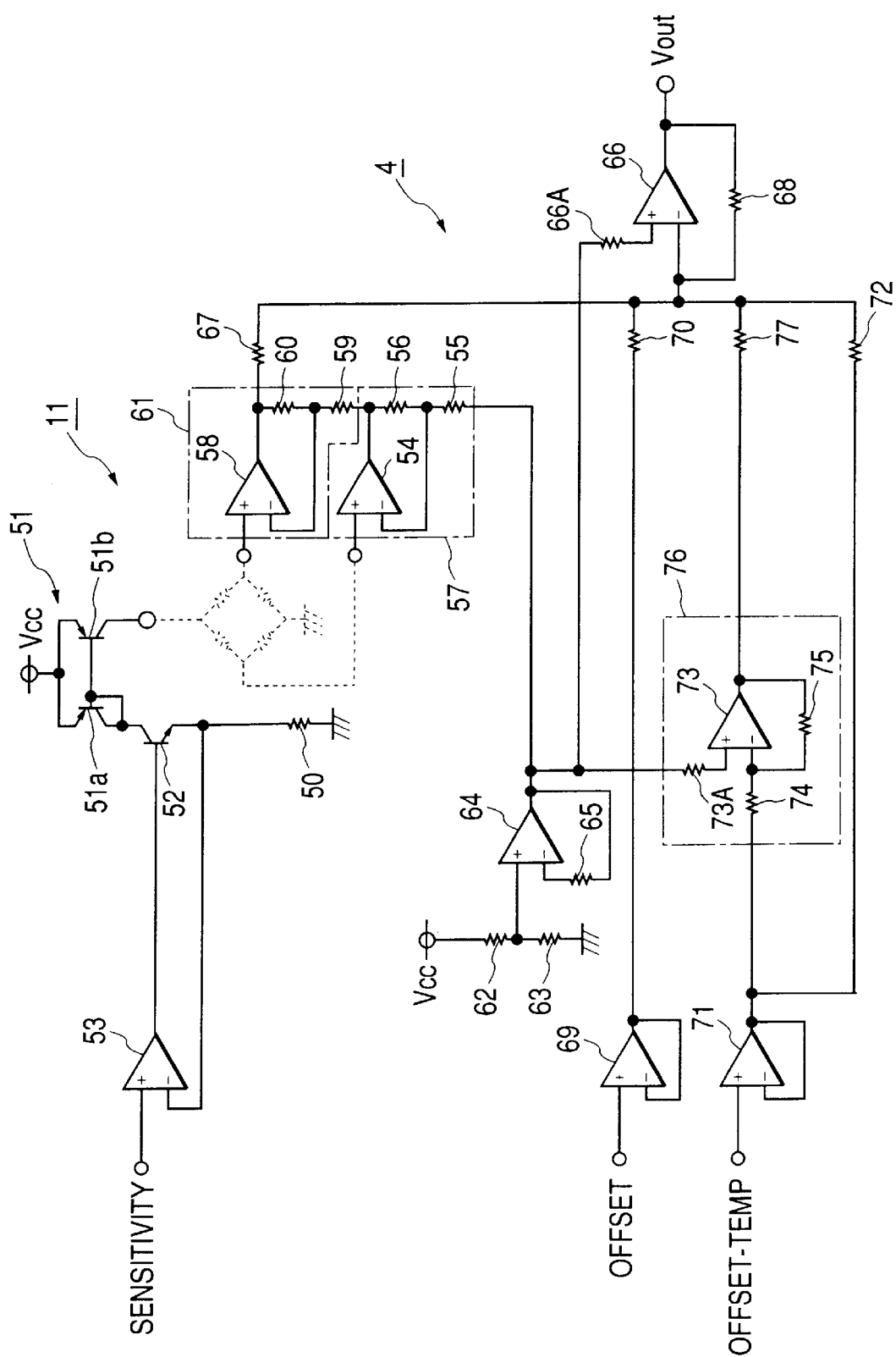
FIG. 2 is a diagram of a constant-current circuit and an amplifier in FIG. 1.

With reference to FIG. 2, the constant-current circuit 11 includes a resistor 50, a current mirror circuit 51, a transistor 52, and an operational amplifier 53. The current mirror circuit 51 is composed of transistors 51a and 51b. The bases of the transistors 51a and 52b are connected to each other. The emitters of the transistors 51a and 52b are connected in common to a positive power feed line subjected to a constant power supply voltage Vcc. The collector of the transistor 51a is connected to the collector of the transistor 52. The junction between the collectors of the transistors 51a and 52 is connected to the junction between the bases of the transistors 51a and 51b. The base of the transistor 52 is connected to the output terminal of the operational amplifier 53. The emitter of the transistor 52 is connected to the inverting input terminal of the operational amplifier 53 and one end of the resistor 50. The other end of the resistor 50 is grounded. The sensitivity-related analog signal generated by the D/A converter 13 (see FIG. 1) is applied to the non-inverting input terminal of the operational amplifier 53. The collector of the transistor 51b is connected to the bridge circuit in the sensing portion 10 (see FIG. 1). Thus, a current can flow into the sensing portion 10 via the transistor 51b. The resistor 50 has a resistance which hardly depends on temperature. Preferably, the resistor 50 uses a thin film resistor of CrSi.

The operational amplifier 53 adjusts the collector current through the transistor 52 in response to the sensitivity-related analog signal. By the function of the current mirror circuit 51, the adjustment of the collector current through the transistor 52 results in the adjustment of the collector currents through the transistors 51a and 51b. Thus, the current flowing into the sensing portion 10 is determined by the sensitivity-related analog signal. In the case where the sensitivity-related analog signal indicates a desired sensitivity, the current flowing into the sensing portion 10 is determined by the desired sensitivity.

As shown in FIG. 2, the amplifier 4 includes non-inverting amplifiers 57 and 61. The non-inverting amplifier 57 is composed of an operational amplifier 54 and resistors 55 and 56. The non-inverting input terminal of the operational amplifier 54 receives a first output voltage from the multiplexer 3 (see FIG. 1). The output terminal of the operational amplifier 54 is connected to a first end of the resistor 56. The inverting input terminal of the operational amplifier 54 is connected to a second end of the resistor 56 and a first end of the resistor 55. The non-inverting amplifier 61 is composed of an operational amplifier 58 and resistors 59 and 60. The non-inverting input terminal of the operational amplifier 58 receives a second output voltage from the multiplexer 3 (see FIG. 1). The output terminal of the operational amplifier 58 is connected to a first end of the resistor 60. The inverting input terminal of the operational amplifier 58 is connected to a second end of the resistor 60 and a first end of the resistor 59. A second end of the resistor 59 is connected to the junction between the output terminal of the operational amplifier 54 and the first end of the resistor 56.

The amplifier 4 includes resistors 62 and 63, an operational amplifier 64, and a resistor 65. The resistors 62 and 63 are connected in series. One end of the series combination of the resistors 62 and 63 is connected to the positive power feed line subjected to the constant power supply voltage Vcc. The other end of the series combination of the resistors 62 and 63 is grounded. The non-inverting input terminal of the operational amplifier 64 is connected to the junction between the resistors 62 and 63. The inverting input terminal of the operational amplifier 64 is connected via the resistor 65 to the output terminal thereof. The output terminal of the operational amplifier 64 is connected to a second end of the resistor 55. The series combination of the resistors 62 and 63 divides the constant power supply voltage Vcc, and applies the division-resultant voltage to the operational amplifier 64. The operational amplifier 64 and the resistor 65 compose a voltage follower circuit for generating a reference voltage from the division-resultant voltage. The resistor 65 acts to cancel an offset in the operational amplifier 64. The operational amplifier 64 outputs the reference voltage to the non-inverting amplifier 57.

The non-inverting amplifier 57 operates on the first output voltage from the multiplexer 3 (see FIG. 1) in response to the reference voltage outputted from the operational amplifier 64. A voltage outputted from the operational amplifier 54 in the non-inverting amplifier 57 is applied to the non-inverting amplifier 61 as a reference voltage. The non-inverting amplifier 61 operates on the second output voltage from the multiplexer 3 (see FIG. 1) in response to the reference voltage outputted from the operational amplifier 54. A signal outputted from the non-inverting amplifier 61 (a signal outputted from the operational amplifier 58) corresponds to the difference between the first and second output voltages from the multiplexer 3.

The amplifier 4 includes an operational amplifier 66 and resistors 66A, 67, and 68. A first end of the resistor 67 is connected to the junction between the output terminal of the operational amplifier 58 and the first end of the resistor 60. A second end of the resistor 67 is connected to the inverting input terminal of the operational amplifier 66. The non-inverting input terminal of the operational amplifier 66 is connected via the resistor 66A to the output terminal of the operational amplifier 64. The inverting input terminal of the operational amplifier 66 is connected via the resistor 68 to the output terminal thereof. The output terminal of the operational amplifier 66 is connected to an output terminal Vout of the amplifier 4. The operational amplifier 66 and the resistors 67 and 68 compose an inverting amplifier which receives the reference voltage from the operational amplifier 64, and which receives an output signal from the operational amplifier 58 in the non-inverting amplifier 61. The inverting amplifier composed of the operational amplifier 66 and the resistors 67 and 68 amplifies the output signal from the operational amplifier 58, and outputs the amplification-resultant signal which constitutes the output signal of the amplifier 4.

The amplifier 4 includes an operational amplifier 69 and a resistor 70. The offset-related analog signal generated by the D/A converter 13 (see FIG. 1) is applied to the non-inverting input terminal of the operational amplifier 69. The inverting input terminal of the operational amplifier 69 is connected to the output terminal thereof. The output terminal of the operational amplifier 69 is connected via the resistor 70 to the inverting input terminal of the operational amplifier 66. The operational amplifier 69 acts as a voltage follower circuit. The offset-related analog signal propagates through the operational amplifier 69 and the resistor 70 before reaching the operational amplifier 66.

The amplifier 4 includes an operational amplifier 71 and a resistor 72. The offset-temperature-characteristic analog signal generated by the D/A converter 13 (see FIG. 1) is applied to the non-inverting input terminal of the operational amplifier 71. The inverting input terminal of the operational amplifier 71 is connected to the output terminal thereof. The output terminal of the operational amplifier 71 is connected via the resistor 72 to the inverting input terminal of the operational amplifier 66. The operational amplifier 71 acts as a voltage follower circuit. The offset-temperature-characteristic analog signal propagates through the operational amplifier 71 and the resistor 72 before reaching the operational amplifier 66. The offset-temperature-characteristic analog signal provides compensation for the offset in the amplifier 4 and the offset in the bridge circuit of the sensing portion 10 (see FIG. 1).

The amplifier 4 includes an operational amplifier 73 and resistors 73A, 74, 75, and 77. The inverting input terminal of the operational amplifier 73 is connected via the resistor 74 to the output terminal of the operational amplifier 71. The inverting input terminal of the operational amplifier 73 is connected via the resistor 75 to the output terminal thereof. The non-inverting input terminal of the operational amplifier 73 is connected via the resistor 73A to the output terminal of the operational amplifier 64. The output terminal of the operational amplifier 73 is connected via the resistor 77 to the inverting input terminal of the operational amplifier 66. The operational amplifier 73 and the resistors 73A, 74, and 75 compose an adder 76 which receives the reference voltage from the operational amplifier 64, and which receives the offset-temperature-characteristic analog signal from the operational amplifier 71. The adder 76 operates in response to the reference voltage. The offset-temperature-characteristic analog signal propagates through the adder 76 while being controlled or processed thereby. Then, the offset-temperature-characteristic analog signal propagates through the resistor 77 before reaching the operational amplifier 66.

One of the resistors 74 and 75 in the adder 76 significantly depends on temperature while the other resistor hardly depends thereon. Preferably, one of the resistors 74 and 75 uses a diffusion layer resistor while the other resistor uses a thin film resistor of CrSi. Thus, the adder 76 controls or processes the offset-temperature-characteristic analog signal at a gain depending on temperature. Accordingly, the level of the offset-temperature-characteristic analog signal outputted from the adder 76 depends on temperature. The temperature dependency of the output signal from the adder 76 is designed to compensate for the offset temperature dependency of the amplifier 4 and the offset temperature dependency of the bridge circuit in the sensing portion 10 (see FIG. 1).

The operational amplifier 66, the resistors 67, 68, 70, 72, and 77 compose an adder which sums up the output signals from the operational amplifiers 58, 69, 71, and 73 into an addition-resultant signal. The addition-resultant signal results from compensation for the offset and the offset temperature dependency of the amplifier 4 and also the offset and the offset temperature dependency of the bridge circuit in the sensing portion 10 (see FIG. 1). The addition-resultant signal constitutes the output signal of the amplifier 4 which is transmitted from the operational amplifier 66 to the window comparator 33 and the output circuit 34 (see FIG. 1) via the output terminal Vout of the amplifier 4.

Figure 3:
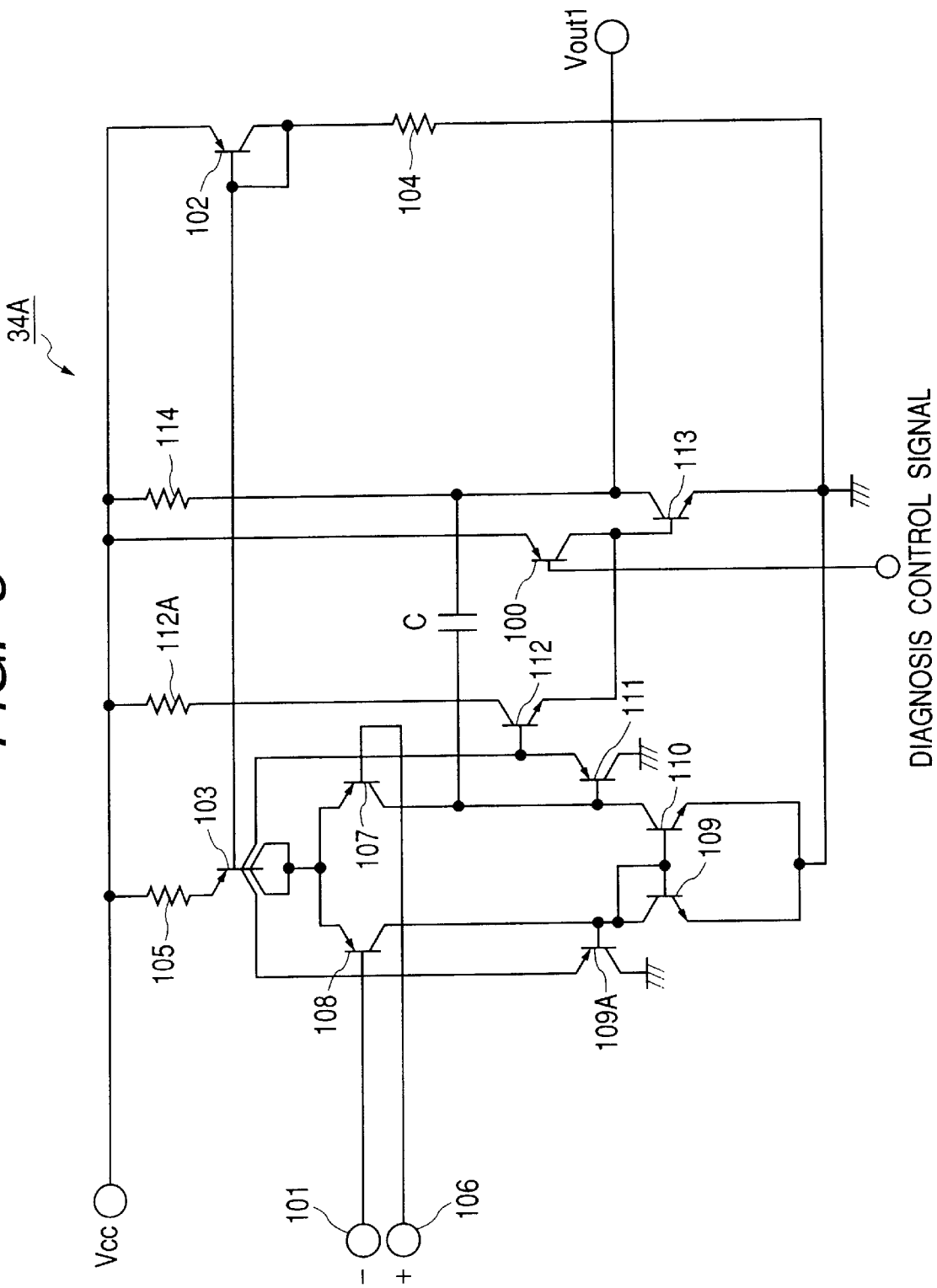
FIG. 3 is a schematic diagram of an operational amplifier within an output circuit in FIG. 1.

With reference to FIG. 3, the operational amplifier 34A in the output circuit 34 has the inverting input terminal 101, the non-inverting input terminal 106, and the output terminal Vout1. The operational amplifier 34A includes a transistor 100 whose base is subjected to the diagnosis control signal.

The operational amplifier 34A includes transistors 102 and 103 composing a current mirror circuit. The bases of the transistors 102 and 103 are connected to each other. The emitter of the transistor 102 is connected to the positive power feed line subjected to the constant power supply voltage Vcc. The collector of the transistor 102 is connected to the junction between the bases of the transistors 102 and 103. The collector of the transistor 102 is also connected to one end of a resistor 104. The other end of the resistor 104 is grounded. The emitter of the transistor 103 is connected via a resistor 105 to the positive power feed line subjected to the constant power supply voltage Vcc.

The transistor 102 and the resistor 104 determine a reference current flowing therethrough. A current flows through the transistor 103 and the resistor 105 in response to the reference current. The current flowing through the transistor 103 is determined by the resistance of the resistor 105.

The operational amplifier 34A includes transistors 107, 108, 109, 109A, 110, 111, 112, and 113. The emitters of the transistors 107 and 108 are connected to the collector of the transistor 103. The base of the transistor 107 is connected to the non-inverting input terminal 106. The base of the transistor 108 is connected to the inverting input terminal 101. The collector of the transistor 107 is connected to the base of the transistor 111 and the collector of the transistor 110. The collector of the transistor 108 is connected to the base of the transistor 109A and the collector of the transistor 109. The bases of the transistors 109 and 110 are connected to each other. The collector of the transistor 109 is connected to the junction between the bases of the transistors 109 and 110. The emitters of the transistors 109 and 110 are grounded. The emitter of the transistor 109A is connected to the collector of the transistor 103. The collector of the transistor 109A is grounded. The emitter of the transistor 111 is connected to the collector of the transistor 103. The collector of the transistor 111 is grounded. The base of the transistor 112 is connected to the junction between the collector of the transistor 103 and the emitter of the transistor 111. The collector of the transistor 112 is connected via a resistor 112A to the positive power feed line subjected to the constant power supply voltage Vcc. The emitter of the transistor 112 is connected to the collector of the transistor 100. The emitter of the transistor 100 is connected to the positive power feed line subjected to the constant power supply voltage Vcc. The base of the transistor 113 is connected to the junction between the emitter of the transistor 112 and the collector of the transistor 100. The emitter of the transistor 113 is grounded. The collector of the transistor 113 is connected to the output terminal Vout1, one end of a resistor 114, and one end of a capacitor C. The other end of the resistor 114 is connected to the positive power feed line subjected to the constant power supply voltage Vcc. The other end of the capacitor C is connected to the junction among the collector of the transistor 107, the collector of the transistor 110, and the base of the transistor 111.

The collector currents flowing through the transistors 109 and 110 depend on the difference between the voltages at the inverting input terminal 101 and the non-inverting input terminal 106. The collector currents flowing through the transistors 111 and 112 depend on the collector current flowing through the transistor 110. The collector current flowing through the transistor 113 varies in accordance with the collector current flowing through the transistor 112. Thus, the collector current flowing through the transistor 113 depends on the difference between the voltages at the inverting input terminal 101 and the non-inverting input terminal 106. The resistor 114 causes a voltage drop in accordance with the collector current flowing through the transistor 113. The voltage at the junction between the resistor 114 and the collector of the transistor 113 is equal to the constant power supply voltage Vcc minus the voltage drop caused by the resistor 114. Accordingly, the voltage at the junction between the resistor 114 and the collector of the transistor 113 depends on the difference between the voltages at the inverting input terminal 101 and the non-inverting input terminal 106. The voltage at the junction between the resistor 114 and the collector of the transistor 113 is transmitted via the output terminal Vout1 as the output signal of the operational amplifier 34A.

As previously mentioned, the diagnosis control signal is in its low level state when the voltage of the output signal from the amplifier 4 is outside the normal range. The diagnosis control signal being in its low level state turns on the transistor 100 so that the transistor 113 is made conductive to the greatest degree. As a result, the signal voltage at the output terminal Vout1 drops to a predetermined low level close to the ground potential. The signal voltage equal to the predetermined low level indicates that the amplifier 4 is wrong.

In the case where the constant power supply voltage Vcc is equal to 5 V, it is preferable that the signal voltage outputted from the output terminal Vout1 varies in the range of 0.5 V to 4.5 V during normal operation of the pressure sensor. In this case, the diagnosis control signal corresponding to a malfunction of the specified portion of the pressure sensor may be designed to cause the signal voltage to be lower than 0.3 V (a reference low level) or higher than 4.7 V (a reference high level). In addition, the operational amplifier 34A may be replaced by an operational amplifier of a rail-to-rail circuit structure.

The pressure sensor of FIG. 1 may be modified so that a malfunction of the amplifier 4 can be detected by referring to the diagnosis control signal outputted from the window comparator 33.

As previously mentioned, the non-inverting input terminal of the operational amplifier 34A in the output circuit 34 is subjected to the predetermined reference voltage Vref. The predetermined reference voltage Vref is generated by dividing the constant power supply voltage Vcc. The predetermined reference voltage Vref may be generated by a constant-voltage circuit.

Second Embodiment

Figure 4:
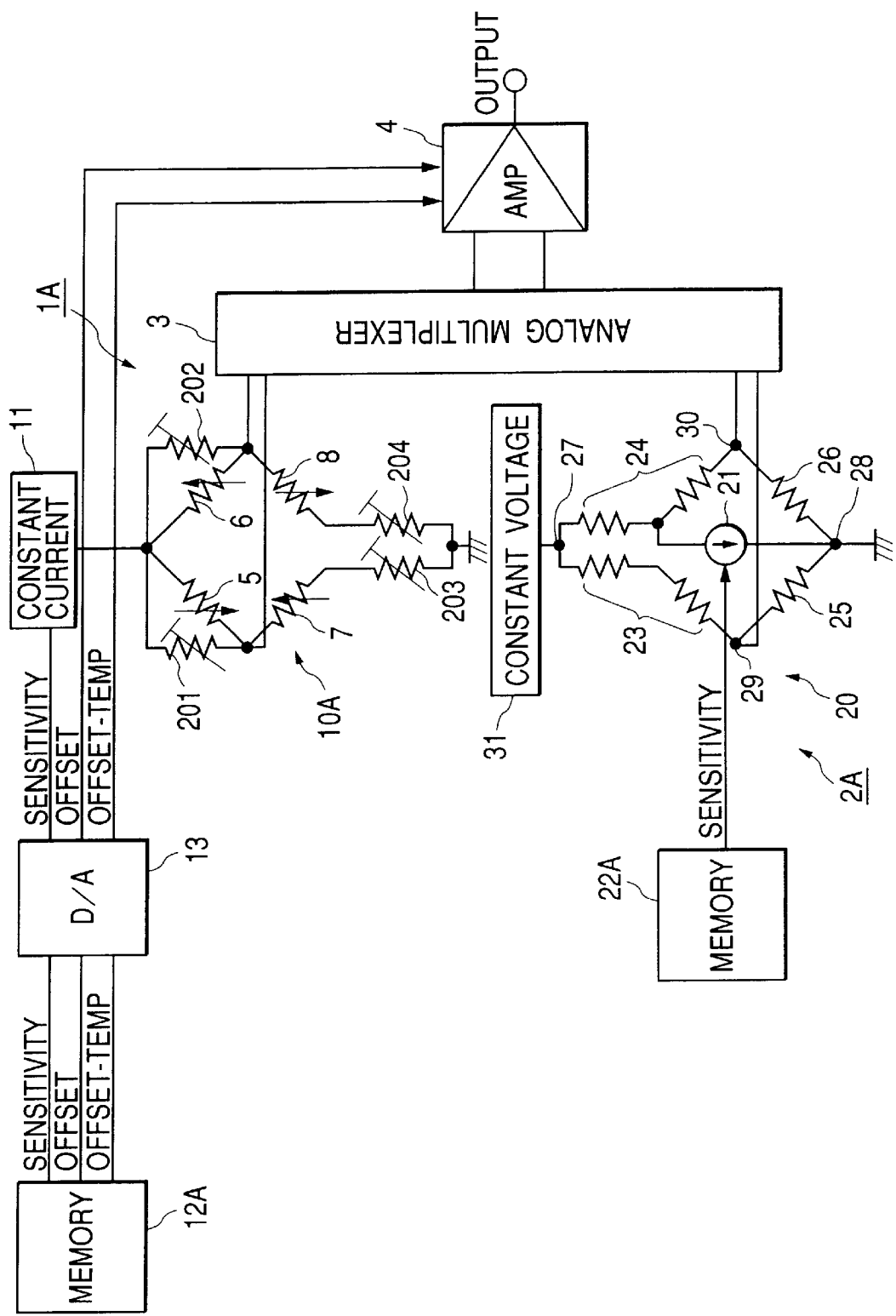
FIG. 4 is a diagram of a portion of a pressure sensor according to a second embodiment of this invention.

FIG. 4 shows a portion of a pressure sensor according to a second embodiment of this invention. The pressure sensor of FIG. 4 is similar to the pressure sensor of FIG. 1 except for design changes mentioned hereinafter. The pressure sensor of FIG. 4 includes a pressure sensing circuit 1A and a checking circuit 2A instead of the pressure sensing circuit 1 and the checking circuit 2 (see FIG. 1) respectively. The selector 32 (see FIG. 1) is omitted from the pressure sensor of FIG. 4.

The pressure sensing circuit 1A contains a sensing portion 10A and a memory 12A which replace the sensing portion 10 and the memory 12 (see FIG. 1) respectively. The pressure sensing circuit 1A generates and outputs a signal representing the pressure applied to the sensing portion 10A. The output signal from the pressure sensing circuit 1A is fed to the multiplexer 3. The checking circuit 2A generates and outputs a signal used for a check (a diagnosis) on a specified portion of the pressure sensor. The output signal from the checking circuit 2A is fed to the multiplexer 3.

The sensing portion 10A includes a bridge circuit having a combination of four diffusion layer resistors (four strain gauges or four main resistors) 5, 6, 7, and 8 and four auxiliary resistors 201, 202, 203, and 204. The auxiliary resistor 201 is connected in parallel with the main resistor 5. The auxiliary resistor 202 is connected in parallel with the main resistor 6. The auxiliary resistor 203 is connected in series with the main resistor 7. The auxiliary resistor 204 is connected in series with the main resistor 8.

The resistors 201, 202, 203, and 204 include CrSi thin film resistors having resistances, the temperature coefficients (TCR) of which are approximately equal to zero. The resistors 201, 202, 203, and 204 are subjected to laser trimming in order to adjust and correct an offset voltage related to the main resistors 5, 6, 7, and 8. According to a first example, the first half of the offset voltage in the bridge circuit is adjusted and corrected by the auxiliary resistor 201, and the second half of the offset voltage is adjusted and corrected by the auxiliary resistor 204. According to a second example, the first half of the offset voltage in the bridge circuit is adjusted and corrected by the auxiliary resistor 202, and the second half of the offset voltage is adjusted and corrected by the auxiliary resistor 203. Thus, the temperature dependency of the offset voltage in the bridge circuit is approximately nullified.

The memory 12A stores digital data related to sensitivity (detection-resultant signal span). The memory 12A outputs the sensitivity-related digital data to the D/A converter 13. Also, the memory 12A stores digital data related to an offset in the amplifier 4. In addition, the memory 12A stores digital data related to an offset temperature characteristic (an offset temperature dependency) of the amplifier 4. The memory 12A outputs the offset-related digital data and the offset-temperature-characteristic digital data to the D/A converter 13.

The checking circuit 2A contains a memory 22A which replaces the memory 22 (see FIG. 1). The memory 22A stores sensitivity-related digital data for determining a current driven by the constant-current circuit 21 in the checking circuit 2A. The memory 22A outputs the sensitivity-related digital data to the constant-current circuit 21.

The window comparator 33 (see FIG. 1) following the amplifier 4 can detect not only a malfunction of the amplifier 4 but also a malfunction of the memory 12A or the D/A converter 13.

It is preferable that a sensor section and a signal processing section of the pressure sensor are formed by separate circuit chips respectively. In this case, the sensor section and the signal processing section can be adjusted independently of each other so that the yield can be enhanced.

Third Embodiment

Figure 5:
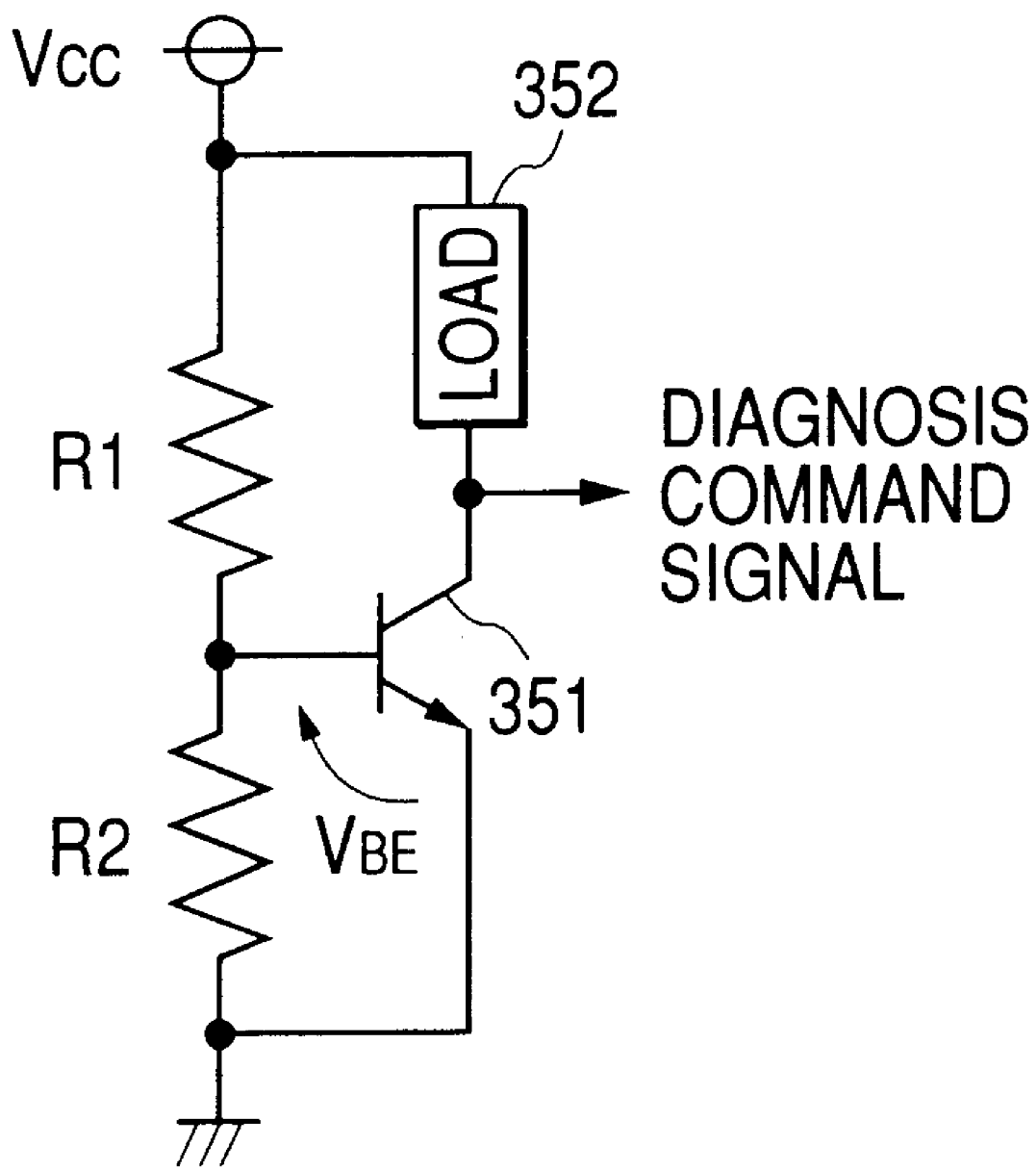
FIG. 5 is a diagram of a portion of a pressure sensor according to a third embodiment of this invention.

FIG. 5 shows a portion of a pressure sensor according to a third embodiment of this invention. The pressure sensor of FIG. 5 is similar to the pressure sensor of FIG. 1 except for design changes mentioned hereinafter. The pressure sensor of FIG. 5 includes a transistor 351, resistors R1 and R2, and a load 352.

The resistors R1 and R2 are connected in series. One end of the series combination of the resistors R1 and R2 is connected to a positive power feed line subjected to a power supply voltage Vcc. The other end of the series combination of the resistors R1 and R2 is grounded. The base of the transistor 351 is connected to the junction between the resistors R1 and R2. The emitter of the transistor 351 is grounded. A first end of the load 352 is connected to the positive power feed line subjected to the power supply voltage Vcc. A second end of the load 352 is connected to the collector of the transistor 351. The diagnosis command signal is generated at the junction between the second end of the load 352 and the collector of the transistor 351.

Preferably, the load 352 is of a constant-current type using a resistor and a transistor. The transistor 351 may be of a MOS type.

The system control circuit (the ECU) changes the power supply voltage Vcc between a predetermined higher level and a predetermined lower level. The system control circuit (the ECU) changes the power supply voltage Vcc to the predetermined higher level when operating the pressure sensor in the checking mode. In this case, the transistor 351 is turned on so that the diagnosis command signal assumes a low level state. When the base-emitter voltage VBE in the transistor 351 rises to about 0.7 V, the transistor 351 becomes conductive. Thus, the resistances of the resistors R1 and R2 are preset so as to satisfy the following relation.

$$0.7\ V > Vcc \cdot R2/(R1+R2)$$

The system control circuit (the ECU) changes the power supply voltage Vcc to the predetermined lower level when operating the pressure sensor in the pressure sensing mode. In this case, the transistor 351 is turned off so that the diagnosis command signal assumes a high level state.

It should be noted that the diagnosis command signal may be in its high level state during the pressure sensing mode of operation of the pressure sensor.

Fourth Embodiment

A fourth embodiment of this invention is similar to one of the first, second, and third embodiments thereof except that the memories 12 and 22 (or 12A and 22A) are formed by a single memory.

Fifth Embodiment

A fifth embodiment of this invention is similar to one of the first, second, third, and fourth embodiments thereof except that the checking bridge circuit 20 is replaced by a D/A conversion circuit of an R-2R ladder type.

Figure 6:
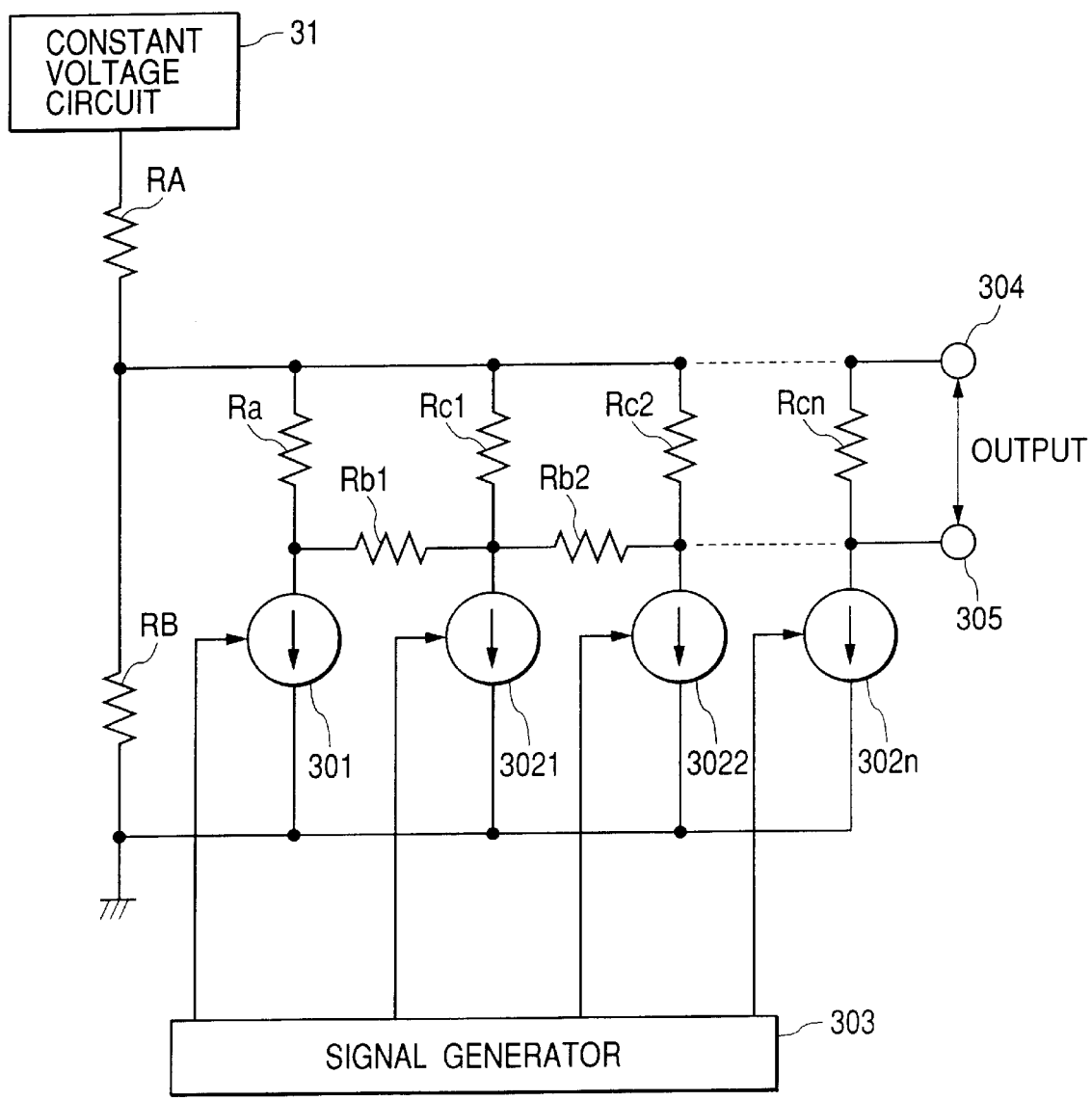
FIG. 6 is a diagram of a D/A conversion circuit in a pressure sensor according to a fifth embodiment of this invention.

As shown in FIG. 6, the D/A conversion circuit includes resistors RA, RB, and Ra, resistors Rc1, Rc2, . . . , and Rcn, resistors Rb1, Rb2, . . . , a constant-current circuit 301, constant-current circuits 3021, 3022, and 302n, and a signal generator 303.

A first end of the resistor RA is connected to the positive output terminal of the constant-voltage circuit 31. A second end of the resistor RA is connected to a first end of the resistor RB. A second end of the resistor RB is grounded. The junction between the resistors RA and RB is connected to a first output terminal 304 of the D/A conversion circuit which leads to the multiplexer 3 (see FIG. 1). A first end of the resistor Ra is connected to the junction between the resistors RA and RB. A second end of the resistor Ra is connected to a first end of the constant-current circuit 301. A second end of the constant-current circuit 301 is grounded. First ends of the resistors Rc1, Rc2, . . . , and Rcn are connected to the junction between the resistors RA and RB. Second ends of the resistors Rc1, Rc2, . . . , and Rcn are connected to first ends of the constant-current circuits 3021, 3022, . . . , and 302n, respectively. The junction between the resistor Rcn and the constant-current circuit 302n is connected to a second output terminal 305 of the D/A conversion circuit which leads to the multiplexer 3 (see FIG. 1). Second ends of the constant-current circuits 3021, 3022, . . . , and 302n are grounded. The junction between the resistor Rc1 and the constant-current circuit 3021 is connected via the resistor Rb1 to the junction between the resistor Ra and the constant-current circuit 301. The junction between the resistor Rc2 and the constant-current circuit 3022 is connected via the resistor Rb2 to the junction between the resistor Rc1 and the constant-current circuit 3021. Also, resistors corresponding to the resistors Rb1 and Rb2 are provided between later stages of the ladder. The constant1 current circuit 301 has a control terminal connected to the signal generator 303. The constant-current circuits 3021, 3022, ..., and 302*n* have control terminals connected to the signal generator 303.

The resistance of the resistor Ra is equal to a predetermined value R. Also, the resistances of the resistors Rb1, Rb2, ... are equal to the predetermined value R. The resistances of the resistors Rc1, Rc2, ..., and Rcn are equal to a predetermined value 2R corresponding to twice the resistance of the resistor Ra.

The signal generator 303 produces control signals. The signal generator 303 outputs the control signals to the constant-current circuits 301, 3021, 3022, ..., and 302*n*, respectively. Each of the constant-current circuits 301, 3021, 3022, ..., and 302*n* is changed between an on state and an off state in response to the related control signal.

Sixth Embodiment

According to a sixth embodiment of this invention, the pressure sensor in one of the first, second, third, fourth, and fifth embodiments of this invention is modified so as to detect a physical quantity different from a pressure.

Seventh Embodiment

Figure 7:
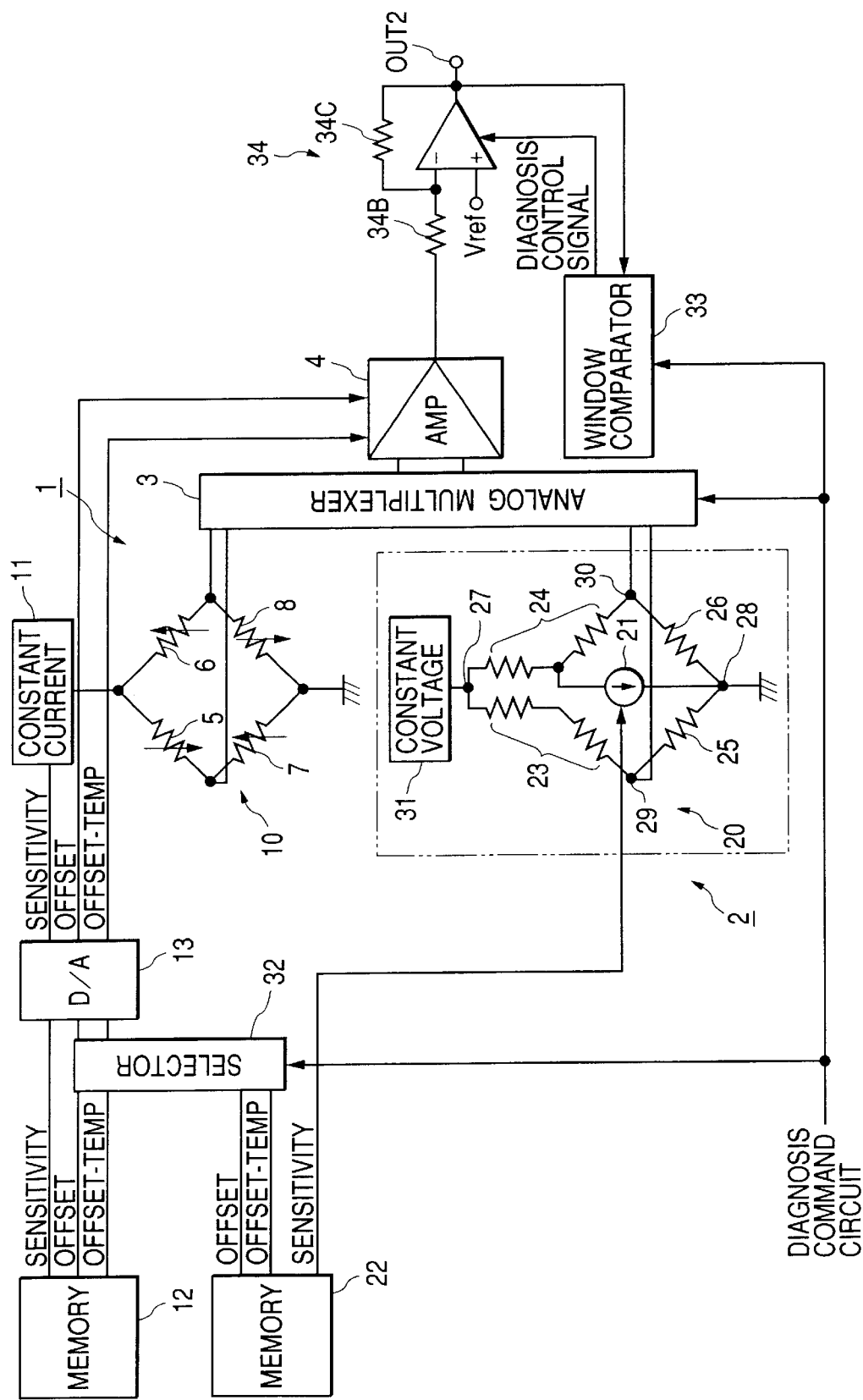
FIG. 7 is a diagram of a pressure sensor according to a seventh embodiment of this invention.

FIG. 7 shows a pressure sensor according to a seventh embodiment of this invention. The pressure sensor of FIG. 7 is similar to the pressure sensor of FIG. 1 except that the input terminal of the window comparator 33 is connected to the output terminal of the output circuit 34 (that is, the output terminal of the operational amplifier 34A) rather than the output terminal of the amplifier 4.

In the pressure sensor of FIG. 7, the window comparator 33 responds to the output signal from the output circuit 34 rather than the output signal from the amplifier 4. The window comparator 33 can detect not only a malfunction of the amplifier 4 but also a malfunction of the output circuit 34.

Eighth Embodiment

Figure 8:
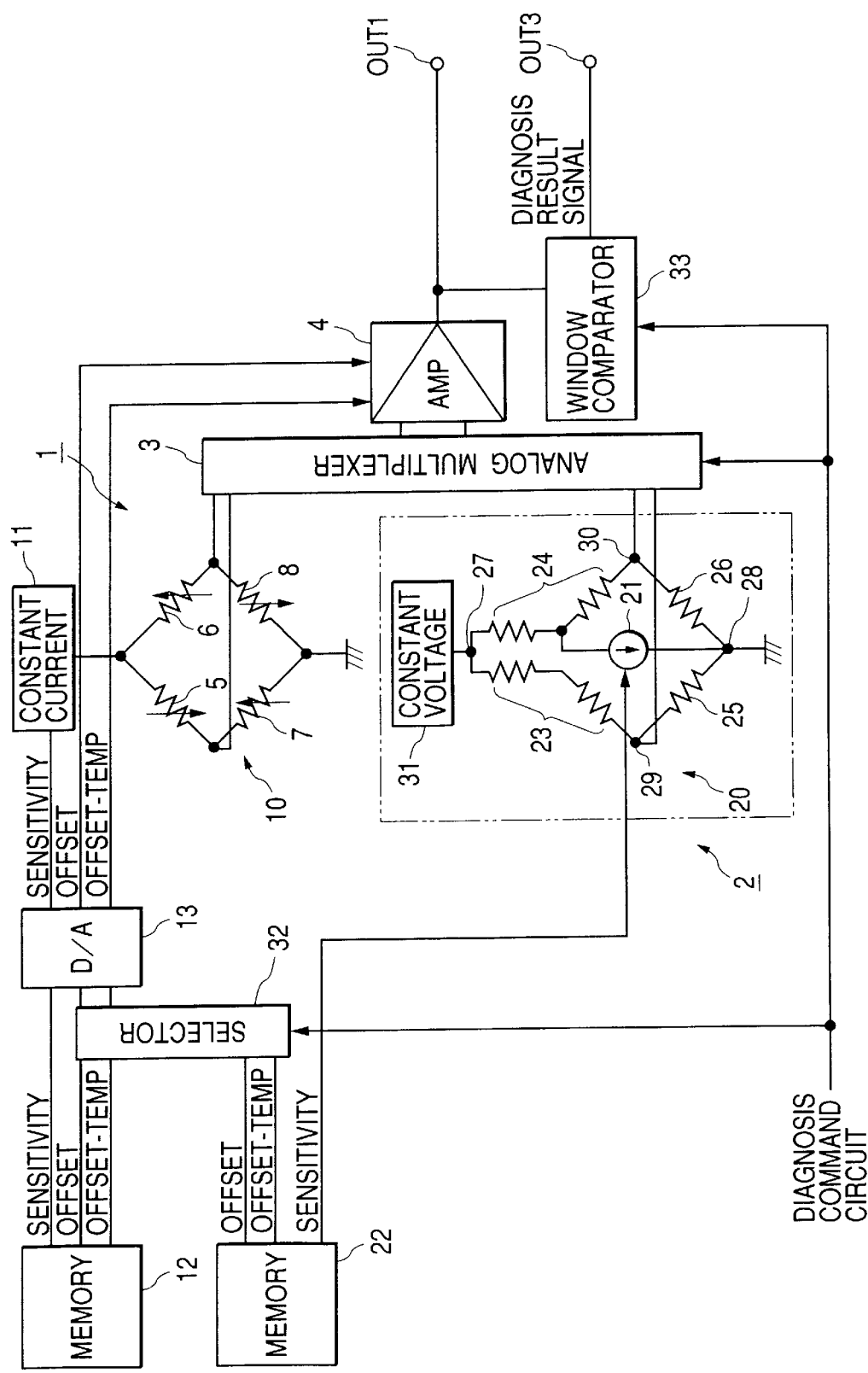
FIG. 8 is a diagram of a pressure sensor according to an eighth embodiment of this invention.

FIG. 8 shows a pressure sensor according to an eighth embodiment of this invention. The pressure sensor of FIG. 8 is similar to the pressure sensor of FIG. 1 except for design changes mentioned hereinafter.

The pressure sensor of FIG. 8 has sensor output terminals OUT1 and OUT3. The output circuit 34 (see FIG. 1) is omitted from the pressure sensor of FIG. 8. In the pressure sensor of FIG. 8, the output terminal of the amplifier 4 is connected to the sensor output terminal OUT1. The output signal from the amplifier 4 is transmitted via the sensor output terminal OUT1 to an external device as a pressure-indicating signal. The output terminal of the window comparator 33 is connected to the sensor output terminal OUT2. The output signal from the window comparator 33 is transmitted via the sensor output terminal OUT2 to an external device as a diagnosis result signal.

Ninth Embodiment

Figure 9:
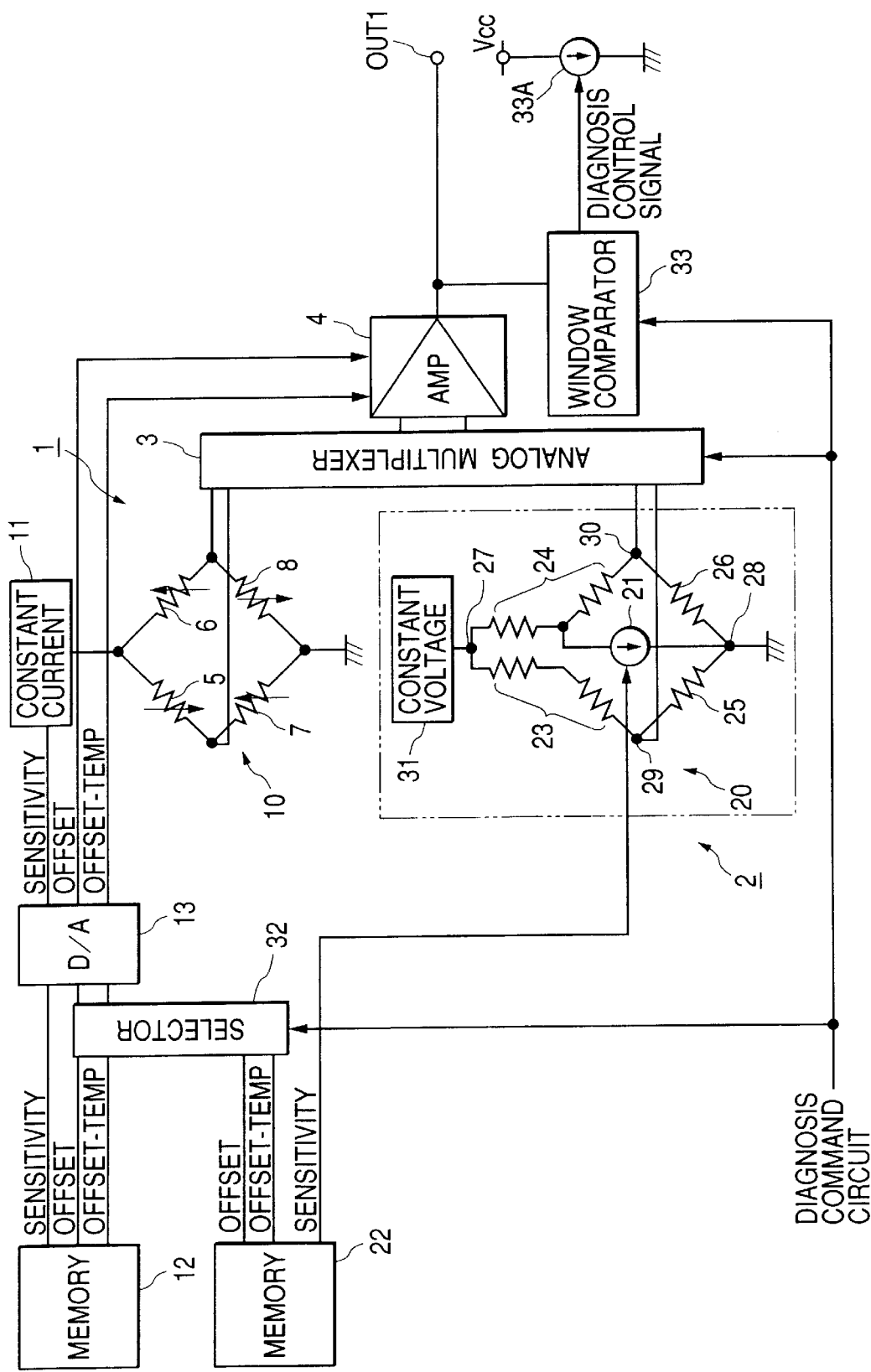
FIG. 9 is a diagram of a pressure sensor according to a ninth embodiment of this invention.

FIG. 9 shows a pressure sensor according to a ninth embodiment of this invention. The pressure sensor of FIG. 9 is similar to the pressure sensor of FIG. 1 except for design changes mentioned hereinafter.

The pressure sensor of FIG. 9 has a sensor output terminal OUT1 and a constant-current circuit 33A. The output circuit 34 (see FIG. 1) is omitted from the pressure sensor of FIG. 9. In the pressure sensor of FIG. 9, the output terminal of the amplifier 4 is connected to the sensor output terminal OUT1. The output signal from the amplifier 4 is transmitted via the sensor output terminal OUT1 to an external device as a pressure-indicating signal.

A first end of the constant-current circuit 33A is connected to the positive power feed line subjected to the constant power supply voltage Vcc. A second end of the constant-current circuit 33A is grounded. The constant-current circuit 33A has a control terminal connected to the output terminal of the window comparator 33. Thus, the control terminal of the constant-current circuit 33A receives the diagnosis control signal from the window comparator 33. The current flowing through the constant-current circuit 33A, that is, the current flowing along the positive power feed line, is changed in response to the diagnosis control signal. The positive power feed lines is connected to the system control circuit (the ECU). The system control circuit (the ECU) is programmed to detect whether the specified portion of the pressure sensor is normal or wrong on the basis of the current flowing along the positive power feed line.

According to a modification of the pressure sensor of FIG. 9, the amplifier 4 is followed by the output circuit 34 (see FIG. 7), and the input terminal of the window comparator 33 is connected to the output terminal of the output circuit 34. Thus, the window comparator 33 responds to the output signal of the output circuit 34.

Tenth Embodiment

Figure 10:
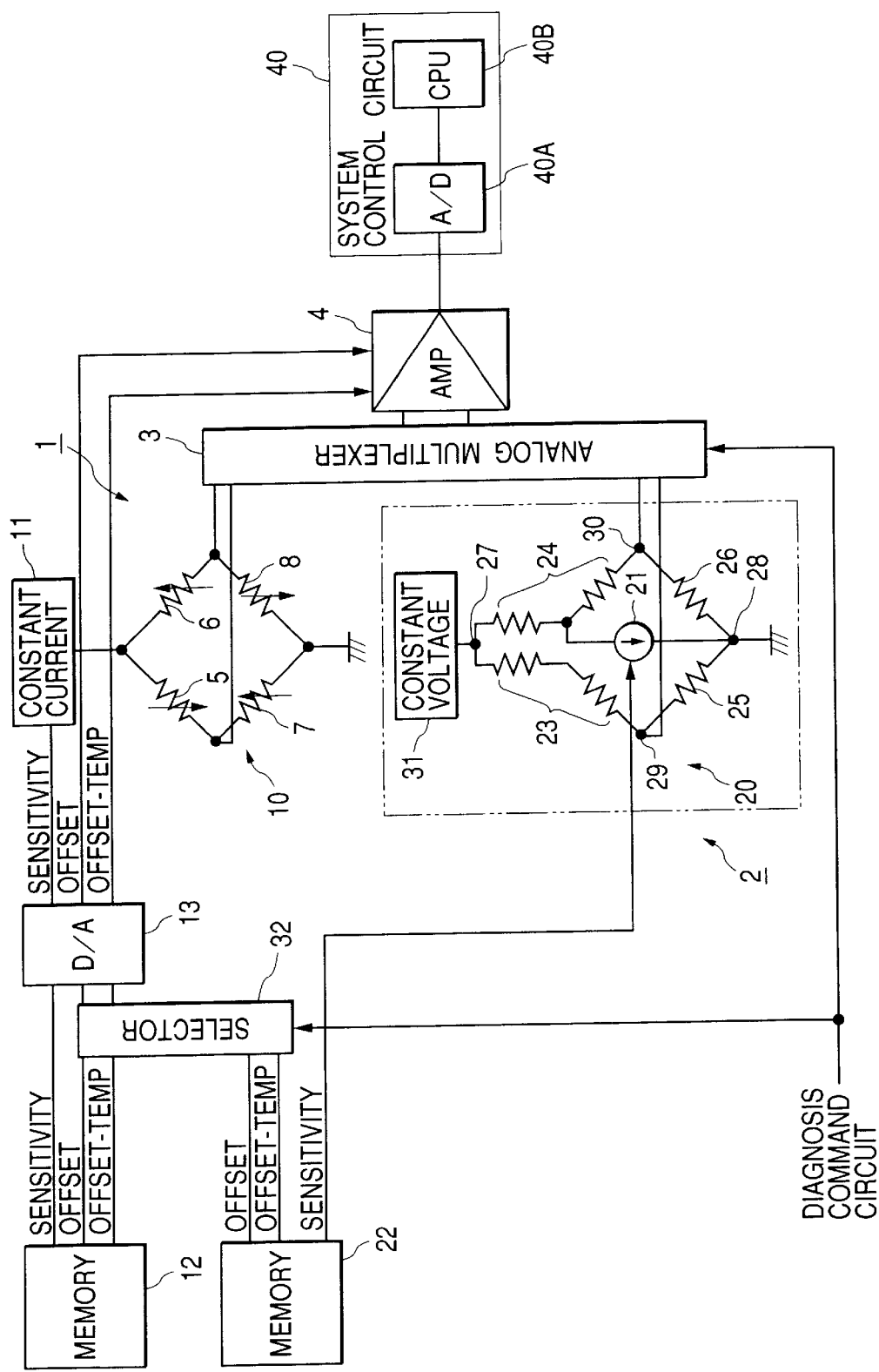
FIG. 10 is a diagram of a pressure sensor according to a tenth embodiment of this invention.

FIG. 10 shows a pressure sensor according to a tenth embodiment of this invention. The pressure sensor of FIG. 10 is similar to the pressure sensor of FIG. 1 except for design changes mentioned hereinafter.

In the pressure sensor of FIG. 10, the system control circuit (the ECU) 40 includes an A/D (analog-to-digital) converter 40A and a CPU 40B. The A/D converter 40A and the CPU 40B are connected to each other. The window comparator 33 and the output circuit 34 (see FIG. 1) are omitted from the pressure sensor of FIG. 10.

In the pressure sensor of FIG. 10, the output signal of the amplifier 4 is applied to the A/D converter 40A as an analog sensor signal. The A/D converter 40A changes the analog sensor signal into a corresponding digital sensor signal. The A/D converter 40A outputs the digital sensor signal to the CPU 40B. The CPU 40B is programmed to execute the following steps of operation. The CPU 40B compares the digital sensor signal with first and second reference signals representing first and second predetermined values defining a normal range therebetween. The CPU 40B determines whether or not the digital sensor signal is in the normal range. When the digital sensor signal is in the normal range, the CPU 40B judges the specified portion of the pressure sensor to be normal. When the digital sensor signal is outside the normal range, the CPU 40B judges the specified portion of the pressure sensor to be wrong.

Eleventh Embodiment

Figure 11:
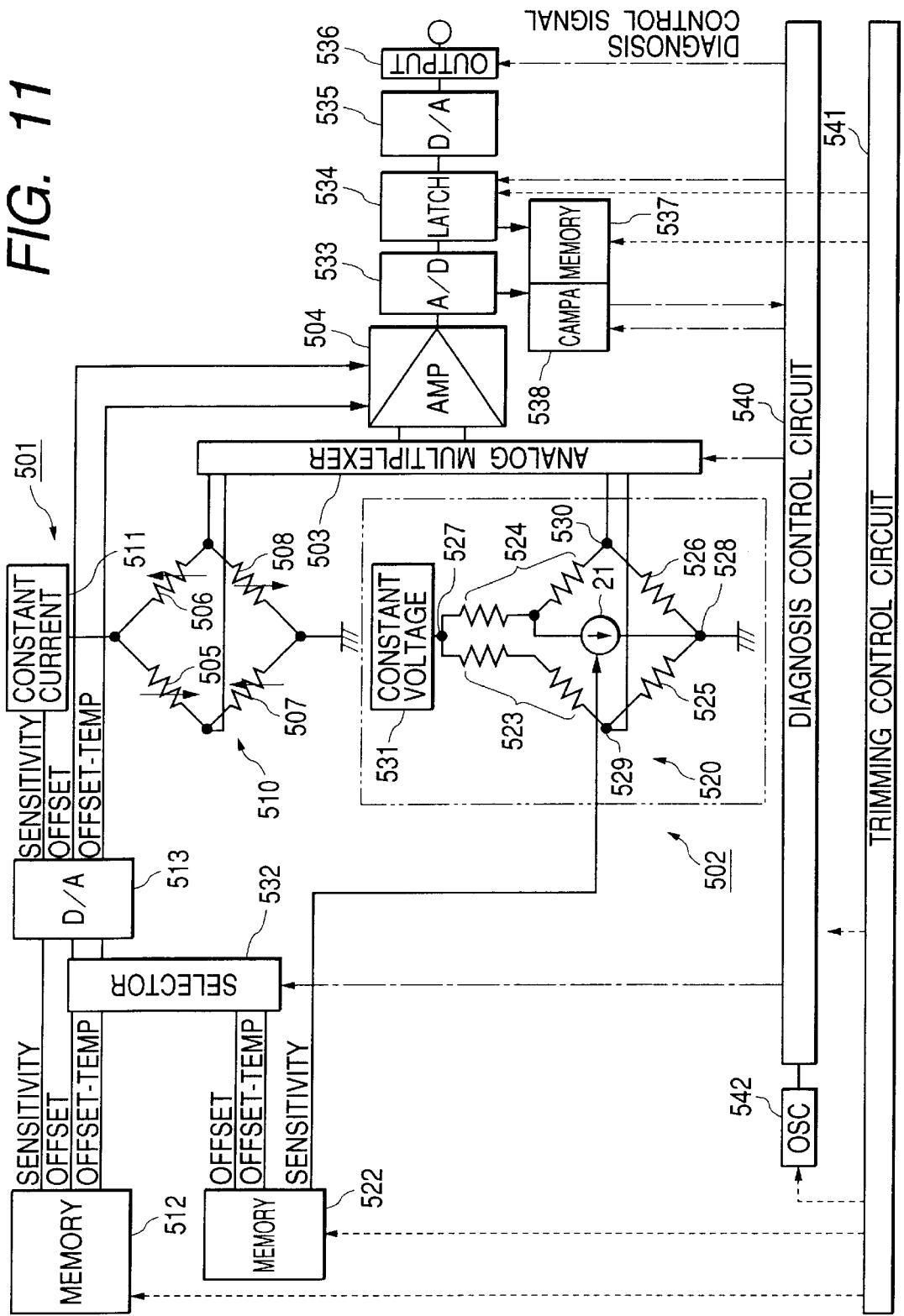
FIG. 11 is a diagram of a pressure sensor according to an eleventh embodiment of this invention.

FIG. 11 shows a pressure sensor according to an eleventh embodiment of this invention. The pressure sensor of FIG. 11 includes a sensing portion (a sensor portion) 510, a diagnosis control circuit 540, and a trimming control circuit 541. A pressure to be detected is applied to the sensing portion 510.

The diagnosis control circuit 540 includes a microcomputer or a similar device having a combination of an I/O port, a CPU, a ROM, and a RAM. The diagnosis control circuit 540 operates in accordance with a program stored in the ROM. The program is designed so that the diagnosis control circuit 540 executes steps of operation which will be mentioned later.

The trimming control circuit 540 includes a microcomputer or a similar device having a combination of an I/O port, a CPU, a ROM, and a RAM. The trimming control circuit 540 operates in accordance with a program stored in the ROM. The program is designed so that the trimming control circuit 540 executes steps of operation which will be mentioned later.

The pressure sensor of FIG. 11 includes a pressure sensing circuit 501 and a checking circuit 502. The pressure sensing circuit 501 contains the sensing portion 510. The pressure sensing circuit 501 generates and outputs a signal representing the pressure applied to the sensing portion 510. The checking circuit 502 generates and outputs a signal used for a check (a diagnosis) on a specified portion of the pressure sensor.

An analog multiplexer 503 is connected to the pressure sensing circuit 501, the checking circuit 502, an amplifier 504, and the diagnosis control circuit 40. The multiplexer 503 receives the output signal of the pressure sensing circuit 501. The multiplexer 503 receives the output signal of the checking circuit 502. The diagnosis control circuit 540 outputs a diagnosis command signal to the multiplexer 503. The diagnosis command signal is binary. The multiplexer 503 selects one of the output signal from the pressure sensing circuit 501 and the output signal from the checking circuit 502 in accordance with the state of the diagnosis command signal, and passes the selected signal to the amplifier 504. Operation of the pressure sensor can be changed among different modes including a pressure sensing mode, a checking mode, and a trimming mode. Specifically, operation of the pressure sensor is changed between the pressure sensing mode and the checking mode by the diagnosis command signal. During the pressure sensing mode of operation, the diagnosis command signal is in its state which causes the multiplexer 503 to transmit the output signal of the pressure sensing circuit 501 to the amplifier 504. During the checking mode of operation, the diagnosis command signal is in its sate which causes the multiplexer 503 to transmit the output signal of the checking circuit 502 to the amplifier 504.

The diagnosis control circuit 540 is connected to an oscillator (OSC) 542. The oscillator 542 generates a clock signal. The diagnosis control circuit 540 receives the clock signal from the oscillator 542. The diagnosis control circuit 540 changes the diagnosis command signal in response to the clock signal so that the checking mode of operation of the pressure sensor will be repetitively executed at a predetermined suitable period.

As previously mentioned, the pressure sensing circuit 501 includes the sensing portion 510. The pressure sensing circuit 501 further includes a constant-current circuit 511, a memory 512, and a D/A (digital-to-analog) converter 513. The sensing portion 510 includes a bridge circuit having a combination of four diffusion layer resistors (four strain gauges) 505, 506, 507, and 508 formed on a diaphragm subjected to the pressure to be detected. The sensing portion 510 is connected to the multiplexer 503 and the constant-current circuit 511. The constant-current circuit 511 causes a constant current to flow through the sensing portion 510. The constant current flowing through the sensing portion 510 is determined by a control signal fed to the constant-current circuit 511. The constant-current circuit 511 is connected to the D/A converter 513. The D/A converter 513 is connected to the memory 512. The memory 512 stores digital data related to sensitivity (detection-resultant signal span). The memory 512 outputs the sensitivity-related digital data to the D/A converter 513. The D/A converter 513 changes the sensitivity-related digital data into a corresponding sensitivity-related analog signal. The D/A converter 513 outputs the sensitivity-related analog signal to the constant-current circuit 511 as a control signal.

During the pressure sensing mode of operation, the difference between the voltages at opposite inter-resistor junctions in the bridge circuit of the sensing portion 510 depends on the pressure applied to the sensing portion 510. The voltages at the opposite inter-resistor junctions in the bridge circuit of the sensing portion 510 are applied to the multiplexer 503 as the output signal of the pressure sensing circuit 501 or the output signal of the sensing portion 510. As previously mentioned, the constant-current circuit 511 causes a constant current to flow through the sensing portion 510. The constant current is determined by the control signal fed to the constant-current circuit 511 from the D/A converter 513. Since the control signal depends on the sensitivity-related digital data outputted from the memory 512, the constant current flowing through the sensing portion 510 is determined by the sensitivity-related digital data outputted from the memory 512. Preferably, the sensitivity-related digital data outputted from the memory 512 are designed to suit with temperature compensation for the sensitivity of the pressure sensor.

The impurity concentration in the diffusion layer resistors 505, 506, 507, and 508 composing the bridge circuit in the sensing portion 510 is optimized to provide temperature compensation for the sensitivity of the pressure sensor. The temperature characteristic of the diffusion layer resistors 505, 506, 507, and 508 and the temperature dependency of the sensitivity of the pressure sensor are set so as to cancel each other. This setting enables temperature compensation for the sensitivity of the pressure sensor to be provided when a constant current flows through the bridge circuit in the sensing potion 510. Specifically, in the case where the temperature coefficient of the sensitivity of the pressure sensor is equal to about $-1600$ ppm/°C., the temperature coefficient of the diffusion layer resistors 505, 506, 507, and 508 is set to about $+1600$ ppm/°C. In this case, the impurity concentration in the diffusion layer resistors 505, 506, 507, and 508 is set to, for example, about $10^{20}$ cm$^{-3}$.

A selector 532 is connected between the memory 512 and the D/A converter 513. The selector 532 is also connected to the diagnosis control circuit 540. The D/A converter 513 is connected to the amplifier 504. The memory 512 stores digital data related to an offset in the bridge circuit of the sensing portion 510 and an offset in the amplifier 504. In addition, the memory 512 stores digital data related to an offset temperature characteristic (an offset temperature dependency) of the bridge circuit of the sensing portion 510 and an offset temperature characteristic (an offset temperature dependency) of the amplifier 504. The offset-related digital data and the offset-temperature-characteristic digital data can be transmitted from the memory 512 to the D/A converter 513 via the selector 532. Specifically, the selector 532 receives the diagnosis command signal from the diagnosis control circuit 540. The selector 532 responds to the diagnosis command signal. During the pressure sensing mode of operation, the selector 532 is controlled by the diagnosis command signal to select the offset-related digital data and the offset-temperature-characteristic digital data outputted from the memory 512. In this case, the selector 532 passes the offset-related digital data and the offset-temperature-characteristic digital data from the memory 512 to the D/A converter 513. The D/A converter 513 changes the offset-related digital data into a corresponding offset-related analog signal. The D/A converter 513 outputs the offset-related analog signal to the amplifier 504. The D/A converter 513 changes the offset-temperature-characteristic digital data into a corresponding offset-temperature-characteristic analog signal. The D/A converter 513 outputs the offset-temperature-characteristic analog signal to the amplifier 504. During the pressure sensing mode of operation, the output signal of the sensing portion 510 is transmitted to the amplifier 504 via the multiplexer 503. Thus, the device 504 amplifies the output signal of the sensing portion 510 (that is, the difference between the voltages at the opposite inter-resistor junctions in the bridge circuit of the sensing portion 510) in response to the offset-related analog signal and the offset-temperature-characteristic analog signal, thereby compensating for the offset and the offset temperature dependency of the bridge circuit in the sensing portion 510 and also the offset and the offset temperature dependency of the amplifier 504.

The amplifier 504 is similar to the amplifier 4 in FIGS. 1 and 2. Accordingly, the amplifier 504 includes a first circuit for controlling the offset-temperature-characteristic analog signal in accordance with temperature, and a second circuit for adjusting the output signal of the sensing portion 510 in response to the controlled offset-temperature-characteristic analog signal to implement desired temperature compensation.

The checking circuit 502 includes a checking bridge circuit 520, a memory 522, and a constant-voltage circuit 531. The checking bridge circuit 520 includes a constant-current circuit 521. The memory 522 is connected to the constant-current circuit 521 and the selector 532. The memory 522 stores sensitivity-related digital data for determining a current driven by the constant-current circuit 521. The constant-voltage circuit 531 is connected to the checking bridge circuit 520.

The checking bridge circuit 520 has a combination of resistors 523, 524, 525, and 526 whose resistances hardly depend on temperature. The resistors 523, 524, 525, and 526 are of a structure different from a strain gauge. The resistors 523, 524, 525, and 526 are formed on a substrate of a design different from a diaphragm so that the checking bridge circuit 520 is insensitive to the pressure applied to the sensing portion 510. Preferably, the resistors 523, 524, 525, and 526 include thin film resistors of CrSi. The resistors 523, 524, 525, and 526 are connected in a tetragonal closed circuit which has a junction 527 between the resistors 523 and 524, a junction 528 between the resistors 525 and 526, a junction 529 between the resistors 523 and 525, and a junction 530 between the resistors 524 and 526. The junction 527 is connected to the positive output terminal of the constant-voltage circuit 531. The negative output terminal of the constant-voltage circuit 531 is grounded. The junction 528 is grounded. The junctions 529 and 530 are connected to the multiplexer 503. The voltages at the junctions 529 and 530 are applied to the multiplexer 503 as the output signal of the checking circuit 502 or the output signal of the checking bridge circuit 520. The junction 527 is called a power supplied junction. The junction 528 is called a grounded junction. The junctions 529 and 530 are called first and second output junctions, respectively.

The input side of the constant-current circuit 521 is connected to an intermediate point in the resistor 524 located between the power supplied junction 527 and the second output junction 530. The output side of the constant-current circuit 521 is connected to the grounded junction 528.

For example, the constant-current circuit 521 includes a D/A converter and a current control portion. The D/A converter receives the sensitivity-related digital data from the memory 522. The D/A converter changes the sensitivity-related digital data into a corresponding analog signal. The D/A converter outputs the analog signal to the current control portion as a control signal. The current control portion regulates a current flowing through the constant-current circuit 521 at a constant level determined by the control signal. Thus, the constant current driven by the constant current circuit 521 is determined by the sensitivity-related digital data outputted from the memory 522. Preferably, the constant current driven by the constant-current circuit 521 is chosen so that the difference between the voltages at the first and second output junctions 529 and 530 will be equal to a desired value. The difference between the voltages at the first and second output junctions 529 and 530 corresponds to a reference voltage for check.

During the checking mode of operation, the output signal of the checking bridge circuit 520 is transmitted to the amplifier 504 via the multiplexer 503, and hence the device 504 amplifies the output signal of the checking bridge circuit 520. Specifically, the device 504 amplifies the difference between the voltages at the first and second output junctions 529 and 530 in the checking bridge circuit 520. Preferably, the output signal of the checking bridge circuit 520 has a span equal to the span of the output signal of the bridge circuit in the sensing portion 510. For example, in the case where the sensitivity-related digital data in the memory 522 correspond to a range of several mV to 200 mV, the output signal of the checking bridge circuit 520 has a resolution corresponding to 8 bits to 10 bits.

The constant-voltage circuit 531 derives a constant voltage from a power supply voltage. The constant-voltage circuit 531 applies the constant voltage between the power supplied junction 527 and the grounded junction 528. The power supply voltage may be directly applied between the power supplied junction 527 and the grounded junction 528. In this case, the voltage applied between the power supplied junction 527 and the grounded junction 528 has a ratio with the power supply voltage.

The selector 532 is connected between the memory 522 and the D/A converter 513. The memory 522 stores digital data related to an offset in the amplifier 504. In addition, the memory 522 stores digital data related to an offset temperature characteristic (an offset temperature dependency) of the amplifier 504. The offset-related digital data and the offset-temperature-characteristic digital data can be transmitted from the memory 522 to the D/A converter 513 via the selector 532. As previously mentioned, the selector 532 responds to the diagnosis command signal outputted from the diagnosis control circuit 540. During the checking mode of operation, the selector 532 is controlled by the diagnosis command signal to select the offset-related digital data and the offset-temperature-characteristic digital data outputted from the memory 522. In this case, the selector 532 passes the offset-related digital data and the offset-temperature-characteristic digital data from the memory 522 to the D/A converter 513. The D/A converter 513 changes the offset-related digital data into a corresponding offset-related analog signal. The D/A converter 513 outputs the offset-related analog signal to the amplifier 504. The D/A converter 513 changes the offset-temperature-characteristic digital data into a corresponding offset-temperature-characteristic analog signal. The D/A converter 513 outputs the offset-temperature-characteristic analog signal to the amplifier 504. During the checking mode of operation, the output signal of the checking bridge circuit 520 is transmitted to the amplifier 504 via the multiplexer 503. Thus, the device 504 amplifies the output signal of the checking bridge circuit 520 in response to the offset-related analog signal and the offset-temperature-characteristic analog signal, thereby compensating for the offset and the offset temperature dependency of the amplifier 504.

The amplifier 504 includes a first circuit for controlling the offset-temperature-characteristic analog signal in accordance with temperature, and a second circuit for adjusting the output signal of the checking bridge circuit 520 in response to the controlled offset-temperature-characteristic analog signal to implement desired temperature compensation.

The pressure sensor of FIG. 11 further includes an A/D (analog-to-digital) converter 533, a latch circuit 534, a D/A (digital-to-analog) converter 535, an output circuit 536, a memory 537, and a comparator 538. The A/D converter 533 is connected to the amplifier 504, the latch circuit 534, and the comparator 538. The latch circuit 534 is connected to the D/A converter 535, the memory 537, the diagnosis control circuit 540, and the trimming control circuit 541. The D/A converter 535 is connected to the output circuit 536. The output circuit 536 is connected to the diagnosis control circuit 540. The memory 537 is connected to the comparator 538 and the trimming control circuit 541. The comparator 538 is connected to the diagnosis control circuit 540.

The A/D converter 533 receives the analog output signal (the analog amplification-resultant signal) from the amplifier 504. The A/D converter 533 changes the analog amplification-resultant signal into a corresponding digital signal. The A/D converter 533 outputs the digital signal to the latch circuit 534 and the comparator 538. The latch circuit 534 samples and holds the digital output signal of the A/D converter 533 in response to the diagnosis command signal outputted from the diagnosis control circuit 540. The latch circuit 534 outputs the held digital signal to the D/A converter 535.

The D/A converter 535 changes the digital output signal of the latch circuit 534 into a corresponding analog signal. The D/A converter 535 outputs the analog signal to the output circuit 536. The output circuit 536 is similar to the output circuit 34 in FIGS. 1 and 3. Normally, the output circuit 536 acts as a voltage follower circuit, and outputs a signal depending on the output signal of the D/A converter 535. The diagnosis control circuit 540 generates a diagnosis control signal (a diagnosis result signal) representing whether a specified portion of the pressure sensor is normal or wrong. The specified portion of the pressure sensor includes the amplifier 504 and the A/D converter 533. The diagnosis control circuit 540 outputs the diagnosis control signal to the output circuit 536. The output circuit 536 responds to the diagnosis control signal. When the diagnosis control signal is in a state corresponding to a malfunction of the specified portion of the pressure sensor, the output circuit 536 outputs a preset high level signal or a preset low level signal. The preset high level signal or the preset low level signal outputted from the output circuit 536 informs a system control side or an external device that the specified portion of the pressure sensor is wrong. When the diagnosis control signal is in a state corresponding to normal operation of the specified portion of the pressure sensor, the output circuit 536 passes the output signal from to the D/A converter 535 to the next stage.

The memory 537 stores an initial-value signal corresponding to an initial state of the pressure sensor which operates normally in the checking mode. Specifically, during the trimming mode of operation, the output signal of the latch circuit 534 is written into the memory 537 as the initial-value signal. The comparator 538 receives the diagnosis command signal from the diagnosis control circuit 540. During the checking mode of operation, the comparator 538 is controlled by the diagnosis command signal to read out the initial-value signal from the memory 537 and to compare the output signal of the A/D converter 533 with the initial-value signal. The comparator 538 generates a signal representing a result of the comparison. The comparator 538 outputs the comparison result signal to the diagnosis control circuit 540.

The trimming control circuit 541 is connected to the memories 512, 522, and 537. In addition, the trimming control circuit 541 is connected to the latch circuit 534, the diagnosis control circuit 540, and the oscillator 542. The trimming control circuit 540 controls the memories 512, 522, and 537, the latch circuit 534, the diagnosis control circuit 540, and the oscillator 542.

The trimming mode of operation of the pressure sensor has first, second, third, fourth, fifth, sixth, and seventh stages. During the first stage of the trimming mode of operation, the pressure applied to the sensing portion 510 is set to zero, and the trimming control circuit 541 writes temporary offset-related digital data into the memory 512. The temporary offset-related digital data are transmitted from the memory 512 to the D/A converter 513 via the selector 532. The D/A converter 513 changes the temporary offset-related digital data into a temporary offset-related analog signal. The D/A converter 513 outputs the temporary offset-related analog signal to the amplifier 504. During the first stage of the trimming mode of operation, the output signal of the sensing portion 510 is transmitted via the multiplexer 503 to the amplifier 504. The device 504 amplifies the output signal of the sensing portion 510 in response to the temporary offset-related analog signal. The amplifier 504 outputs the amplification-resultant signal to the A/D converter 533. Information represented by the amplification-resultant signal is propagated through the A/D converter 533, the latch circuit 534, the D/A converter 535, and the output circuit 536. The trimming control circuit 541 checks the output signal of the output circuit 536. Specifically, the trimming control circuit 541 determines whether or not the output signal of the output circuit 536 is in a preset expected range (a preset acceptable range). When the output signal of the output circuit 536 is in the preset expected range, the trimming control circuit 541 holds unchanged the temporary offset-related digital data in the memory 512. Accordingly, in this case, the temporary offset-related digital data remain in the memory 512 as final offset-related digital data. On the other hand, when the output signal of the output circuit 536 is outside the preset expected range, the trimming control circuit 541 updates the temporary offset-related digital data in the memory 512 into new offset-related digital data. Then, operation steps similar to the above-mentioned operation steps are performed. Such a sequence of operation steps is repeated until the output signal of the output circuit 536 falls into the preset expected range. As a result, the memory 512 is finally loaded with the offset-related digital data which cause the output signal of the output circuit 536 to be in the preset expected range.

During the second stage of the trimming mode of operation, the pressure applied to the sensing portion 510 is set to a value different from zero, and the trimming control circuit 541 writes temporary sensitivity-related digital data into the memory 512. The temporary sensitivity-related digital data are transmitted from the memory 512 to the D/A converter 513. The D/A converter 513 changes the temporary sensitivity-related digital data into a temporary sensitivity-related analog signal. The D/A converter 513 outputs the temporary sensitivity-related analog signal to the constant-current circuit 511. Thus, the current driven into the sensing portion 510 by the constant-current circuit 511 is determined by the temporary sensitivity-related analog signal. During the second stage of the trimming mode of operation, the output signal of the sensing portion 510 is transmitted via the multiplexer 503 to the amplifier 504. The device 504 amplifies the output signal of the sensing portion 510. The amplifier 504 outputs the amplification-resultant signal to the A/D converter 533. Information represented by the amplification-resultant signal is propagated through the A/D converter 533, the latch circuit 534, the D/A converter 535, and the output circuit 536. The trimming control circuit 541 checks the output signal of the output circuit 536. Specifically, the trimming control circuit 541 determines whether or not the output signal of the output circuit 536 is in a preset expected range (a preset acceptable range). When the output signal of the output circuit 536 is in the preset expected range, the trimming control circuit 541 holds unchanged the temporary sensitivity-related digital data in the memory 512. Accordingly, in this case, the temporary sensitivity-related digital data remain in the memory 512 as final sensitivity-related digital data. On the other hand, when the output signal of the output circuit 536 is outside the preset expected range, the trimming control circuit 541 updates the temporary sensitivity-related digital data in the memory 512 into new sensitivity-related digital data. Then, operation steps similar to the above-mentioned operation steps are performed. Such a sequence of operation steps is repeated until the output signal of the output circuit 536 falls into the preset expected range. As a result, the memory 512 is finally loaded with the sensitivity-related digital data which cause the output signal of the output circuit 536 to be in the preset expected range.

During the third stage of the trimming mode of operation, the pressure applied to the sensing portion 510 is set to zero, and the trimming control circuit 541 writes temporary offset-temperature-characteristic digital data into the memory 512. The temporary offset-temperature-characteristic digital data are transmitted from the memory 512 to the D/A converter 513 via the selector 532. The D/A converter 513 changes the temporary offset-temperature-characteristic digital data into a temporary offset-temperature-characteristic analog signal. The D/A converter 513 outputs the temporary offset-temperature-characteristic analog signal to the amplifier 504. During the third stage of the trimming mode of operation, the output signal of the sensing portion 510 is transmitted via the multiplexer 503 to the amplifier 504. The device 504 amplifies the output signal of the sensing portion 510 in response to the temporary offset-temperature-characteristic analog signal. The amplifier 504 outputs the amplification-resultant signal to the A/D converter 533. Information represented by the amplification-resultant signal is propagated through the A/D converter 533, the latch circuit 534, the D/A converter 535, and the output circuit 536. The trimming control circuit 541 detects a shift of the offset in the output signal of the output circuit 536 while temperature is changed. The trimming control circuit 541 determines whether or not the detected offset shift is in a preset expected range (a preset acceptable range). When the detected offset shift is in the preset expected range, the trimming control circuit 541 holds unchanged the temporary offset-temperature-characteristic digital data in the memory 512. Accordingly, in this case, the temporary offset-temperature-characteristic digital data remain in the memory 512 as final offset-temperature-characteristic digital data. On the other hand, when the detected offset shift is outside the preset expected range, the trimming control circuit 541 updates the temporary offset-temperature-characteristic digital data in the memory 512 into new offset-temperature-characteristic digital data. Then, operation steps similar to the above-mentioned operation steps are performed. Such a sequence of operation steps is repeated until the detected offset shift falls into the preset expected range. As a result, the memory 512 is finally loaded with the offset-temperature-characteristic digital data which cause the offset shift in the output signal of the output circuit 536 to be in the preset expected range. During the third stage of the trimming mode of operation, the offset-related digital data in the memory 512 may be corrected in response to the output signal of the output circuit 536.

During the fourth stage of the trimming mode of operation, the trimming control circuit 541 writes temporary offset-related digital data into the memory 522. The temporary offset-related digital data are transmitted from the memory 522 to the D/A converter 513 via the selector 532. The D/A converter 513 changes the temporary offset-related digital data into a temporary offset-related analog signal. The D/A converter 513 outputs the temporary offset-related analog signal to the amplifier 504. During the fourth stage of the trimming mode of operation, the output signal of the checking bridge circuit 520 is transmitted via the multiplexer 503 to the amplifier 504. The device 504 amplifies the output signal of the checking bridge circuit 520 in response to the temporary offset-related analog signal. The amplifier 504 outputs the amplification-resultant signal to the A/D converter 533. Information represented by the amplification-resultant signal is propagated through the A/D converter 533, the latch circuit 534, the D/A converter 535, and the output circuit 536. The trimming control circuit 541 checks the output signal of the output circuit 536. Specifically, the trimming control circuit 541 determines whether or not the output signal of the output circuit 536 is in a preset expected range (a preset acceptable range). When the output signal of the output circuit 536 is in the preset expected range, the trimming control circuit 541 holds unchanged the temporary offset-related digital data in the memory 522. Accordingly, in this case, the temporary offset-related digital data remain in the memory 522 as final offset-related digital data. On the other hand, when the output signal of the output circuit 536 is outside the preset expected range, the trimming control circuit 541 updates the temporary offset-related digital data in the memory 522 into new offset-related digital data. Then, operation steps similar to the above-mentioned operation steps are performed. Such a sequence of operation steps is repeated until the output signal of the output circuit 536 falls into the preset expected range. As a result, the memory 522 is finally loaded with the offset-related digital data which cause the output signal of the output circuit 536 to be in the preset expected range.

During the fifth stage of the trimming mode of operation, the trimming control circuit 541 writes temporary sensitivity-related digital data into the memory 522. The temporary sensitivity-related digital data are transmitted from the memory 522 to the constant-current circuit 521 in the checking bridge circuit 520. Thus, the current driven by the constant-current circuit 521 is determined by the temporary sensitivity-related digital data. During the fifth stage of the trimming mode of operation, the output signal of the checking bridge circuit 520 is transmitted via the multiplexer 503 to the amplifier 504. The device 504 amplifies the output signal of the sensing portion 510. The amplifier 504 outputs the amplification-resultant signal to the A/D converter 533. Information represented by the amplification-resultant signal is propagated through the A/D converter 533, the latch circuit 534, the D/A converter 535, and the output circuit 536. The trimming control circuit 541 checks the output signal of the output circuit 536. Specifically, the trimming control circuit 541 determines whether or not the output signal of the output circuit 536 is in a preset expected range (a preset acceptable range). When the output signal of the output circuit 536 is in the preset expected range, the trimming control circuit 541 holds unchanged the temporary sensitivity-related digital data in the memory 522. Accordingly, in this case, the temporary sensitivity-related digital data remain in the memory 522 as final sensitivity-related digital data. On the other hand, when the output signal of the output circuit 536 is outside the preset expected range, the trimming control circuit 541 updates the temporary sensitivity-related digital data in the memory 522 into new sensitivity-related digital data. Then, operation steps similar to the above-mentioned operation steps are performed. Such a sequence of operation steps is repeated until the output signal of the output circuit 536 falls into the preset expected range. As a result, the memory 522 is finally loaded with the sensitivity-related digital data which cause the output signal of the output circuit 536 to be in the preset expected range.

During the sixth stage of the trimming mode of operation, the trimming control circuit 541 writes temporary offset-temperature-characteristic digital data into the memory 522. The temporary offset-temperature-characteristic digital data are transmitted from the memory 522 to the D/A converter 513 via the selector 532. The D/A converter 513 changes the temporary offset-temperature-characteristic digital data into a temporary offset-temperature-characteristic analog signal. The D/A converter 513 outputs the temporary offset-temperature-characteristic analog signal to the amplifier 504. During the sixth stage of the trimming mode of operation, the output signal of the checking bridge circuit 520 is transmitted via the multiplexer 503 to the amplifier 504. The device 504 amplifies the output signal of the checking bridge circuit 520 in response to the temporary offset-temperature-characteristic analog signal. The amplifier 504 outputs the amplification-resultant signal to the A/D converter 533. Information represented by the amplification-resultant signal is propagated through the A/D converter 533, the latch circuit 534, the D/A converter 535, and the output circuit 536. The trimming control circuit 541 detects a shift of the offset in the output signal of the output circuit 536 while temperature is changed. The trimming control circuit 541 determines whether or not the detected offset shift is in a preset expected range (a preset acceptable range). When the detected offset shift is in the preset expected range, the trimming control circuit 541 holds unchanged the temporary offset-temperature-characteristic digital data in the memory 522. Accordingly, in this case, the temporary offset-temperature-characteristic digital data remain in the memory 522 as final offset-temperature-characteristic digital data. On the other hand, when the detected offset shift is outside the preset expected range, the trimming control circuit 541 updates the temporary offset-temperature-characteristic digital data in the memory 522 into new offset-temperature-characteristic digital data. Then, operation steps similar to the above-mentioned operation steps are performed. Such a sequence of operation steps is repeated until the detected offset shift falls into the preset expected range. As a result, the memory 522 is finally loaded with the offset-temperature-characteristic digital data which cause the offset shift in the output signal of the output circuit 536 to be in the preset expected range. During the sixth stage of the trimming mode of operation, the offset-related digital data in the memory 522 may be corrected in response to the output signal of the output circuit 536.

After the first, second, third, fourth, fifth, and sixth stages have been completed, the trimming mode of operation enters the seventh stage. During the seventh stage of the trimming mode of operation, the offset-related digital data and the offset-temperature-characteristic digital data are transmitted from the memory 522 to the D/A converter 513 via the selector 532. In addition, the output signal of the checking bridge circuit 520 is transmitted to the amplifier 504 via the multiplexer 503. During the seventh stage of the trimming mode of operation, the trimming control circuit 541 operates the diagnosis control circuit 540 to output an activation signal to the latch circuit 534. The latch circuit 534 samples and holds the output signal of the A/D converter 533 in response to the activation signal. At the same time, the trimming control circuit 541 operates the memory 537 to store the held signal outputted from the latch circuit 534. The signal stored in the memory 537 constitutes the previously-mentioned initial-value signal.

After the trimming mode of operation, the pressure sensing mode of operation and the checking mode of operation alternate with each other.

Figure 12:
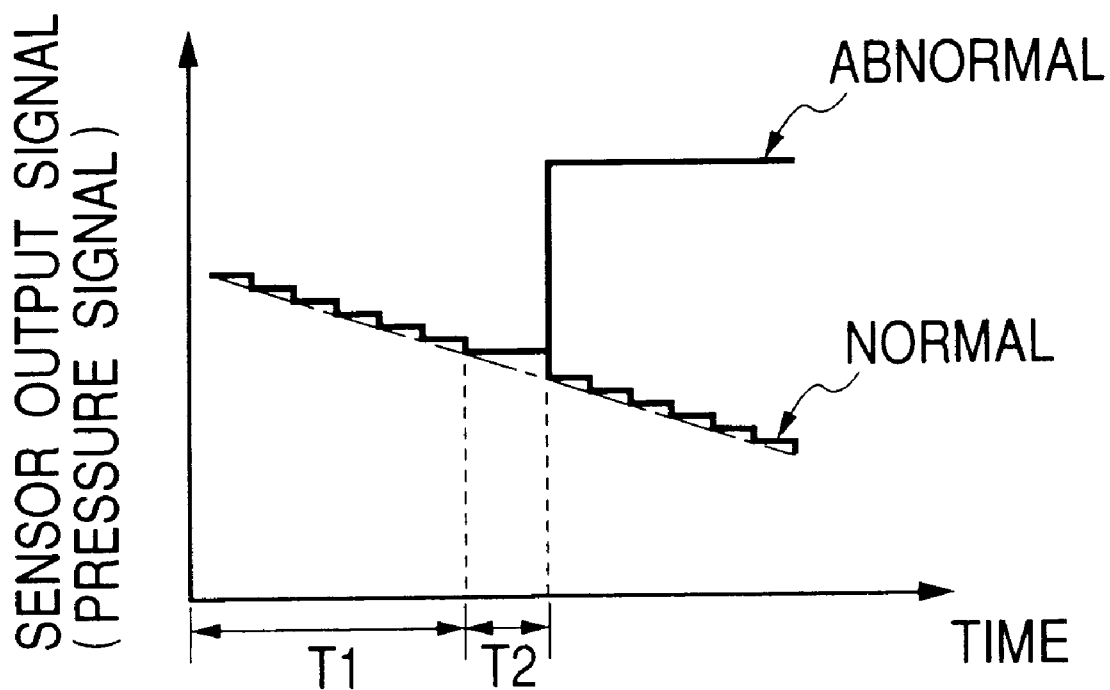
FIG. 12 is a time-domain diagram of an output signal (a pressure-indicating signal) from the pressure sensor in FIG. 11.

With reference to FIG. 12, the pressure sensing mode of operation is executed during a time interval T1, and the checking mode of operation is executed during a time interval T2 following the time interval T1.

During the time interval T1 (that is, during the pressure sensing mode of operation), the selector 532 is controlled by the diagnosis control circuit 540 to select the offset-related digital data and the offset-temperature-characteristic digital data outputted from the memory 512. In this case, the offset-related digital data and the offset-temperature-characteristic digital data are transmitted from the memory 512 to the D/A converter 513. At the same time, the multiplexer 503 is controlled by the diagnosis control circuit 540 to select the output signal of the sensing portion 510. In this case, the output signal of the sensing portion 510 is transmitted to the amplifier 504. In addition, the latch circuit 534 is controlled to be in a through state. Thus, information represented by the output signal of the sensing portion 510 is propagated through the amplifier 504, the A/D converter 533, the latch circuit 534, the D/A converter 535, and the output circuit 536. Accordingly, the output circuit 536 outputs a signal indicating the pressure applied to the sensing portion 510. At a moment immediately before the pressure sensing mode of operation is replaced by the checking mode of operation, the latch circuit 534 is controlled by the diagnosis control circuit 540 to sample and hold the output signal of the A/D converter 533.

During the time interval T2 (that is, during the checking mode of operation) following the time interval T1, the latch circuit 534 is controlled so that the held signal continues to be therein and be fed to the D/A converter 535. Thus, the output signal from the output circuit 536 reflects the held signal in the latch circuit 534 provided that the diagnosis control signal is in its state corresponding to normal operation of the specified portion of the pressure sensor. Accordingly, even during the checking mode of operation, the output circuit 536 continues to output the pressure-indicating signal provided that the specified portion of the pressure sensor is normal. During the time interval T2 (that is, during the checking mode of operation), the selector 532 is controlled by the diagnosis control circuit 540 to select the offset-related digital data and the offset-temperature-characteristic digital data outputted from the memory 522. In this case, the offset-related digital data and the offset-temperature-characteristic digital data are transmitted from the memory 522 to the D/A converter 513. At the same time, the multiplexer 503 is controlled by the diagnosis control circuit 540 to select the output signal of the checking bridge circuit 520. In this case, the output signal of the checking bridge circuit 520 is transmitted to the amplifier 504. The device 504 amplifies the output signal of the checking bridge circuit 520. The amplifier 504 outputs the amplification-resultant analog signal to the A/D converter 533. The A/D converter 533 changes the amplification-resultant analog signal to the corresponding digital signal. The A/D converter 533 outputs the digital signal to the comparator 538. During the time interval T2 (that is, during the checking mode of operation), the comparator 538 is controlled by the diagnosis control circuit 540 to read out the initial-value signal from the memory 537 and to compare the output signal of the A/D converter 533 with the initial-value signal. The comparator 538 generates a signal representing the result of the comparison. The comparator 538 outputs the comparison result signal to the diagnosis control circuit 540. The diagnosis control circuit 540 determines whether the specified portion of the pressure sensor is normal or wrong by referring to the comparison result signal. The diagnosis control circuit 540 generates the diagnosis control signal in response to the result of the determination. The diagnosis control circuit 540 outputs the diagnosis control signal to the output circuit 536. When the comparison result signal indicates that the output signal of the A/D converter 533 agrees with the initial-value signal, the diagnosis control circuit 540 sets the diagnosis control signal to its state corresponding to normal operation of the specified portion of the pressure sensor. On the other hand, when the comparison result signal indicates that the output signal of the A/D converter 533 disagrees with the initial-value signal, the diagnosis control circuit 540 sets the diagnosis control signal to its state corresponding to a malfunction of the specified portion of the pressure sensor. The output circuit 536 responds to the diagnosis control signal. In the case where the diagnosis control signal is in its state corresponding to normal operation of the specified portion of the pressure sensor, the output circuit 536 passes the output signal from to the D/A converter 535 to the next stage. On the other hand, in the case where the diagnosis control signal is in its state corresponding to a malfunction of the specified portion of the pressure sensor, the output circuit 536 outputs the preset high level signal or the preset low level signal. The preset high level signal or the preset low level signal outputted from the output circuit 536 informs the system control side or the external device that the specified portion of the pressure sensor is wrong.

In the case where the power supply voltage is equal to 5 V, it is preferable that the signal voltage outputted from the output circuit 536 varies in the range of 0.5 V to 4.5 V during normal operation of the pressure sensor. In this case, the diagnosis control signal corresponding to a malfunction of the specified portion of the pressure sensor may be designed to cause the signal voltage to be lower than 0.3 V (a reference low level) or higher than 4.7 V (a reference high level).

Twelfth Embodiment

A twelfth embodiment of this invention is similar to the eleventh embodiment thereof except that the memories 512 and 522 (or 12A and 22A) are formed by a single memory.

Thirteenth Embodiment

A thirteenth embodiment of this invention is similar to one of the eleventh and twelfth embodiments thereof except that the checking bridge circuit 520 is replaced by a D/A conversion circuit of an R-2R ladder type which is similar to that in FIG. 6.

Fourteenth Embodiment

According to a fourteenth embodiment of this invention, the pressure sensor in one of the eleventh, twelfth, and thirteenth embodiments of this invention is modified so as to detect a physical quantity different from a pressure.

Fifteenth Embodiment

Figure 13:
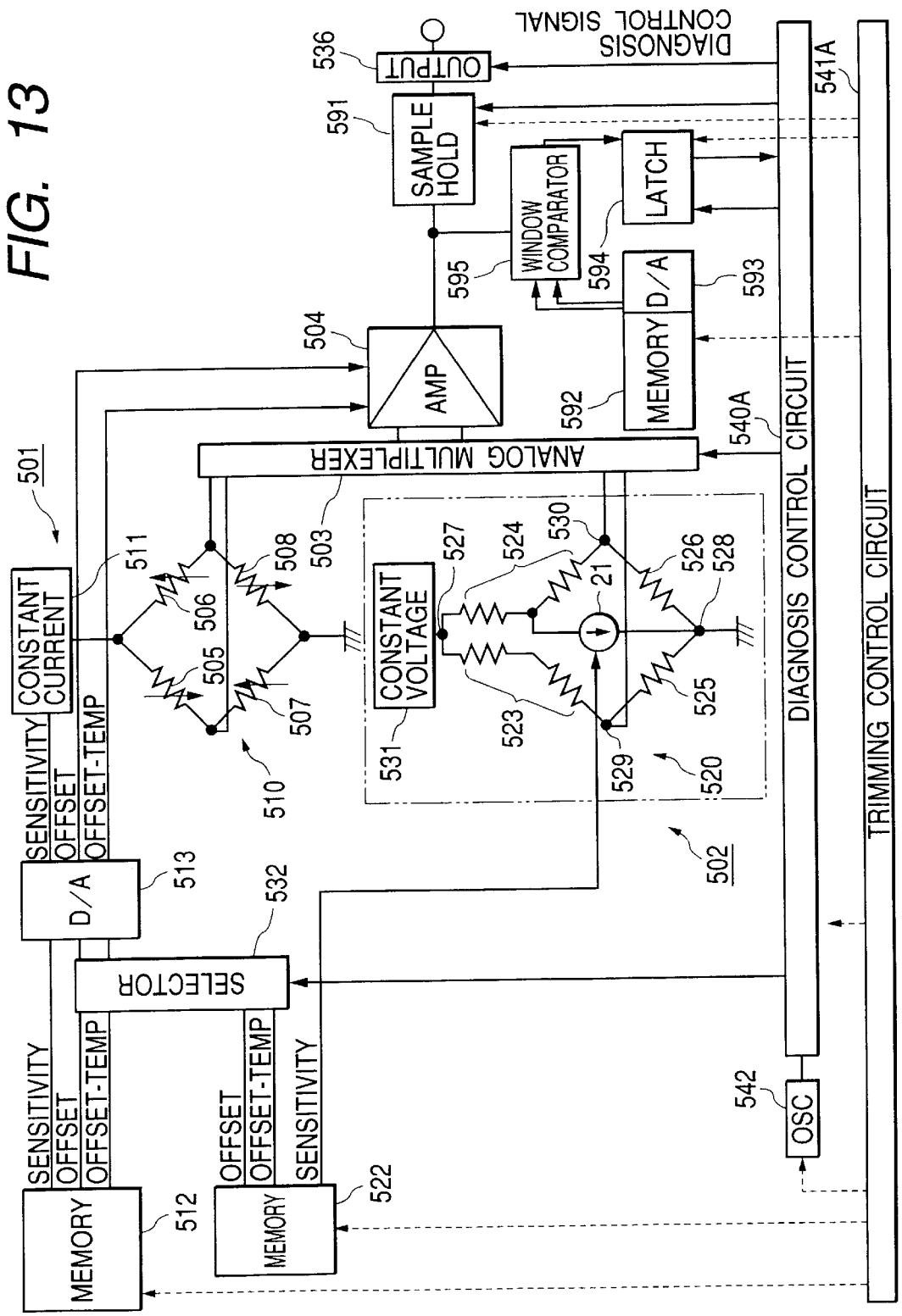
FIG. 13 is a diagram of a pressure sensor according to a fifteenth embodiment of this invention.

FIG. 13 shows a pressure sensor according to a fifteenth embodiment of this invention. The pressure sensor of FIG. 13 is similar to the pressure sensor of FIG. 11 except for design changes mentioned hereinafter. The pressure sensor of FIG. 13 includes an analog sample-and-hold circuit 591, a memory 592, a D/A (digital-to-analog) converter 593, a latch circuit 594, and a window comparator 595. The A/D converter 533, the latch circuit 534, the D/A converter 535, the memory 537, and the comparator 538 (see FIG. 11) are omitted from the pressure sensor of FIG. 13. The sample-and-hold circuit 591 corresponds to the A/D converter 533, the latch circuit 534, and the D/A converter 535 (see FIG. 11). The D/A converter 593 and the window comparator 595 correspond to the comparator 538 (see FIG. 11). The pressure sensor of FIG. 13 includes a diagnosis control circuit 540A and a trimming control circuit 541 which are modified from the diagnosis control circuit 540 and the trimming control circuit 541 (see FIG. 11) respectively.

The sample-and-hold circuit 591 is connected between the amplifier 504 and the output circuit 536. The sample-and-hold circuit 591 is also connected to the diagnosis control circuit 540A and the trimming control circuit 541A. The memory 592 is connected to the trimming control circuit 541A and the D/A converter 593. The D/A converter 593 is connected to the window comparator 595. The latch circuit 594 is connected to the diagnosis control circuit 540A, the trimming control circuit 541A, and the window comparator 595. The window comparator 595 is connected to the amplifier 504.

The sample-and-hold circuit 591 receives the output signal of the amplifier 504. During the pressure sensing mode and the trimming mode of operation, the sample-and-hold circuit 591 periodically samples and holds the output signal of the amplifier 504 on an analog basis, and outputs the held signal to the output circuit 536. Preferably, during the pressure sensing mode and the trimming mode of operation, the sample-and-hold circuit 591 is in a substantial through state. During the checking mode of operation, the sample-and-hold circuit 591 continues to output the held signal to the output circuit 536 which has been sampled at the moment of the end of the preceding pressure sensing mode of operation.

The memory 592 stores digital data representing an upper-limit reference voltage and a lower-limit reference voltage. The memory 592 outputs the digital data to the D/A converter 593. The D/A converter 593 changes the output digital data from the memory 592 into the upper-limit and lower-limit reference voltages. The D/A converter 593 applies the upper-limit and lower-limit reference voltages to the window comparator 595.

The window comparator 595 receives the output signal of the amplifier 504. The upper-limit and lower-limit reference voltages applied to the window comparator 595 define, therebetween, a normal range for the voltage of the output signal from the amplifier 504. The device 595 compares the voltage of the output signal from the amplifier 504 with the upper-limit and lower-limit reference voltages. The window comparator 595 determines whether or not the voltage of the output signal from the amplifier 504 is in the normal range. The window comparator 595 generates a binary signal representing the result of the determination (the result of the comparison). The window comparator 595 outputs the comparison result signal to the latch circuit 594. During the checking mode of operation, the latch circuit 594 samples and holds the comparison result signal and outputs the held comparison result signal to the diagnosis control circuit 540A. The diagnosis control signal 540A generates a diagnosis control signal in response to the comparison result signal fed from the latch circuit 594. The diagnosis control circuit 540A outputs the diagnosis control signal to the output circuit 536.

Sixteenth Embodiment

Figure 14:
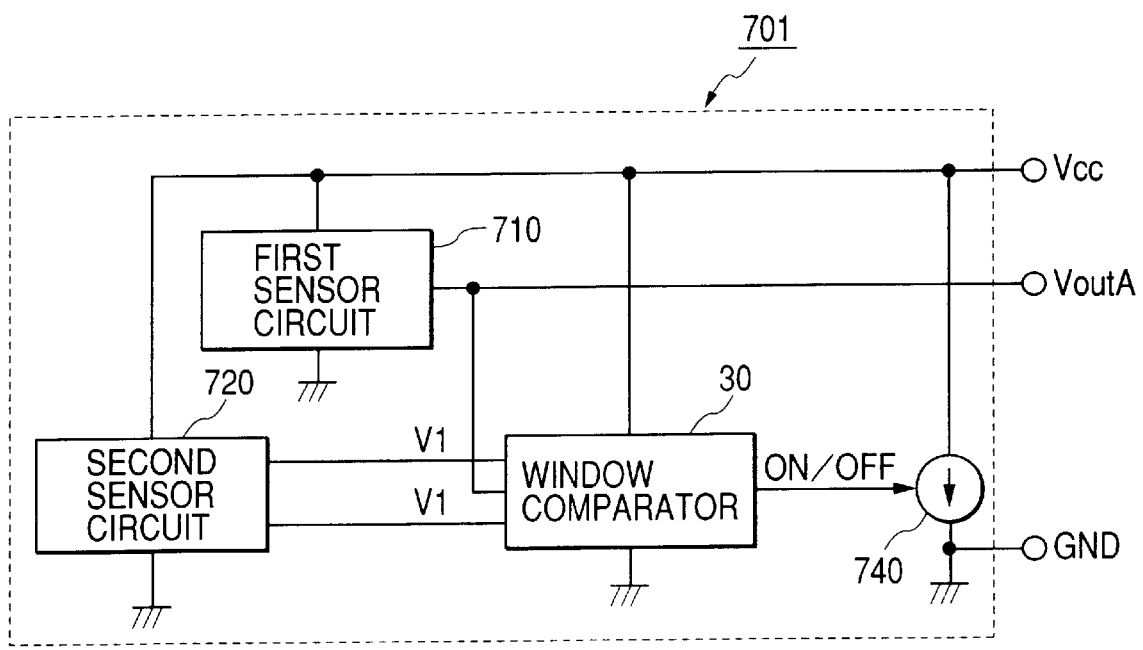
FIG. 14 is a block diagram of a pressure sensor according to a sixteenth embodiment of this invention.

FIG. 14 shows a pressure sensor 701 according to a sixteenth embodiment of this invention. The pressure sensor 701 of FIG. 14 includes a first sensor circuit 710, a second sensor circuit 720, a window comparator 730, and a current control circuit 740. As will be made clear later, the second sensor circuit 720 acts as a reference-signal generation circuit.

The first sensor circuit 710 is connected to the window comparator 730. The second sensor circuit 720 is connected to the window comparator 730. The window comparator 730 is connected to the current control circuit 740. The first sensor circuit 710 has a positive power supply terminal connected to a positive power feed line subjected to a constant power supply voltage Vcc. The first sensor circuit 710 has a negative power supply terminal which is grounded. The first sensor circuit 710 is activated by power supplied along the positive power feed line. The second sensor circuit 720 has a positive power supply terminal connected to the positive power feed line subjected to the constant power supply voltage Vcc. The second sensor circuit 720 has a negative power supply terminal which is grounded. The second sensor circuit 720 is activated by power supplied along the positive power feed line. The window comparator 730 has a positive power supply terminal connected to the positive power feed line subjected to the constant power supply voltage Vcc. The window comparator 730 has a negative power supply terminal which is grounded. The window comparator 730 is activated by power supplied along the positive power feed line. A first end of the current control circuit 740 is connected to the positive power feed line subjected to the constant power supply voltage Vcc. A second end of the current control circuit 740 is grounded. The second end of the current control circuit 740 is connected to a ground terminal GND. The current control circuit 740 has a control terminal connected to the window comparator 730. A current flowing from the positive power feed line to the ground through the current control circuit 740 is determined by a signal applied to the control terminal thereof.

The first sensor circuit 710 has a sensing portion for detecting a pressure. The first sensor circuit 710 generates and outputs a signal voltage VoutA representing the detected pressure. The first sensor circuit 710 applies the signal voltage VoutA to the window comparator 730. The second sensor circuit 720 produces an upper-limit reference voltage V1 and a lower-limit reference voltage V2. The second sensor circuit 720 outputs the upper-limit reference voltage V1 and the lower-limit reference voltage V2 to the window comparator 730. The device 730 compares the signal voltage VoutA with the upper-limit reference voltage V1 and the lower-limit reference voltage V2. The upper-limit reference voltage V1 and the lower-limit reference voltage V2 define, therebetween, a normal range for the signal voltage VoutA. The window comparator 730 determines whether or not the signal voltage VoutA is in the normal range. The window comparator 730 generates a binary signal representing the result of the determination (the result of the comparison). The window comparator 730 outputs the comparison result signal to the control terminal of the current control circuit 740 as a diagnosis control signal. Thus, the current flowing through the current control circuit 740 depends on the diagnosis control signal.

Figure 15:
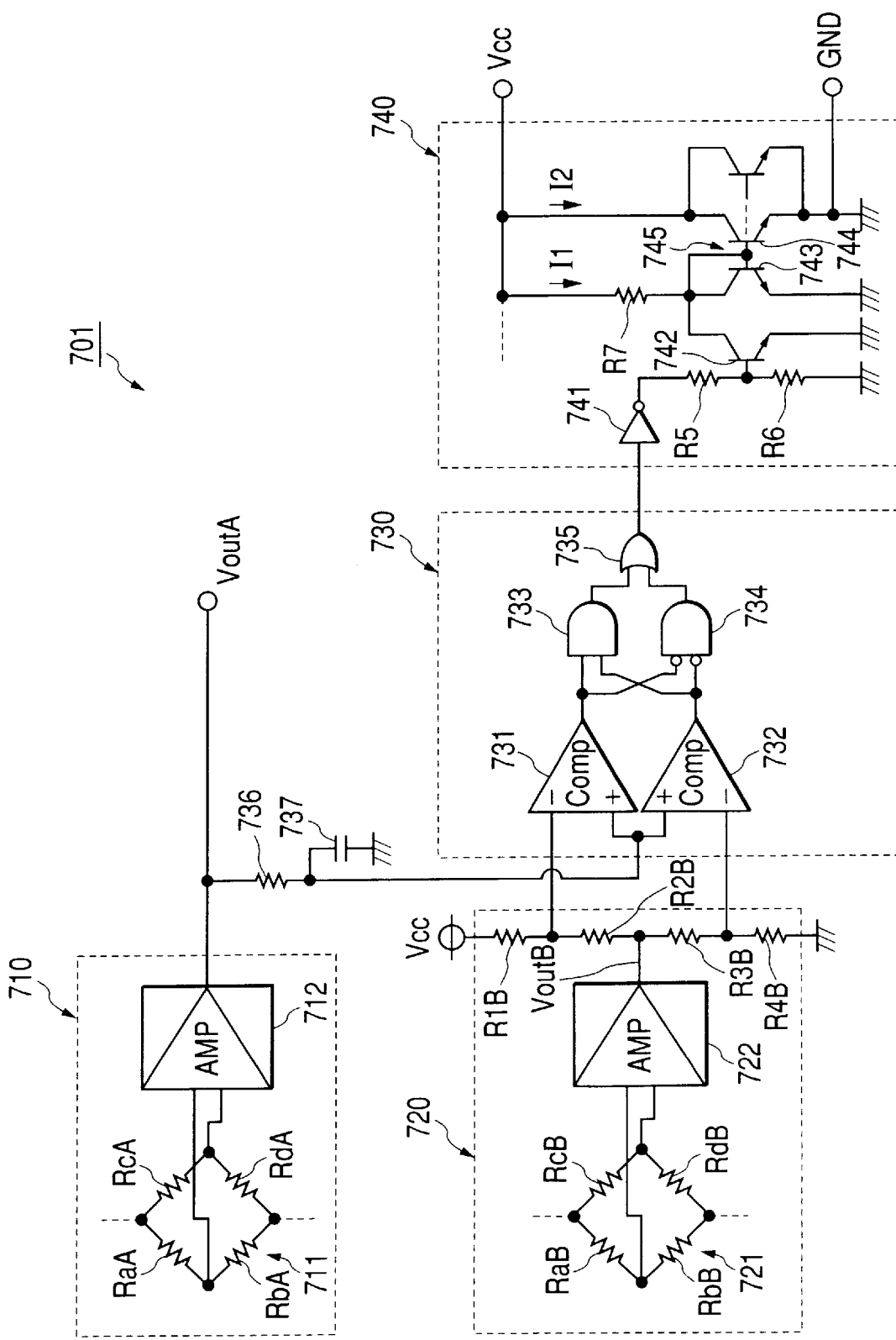
FIG. 15 is a diagram of the pressure sensor in FIG. 14.

As shown in FIG. 15, the first sensor circuit 710 includes a first sensing portion 711 and an amplifier 712. The first sensing portion 711 has a Wheatstone bridge circuit composed of gauge resistors RaA, RbA, RcA, and RdA responsive to a pressure to be detected. The Wheatstone bridge circuit is connected to the amplifier 712. The amplifier 712 receives an output signal of the Wheatstone bridge circuit. The device 712 amplifies the output signal of the Wheatstone bridge circuit. The amplifier 712 outputs the amplification-resultant signal as the signal voltage VoutA. The amplifier 712 implements zero-point adjustment, sensitivity temperature compensation, and zero-point temperature compensation regarding the output signal of the Wheatstone bridge circuit.

The second sensor circuit 720 includes a second sensing portion 721 and an amplifier 722. The second sensing portion 721 has a Wheatstone bridge circuit composed of gauge resistors RaB, RbB, RcB, and RdB. The Wheatstone bridge circuit is connected to the amplifier 722. The amplifier 722 receives an output signal of the Wheatstone bridge circuit. The device 722 amplifies the output signal of the Wheatstone bridge circuit. The amplifier 722 outputs the amplification-resultant signal as a signal voltage VoutB. The second sensing portion 721 and the amplifier 722 are similar in structure to the first sensing portion 711 and the amplifier 712 respectively. The second sensing portion 721 and the amplifier 722 may differ in structure from the first sensing portion 711 and the amplifier 712 respectively.

The second sensor circuit 720 further includes resistors R1B, R2B, R3B, and R4B which are connected in series in that order. One end of the series combination of the resistors R1B, R2B, R3B, and R4B, which is close to the resistor R1B, is connected to the positive power feed line subjected to the constant power supply voltage Vcc. The other end of the series combination of the resistors R1B, R2B, R3B, and R4B is grounded. The junction between the resistors R2B and R3B is connected to the output terminal of the amplifier 722. Thus, the junction between the resistors R2B and R3B is subjected to the signal voltage VoutB. The upper-limit reference voltage V1 appears at the junction between the resistors R1B and R2B. The lower-limit reference voltage V2 appears at the junction between the resistors R3B and R4B. The upper-limit reference voltage V1 and the lower-limit reference voltage V2 depend on the signal voltage VoutB. Preferably, the upper-limit reference voltage V1 and the lower-limit reference voltage V2 follow the signal voltage VoutA. The resistances of the resistors R1B, R2B, R3B, and R4B are chosen so that the upper-limit reference voltage V1 will be higher than the signal voltage VoutA by a value $\Delta V$, and the lower-limit reference voltage V2 will be lower than the signal voltage VoutA by the value $\Delta V$. Preferably, the value ΔV is set to 5% of the width of the range in which the signal voltage VoutA varies. For example, the value ΔV is set to 0.2 V in the case where the signal voltage VoutA varies in the range of 0.5 V to 4.5 V and hence the width of the range is equal to 4 V. The value ΔV is given by the following equation.

$$R2B/(R1B+R2B)=R3B/(R3B+R4B)=2\cdot \Delta V/Vcc \quad (1)$$

The relation between the signal voltages VoutA and VoutB which occurs at this time is expressed by the following equation.

$$VoutB=(1+R2B/R1B)\cdot VoutA-(Vcc/2)/(R2B/R1B) \quad (2)$$

Thus, the signal voltages VoutA and VoutB differ from each other.

The signal voltage VoutB is a base for generating the upper-limit reference voltage V1 and the lower-limit reference voltage V2. The upper-limit reference voltage V1 and the lower-limit reference voltage V2 are given as follows.

$$V1=(Vcc-VoutB)\cdot R1B/(R1B+R2B) \quad (3)$$

$$V2=VoutB\cdot R3B/(R3B+R4B) \quad (4)$$

Figure 16:
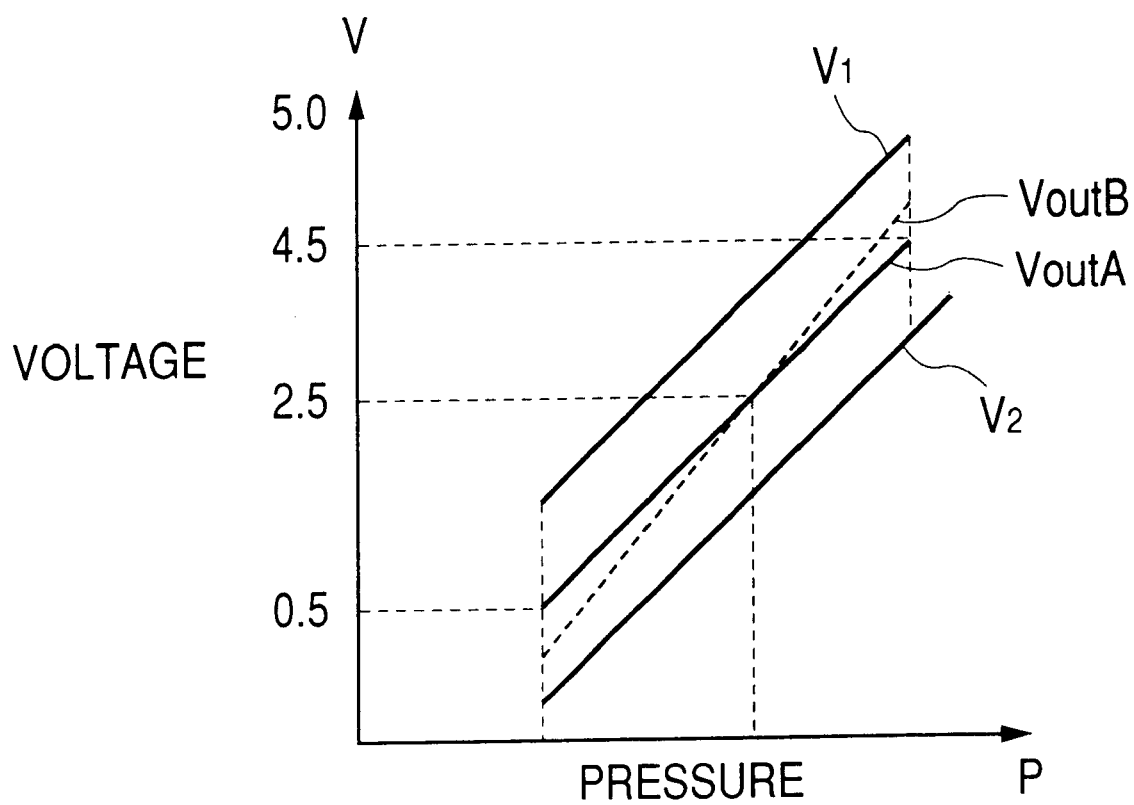
FIG. 16 is a diagram of the relations of voltages with pressure which occur in the pressure sensor in FIGS. 14 and 15.

The signal voltage VoutB increases as the applied pressure rises. Therefore, as shown in FIG. 16, the difference between the signal voltage VoutB and the upper-limit reference voltage V1 is relatively great and the difference between the signal voltage VoutB and the lower-limit reference voltage V2 is relatively small when the applied pressure is low. On the other hand, the difference between the signal voltage VoutB and the upper-limit reference voltage V1 is relatively small and the difference between the signal voltage VoutB and the lower-limit reference voltage V2 is relatively great when the applied pressure is high.

Preferably, the relation between the signal voltage VoutB and the applied pressure is different from that between the signal voltage VoutA and the applied pressure. The upper-limit reference voltage V1 and the lower-limit reference voltage V2 are approximately equal to the signal voltage VoutA in sensitivity for pressure. As shown in FIG. 16, the characteristic lines of the upper-limit reference voltage V1 and the lower-limit reference voltage V2 are parallel to that of the signal voltage VoutA. Preferably, the signal voltage VoutB is higher in sensitivity than the signal voltage VoutA.

With reference back to FIG. 15, the window comparator 730 includes a first comparator 731, a second comparator 732, a first AND circuit 733, a second AND circuit 734, and an OR circuit 735. The inverting input terminal of the first comparator 731 is connected to the junction between the resistors R1B and R2B in the second sensor circuit 720. The non-inverting input terminal of the first comparator 731 is connected via a resistor 736 to the output terminal of the amplifier 712 in the first sensor circuit 710. The inverting input terminal of the second comparator 732 is connected to the junction between the resistors R3B and R4B in the second sensor circuit 720. The non-inverting input terminal of the second comparator 732 is connected via the resistor 736 to the output terminal of the amplifier 712 in the first sensor circuit 710. One end of a capacitor 737 is connected to the junction among the resistor 736, the non-inverting input terminal of the first comparator 731, and the non-inverting input terminal of the second comparator 732. The other end of the capacitor 737 is grounded. The output terminal of the first comparator 731 is connected to a first input terminal of the first AND circuit 733. The output terminal of the first comparator 731 is connected via an inverter to a first input terminal of the second AND circuit 734. The output terminal of the second comparator 732 is connected to a second input terminal of the first AND circuit 733. The output terminal of the second comparator 732 is connected via an inverter to a second input terminal of the second AND circuit 734. The output terminal of the first AND circuit 733 is connected to a first input terminal of the OR circuit 735. The output terminal of the second AND circuit 734 is connected to a second input terminal of the OR circuit 735. The output terminal of the OR circuit 735 is connected to the current control circuit 740.

The window comparator 730 operates as follows. The first comparator 731 receives the signal voltage VoutA from the first sensor circuit 710. The first comparator 731 receives the upper-limit reference voltage V1 from the second sensor circuit 720. The device 731 compares the signal voltage VoutA and the upper-limit reference voltage V1 with each other, and outputs a signal representing the result of the comparison. The second comparator 732 receives the signal voltage VoutA from the first sensor circuit 710. The second comparator 732 receives the lower-limit reference voltage V2 from the second sensor circuit 720. The device 732 compares the signal voltage VoutA and the lower-limit reference voltage V2 with each other, and outputs a signal representing the result of the comparison. The first AND circuit 733 receives the comparison result signals from the first and second comparators 731 and 732. The first AND circuit 733 executes AND operation between the comparison result signals, and outputs a signal representing the result of the AND operation. The second AND circuit 734 receives an inversion of the comparison result signal outputted by the first comparator 731. The second AND circuit 734 receives an inversion of the comparison result signal outputted by the second comparator 732. The second AND circuit 734 executes AND operation between the inversions of the comparison result signals, and outputs a signal representing the result of the AND operation. The OR circuit 735 receives the AND-operation result signals from the first and second AND circuits 733 and 734. The OR circuit 735 executes OR operation between the AND-operation result signals, and outputs a signal representing the result of the OR operation. The OR-operation result signal outputted from the OR circuit 735 is fed to the current control circuit 740 as the diagnosis control signal. The diagnosis control signal outputted from the window comparator 730 to the current control circuit 740 is in a low level state when the signal voltage VoutA is in the normal range, that is, the range between the upper-limit reference voltage V1 and the lower-limit reference voltage V2. The diagnosis control signal is in a high level state when the signal voltage VoutA is outside the normal range. The resistor 736 and the capacitor 737, which are provided between the first sensor circuit 710 and the window comparator 730, compose a low pass filter for removing noise from the signal voltage VoutA.

The current control circuit 740 is connected to the positive power feed line subjected to the constant power supply voltage Vcc. Also, the current control circuit 740 is connected to the ground terminal GND. The current control circuit 740 includes a NOT circuit 741, transistors 742, 743, and 744, and resistors R5, R6, and R7. The transistor 744 has a parallel combination of "n" sub-transistors each being equivalent to the transistor 743, where "n" denotes a predetermined natural number equal to or greater than 2. The transistors 743 and 744 compose a current mirror circuit 745.

The input terminal of the NOT circuit 741 is connected to the output terminal of the OR circuit 735 in the window comparator 730. The resistors R5 and R6 are connected in series. One end of the series combination of the resistors R5 and R6 is connected to the output terminal of the NOT circuit 741. The other end of the series combination of the resistors R5 and R6 is grounded. The base of the transistor 742 is connected to the junction between the resistors R5 and R6. The collector of the transistor 742 is connected via the resistor R7 to the positive power feed line subjected to the constant power supply voltage Vcc. The emitter of the transistor 742 is grounded. The collector of the transistor 743 is connected to the junction between the resistor R7 and the collector of the transistor 742. The bases of the transistors 743 and 744 are connected to each other. The junction between the bases of the transistors 743 and 744 is connected to the junction among the resistor R7, the collector of the transistor 742, and the collector of the transistor 743. The emitters of the transistors 743 and 744 are grounded. The emitter of the transistor 744 is connected to the ground terminal GND. The collector of the transistor 744 is connected to the positive power feed line subjected to the constant power supply voltage Vcc.

The NOT circuit 741 receives the diagnosis control signal from the window comparator 730. The NOT circuit 741 inverts the diagnosis control signal. The NOT circuit 741 applies the inversion-resultant signal to the series combination of the resistors R5 and R6. The series combination of the resistors R5 and R6 acts as a voltage divider for the inversion-resultant signal. The division-resultant signal, which appears at the junction between the resistors R5 and R6, is fed to the base of the transistor 742. The transistor 742 is driven in response to the division-resultant signal. The current mirror circuit 745 composed of the transistors 743 and 744 is controlled by the transistor 742. The transistor 741 corresponds to a first element while the transistors 743 and 744 correspond to a second element.

The pressure sensor 701 operates as follows. In the case where the signal voltage VoutA is in the normal range (that is, the range between the upper-limit reference voltage V1 and the lower-limit reference voltage V2), the diagnosis control signal outputted from the window comparator 730 to the current control circuit 740 is in its low level state. The NOT circuit 741 in the current control circuit 740 outputs a high level signal in response to the low-level diagnosis control signal. The high-level output signal from the NOT circuit 741 reaches the base of the transistor 742 via the resistor R5, causing the transistor 742 to be in an on state. When the transistor 42 is in its on state, the transistors 743 and 744 are in off states. Thus, in this case, the current flowing from the positive power feed line to the ground via the current control circuit 740, that is, the current consumed by the current control circuit 740, is equal to a current I1(normal) flowing via the resistor R7 and the transistor 742. The current Ii(normal) is given as follows.

$$I1(\text{normal}) = \{Vcc - V_{CE}(\text{sat})\}/R7 \approx Vcc/R7 \quad (5)$$

where $V_{CE}(\text{sat})$ denotes the collector-emitter voltage in the transistor 742, and R7 denotes the resistance of the resistor R7.

In the case where the signal voltage VoutA is outside the normal range (that is, the range between the upper-limit reference voltage V1 and the lower-limit reference voltage V2), the diagnosis control signal outputted from the window comparator 730 to the current control circuit 740 is in its high level state. The NOT circuit 741 in the current control circuit 740 outputs a low level signal in response to the high-level diagnosis control signal. The low-level output signal from the NOT circuit 741 reaches the base of the transistor 742 via the resistor R5, causing the transistor 42 to be in an off state. When the transistor 742 is in its off state, the transistors 743 and 744 are in on states. Thus, in this case, the current flowing from the positive power feed line to the ground via the current control circuit 740, that is, the current consumed by the current control circuit 740, is equal to the sum of a current I1(abnormal) flowing via the resistor R7 and the transistor 743 and a current I2 flowing via the transistor 744. The current I1(abnormal) is given as follows.

$$I1(\text{abnormal}) = (Vcc - V_{BE})/R7 \approx (Vcc - 0.7)/R7 \quad (6)$$

where $V_{BE}$ denotes the base-emitter voltage in the transistor 743. The current I2 is determined by the current mirror ratio in the current mirror circuit 745, and is given as follows.

$$I2 = n \cdot I1(\text{abnormal}) \quad (7)$$

where "n" denotes the number of the sub-transistors composing the transistor 744. Thus, the sum of the currents I1(abnormal) and I2 is expressed as follows.

$$I1(\text{abnormal}) + I2 = (n+1) \cdot I1(\text{abnormal}) \quad (8)$$

As understood from the equations (5) and (8), when the signal voltage VoutA moves out of the normal range, the current flowing through the current control circuit 740 increases by a value ΔI given as follows.

$$\Delta I = I1(\text{abnormal}) + I2 - I1(\text{normal}) \quad (9)$$
$$= (n+1) \cdot I1(\text{abnormal}) - I1(\text{normal})$$

Figure 17:
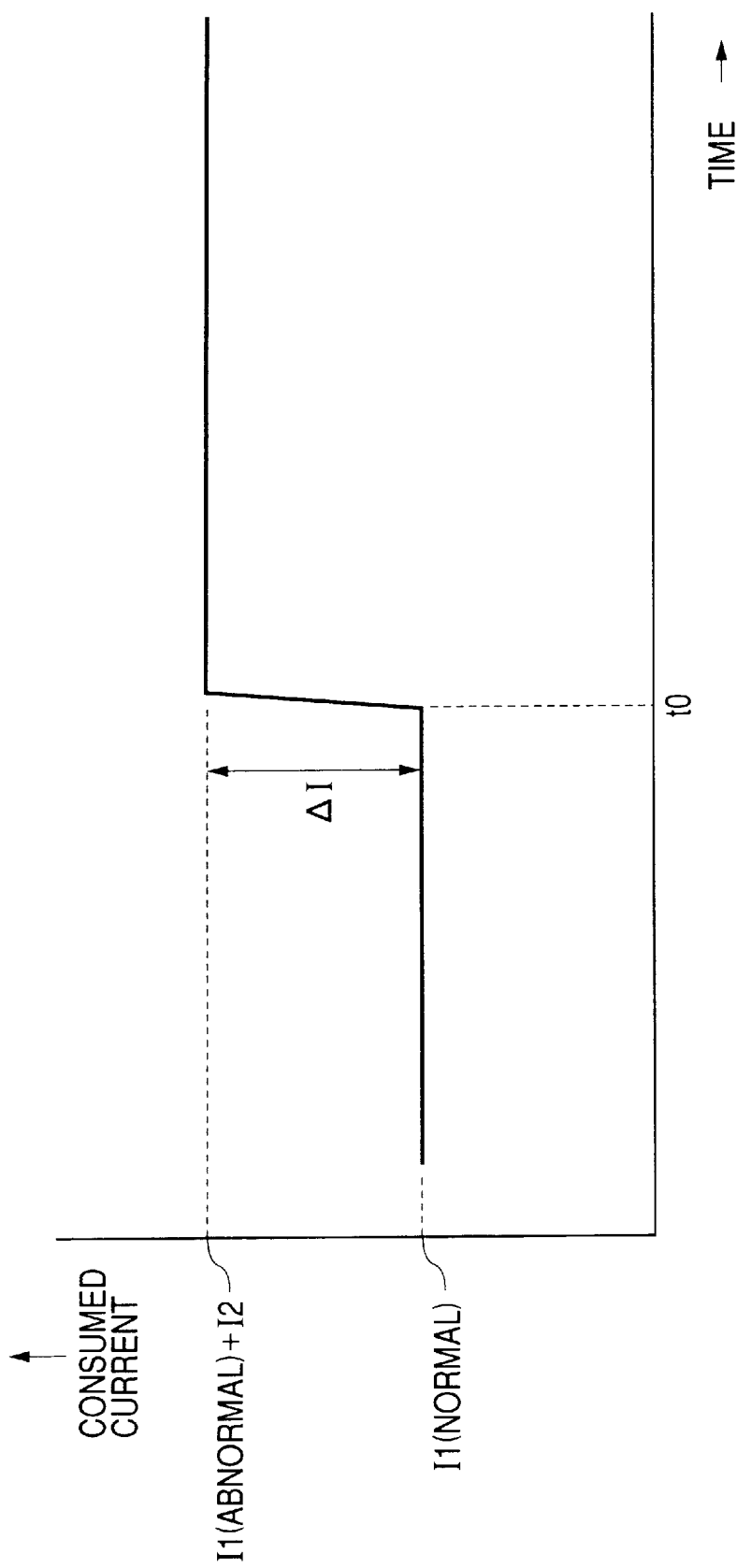
FIG. 17 is a time-domain diagram of a current consumed by a current control circuit in FIGS. 14 and 15.

With reference to FIG. 17, at a moment t0, there occurs a malfunction of the pressure sensor 701 so that the signal voltage VoutA moves out of the normal range. Thus, at the moment t0, the current consumed by the current control circuit 740 increases by the value ΔI equal to "I1(abnormal)+I2−I1(normal)". Accordingly, the malfunction of the pressure sensor 701 can be detected by sensing a variation in the current consumed by the current control circuit 740. The current consumed by the current control circuit 740 indicates whether the pressure sensor 701 is normal or wrong.

Figure 18:
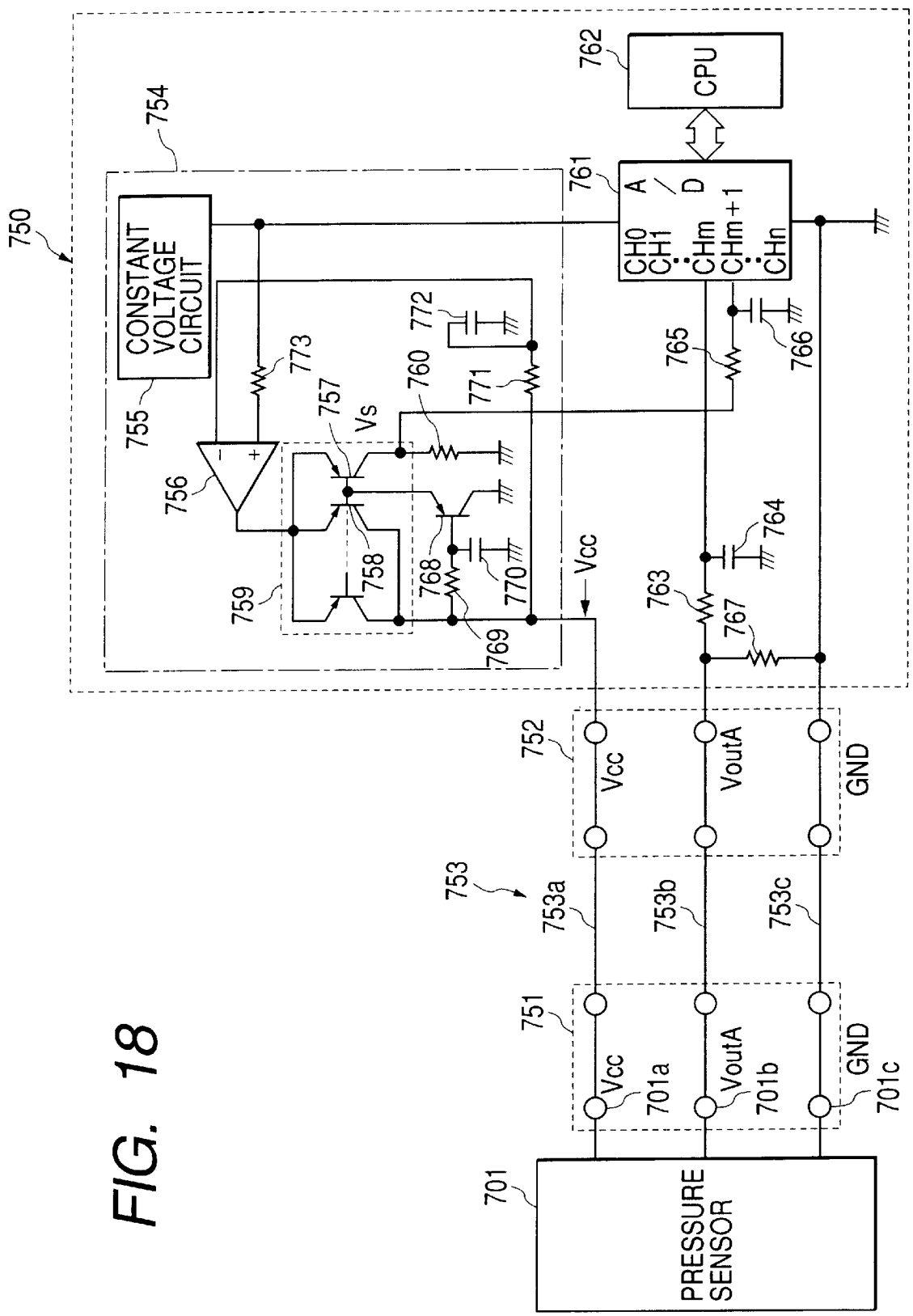
FIG. 18 is a diagram of an apparatus in the sixteenth embodiment of this invention which includes an ECU (electronic control circuit) and the pressure sensor in FIGS. 14 and 15.

As shown in FIG. 18, the pressure sensor 701 is connected to an electronic control unit (ECU) 750. The pressure sensor 701 is provided with terminals 701a, 701b, and 701c. The terminal 701a is connected to the positive power feed line subjected to the constant power supply voltage Vcc. The signal voltage VoutA is transmitted via the terminal 701b. The terminal 701c is grounded. The terminals 701a, 701b, and 701c are connected to the ECU 750 via connectors 751 and 752 and a wire harness 753. The wire harness 753 includes wires 753a, 753b, and 753c leading from the terminals 701a, 701b, and 701c respectively.

The ECU 750 includes a power supply circuit 754 for generating the constant power supply voltage Vcc. The power supply circuit 754 has a constant-voltage circuit 755, an operational amplifier 756, transistors 757 and 758, a resistor 760, a transistor 768, a resistor 769, a capacitor 770, a resistor 771, a capacitor 772, and a resistor 773. The transistors 757 and 758 compose a current mirror circuit 759. The transistor 758 has a parallel combination of multiple sub-transistors.

The non-inverting input terminal of the operational amplifier 756 is connected via the resistor 773 to the positive output terminal of the constant-voltage circuit 755. The negative output terminal of the constant-voltage circuit 755 is grounded. The inverting input terminal of the operational amplifier 756 is connected via the resistor 771 to the positive output line extending from the power supply circuit 754, that is, the positive power feed line subjected to the constant power supply voltage Vcc. One end of the capacitor 772 is connected to the junction between the resistor 771 and the inverting input terminal of the operational amplifier 756. The other end of the capacitor 772 is grounded. The resistor 771 and the capacitor 772 compose a noise-removing low pass filter. The output terminal of the operational amplifier 756 is connected to the emitters of the transistors 757 and 758. The bases of the transistors 757 and 758 are connected to each other. The junction between the bases of the transistors 757 and 758 is connected to the emitter of the transistor 768. The collector of the transistor 757 is connected to one end of the resistor 760. The other end of the resistor 760 is grounded. The resistor 760 serves to sense a current flowing through the transistor 757. The resistor 760 is of a type having a resistance, the temperature coefficient (TCR) of which is approximately equal to zero. The collector of the transistor 768 is grounded. The base of the transistor 768 is connected via the resistor 769 to the positive output line extending from the power supply circuit 754, that is, the positive power feed line subjected to the constant power supply voltage Vcc. One end of the capacitor 770 is connected to the junction between the resistor 769 and the base of the transistor 768. The other end of the capacitor 770 is grounded. The resistor 769 and the capacitor 770 compose a noise-removing low pass filter.

The current consumed by the pressure sensor 701 is equal to the current flowing through the transistor 758. Thus, a change in the current consumed by the pressure sensor 701 causes a variation in the current flowing through the transistor 758. As the current flowing through the transistor 758 varies, the current flowing through the transistor 757 and the resistor 760 changes and also the voltage Vs at the junction between the resistor 760 and the collector of the transistor 757 changes. Accordingly, the voltage Vs depends on the current consumed by the pressure sensor 701. As previously mentioned, the current consumed by the pressure sensor 701 indicates whether the pressure sensor 701 is normal or wrong. Thus, the voltage Vs depends on whether the pressure sensor 701 is normal or wrong.

The ECU 750 includes an A/D (analog-to-digital) converter 761, and a CPU 762. The CPU 762 is connected to the A/D converter 761. The CPU 762 receives digitized information (digitized signals) from the A/D converter 761. The A/D converter 761 has a positive power supply terminal connected to the positive output terminal of the constant-voltage circuit 755. The A/D converter 761 has a negative power supply terminal which is grounded. The A/D converter 761 is activated by power fed from the constant-voltage circuit 755. The A/D converter 761 has a plurality of channels CH0, CH1, ..., CHm, CHm+1, ..., and CHn. The signal voltage VoutA is inputted into the channel CHm of the A/D converter 761 via a low pass filter composed of a resistor 763 and a capacitor 764. Specifically, a first end of the resistor 763 is connected to the terminal 701b of the pressure sensor 701 at which the signal voltage VoutA appears. A second end of the resistor 763 is connected to the channel CHm of the A/D converter 761. One end of the capacitor 764 is connected to the junction between the resistor 763 and the channel CHm of the A/D converter 761. The other end of the capacitor 764 is grounded. The channel CHm of the A/D converter 761 generates digitized information of the signal voltage VoutA, and feeds the digitized information to the CPU 762. The voltage Vs which appears in the power supply circuit 754 is inputted into the channel CHm+1 of the A/D converter 761 via a low pass filter composed of a resistor 765 and a capacitor 766. Specifically, a first end of the resistor 765 is connected to the junction between the resistor 760 and the collector of the transistor 757 in the power supply circuit 754. A second end of the resistor 765 is connected to the channel CHm+1 of the A/D converter 761. One end of the capacitor 766 is connected to the junction between the resistor 765 and the channel CHm+1 of the A/D converter 761. The other end of the capacitor 766 is grounded. The channel CHm+1 of the A/D converter 761 generates digitized information of the voltage Vs, and feeds the digitized information to the CPU 762. Accordingly, the digitized information of the voltage Vs which indicates whether the pressure sensor 701 is normal or wrong is notified to the CPU 762 via the A/D converter channel CHm+1 different from the A/D converter channel CHm for the signal voltage VoutA.

The ECU 750 includes a pull-down resistor 767. One end of the pull-down resistor 767 is connected to the first end of the resistor 763 and the terminal 701b of the pressure sensor 701. The other end of the pull-down resistor 767 is connected to a line which is grounded, and which is connected to the terminal 701c of the pressure sensor 701. When the wire 753b breaks, the pulldown resistor 767 causes the ground potential (the zero voltage) to be applied to the channel CHm of the A/D converter 761. The resistance of the pull-down resistor 767 is chosen so that the signal voltage VoutA applied to the channel CHm+1 of the A/D converter 761 is increased to a level equal to or higher than 4.7 V when the wire 753c breaks.

The information of the voltage Vs, that is, the information of the current consumed by the pressure sensor 701, is transmitted to the CPU 762 via the A/D converter 761. The CPU 762 is programmed to implement the following steps of operation. The CPU 762 compares the value of the voltage Vs with a predetermined threshold value corresponding to a predetermined threshold voltage. The CPU 762 determines whether the pressure sensor 701 is normal or wrong in response to the result of the comparison.

Seventeenth Embodiment

Figure 19:
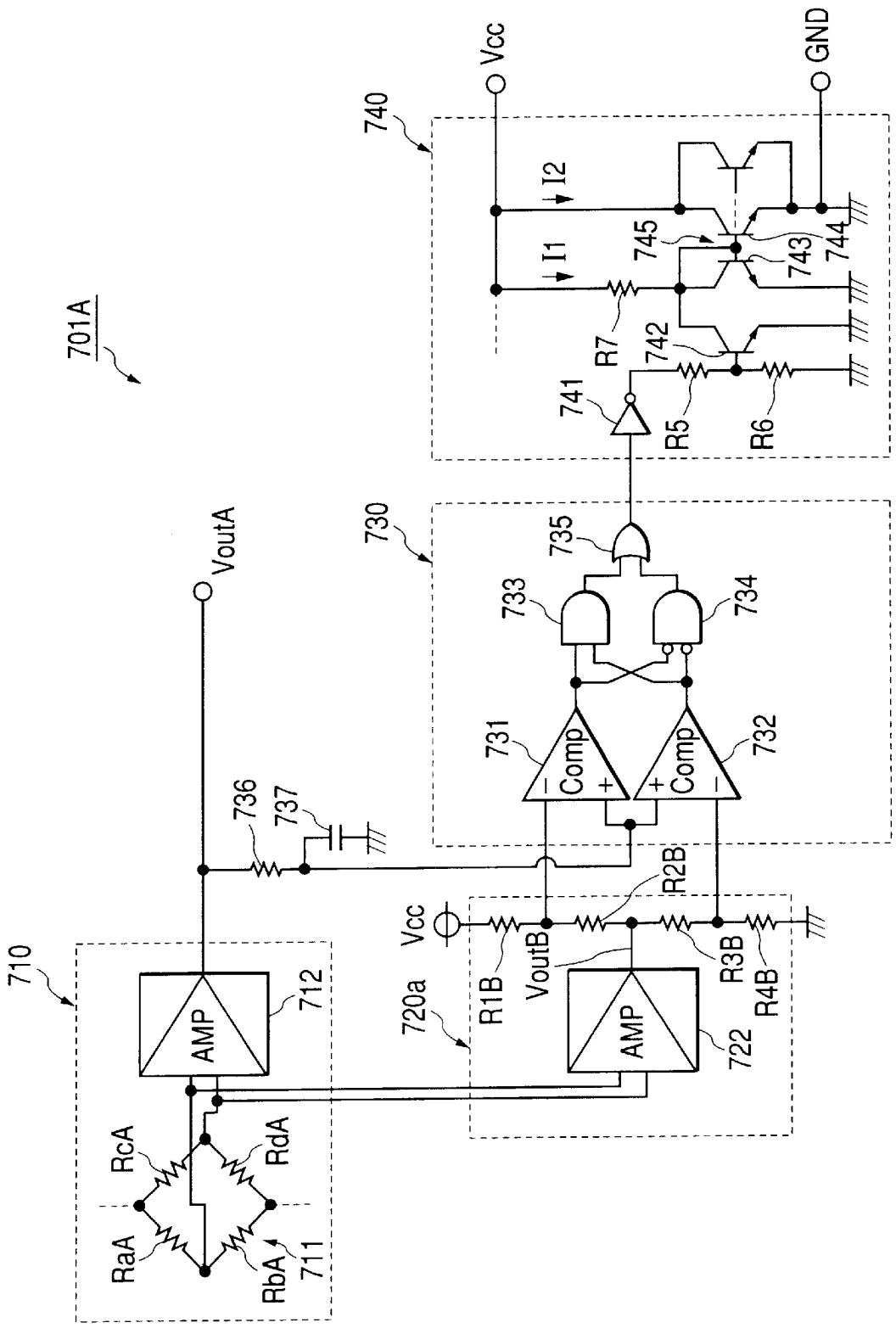
FIG. 19 is a diagram of a pressure sensor according to a seventeenth embodiment of this invention.

FIG. 19 shows a pressure sensor 701A according to a seventeenth embodiment of this invention. The pressure sensor 701A of FIG. 19 is similar to the pressure sensor 701 of FIGS. 14 and 15 except for a design change mentioned hereinafter.

The pressure sensor 701A of FIG. 19 includes a second sensor circuit 720A instead of the second sensor circuit 720 (see FIGS. 14 and 15). The second sensor circuit 720A is modified from the second sensor circuit 720.

The amplifier 722 in the second sensor circuit 720A is connected to the Wheatstone bridge circuit in the first sensor circuit 710. The amplifier 722 receives the output signal of the Wheatstone bridge circuit in the first sensor circuit 710. The device 722 amplifies the output signal of the Wheatstone bridge circuit. The amplifier 722 outputs the amplification-resultant signal as the signal voltage VoutB.

In the pressure sensor 701A of FIG. 19, the diagnosis control signal outputted from the window comparator 730 indicates whether the amplifier 712 in the first sensor circuit 710 is normal or wrong.

Eighteenth Embodiment

According to an eighteenth embodiment of this invention, the pressure sensor in one of the sixteenth and seventeenth embodiments of this invention is modified so as to detect an acceleration or another physical quantity different from a pressure.

What is claimed is:

1. A physical-quantity detection sensor comprising:
   a sensor portion (10) for generating and outputting a voltage depending on a physical quantity;
   a signal processing circuit (4) for processing the voltage outputted from the sensor portion (10) to generate and output a voltage depending on the voltage outputted from the sensor portion (10) during a physical-quantity sensing mode of operation;
   means for inputting a reference voltage into the signal processing circuit (4) during a checking mode of operation which differs from the physical-quantity sensing mode of operation, the reference voltage being different from the voltage outputted from the sensor portion (10); and
   means for, during the checking mode of operation, detecting a malfunction of the signal processing circuit (4) on the basis of an output signal from the signal processing circuit (4) which responds to the reference voltage inputted thereinto.

2. A physical-quantity detection sensor comprising:
   a sensor portion (10) for generating and outputting a voltage depending on a physical quantity;
   a signal processing circuit (4);
   a checking signal generation portion (20) for outputting a reference voltage for check;
   means for, during a physical-quantity sensing mode of operation, inputting the voltage outputted from the sensor portion (10) into the signal processing circuit (4) to implement detection of the physical quantity;
   means for, during a checking mode of operation which differs from the physical-quantity sensing mode of operation, inputting the reference voltage into the signal processing circuit (4) from the checking signal generation portion (20); and
   means for, during the checking mode of operation, detecting a malfunction of the signal processing circuit (4) on the basis of an output signal from the signal processing circuit (4) which responds to the reference voltage inputted thereinto.

3. A physical-quantity detection sensor comprising:
   a sensor portion (10) for generating and outputting a voltage depending on a physical quantity;
   a signal processing circuit (4);
   a checking signal generation portion (20) for outputting a reference voltage for check;
   means for, during a physical-quantity sensing mode of operation, selecting the voltage outputted from the sensor portion (10) and inputting the selected voltage into the signal processing circuit (4); and
   means for, during a checking mode of operation which differs from the physical-quantity sensing mode of operation, selecting the reference voltage outputted from the checking signal generation portion (20) and inputting the reference voltage into the signal processing circuit (4).

4. A physical-quantity detection sensor as recited in claim 2, wherein the checking signal generation portion (20) comprises a Wheatstone bridge circuit including a tetragonal closed circuit having a series combination of resistors, and means for outputting a difference between voltages at opposite junctions in the Wheatstone bridge circuit as the reference voltage.

5. A physical-quantity detection sensor as recited in claim 4, wherein the checking signal generation portion (20) comprises a constant-current circuit (21) for controlling a current in the Wheatstone bridge circuit.

6. A physical-quantity detection sensor as recited in claim 5, further comprising a memory (22) storing data related to a current, and means for controlling the constant-current circuit (21) in response to the data stored in the memory (22).

7. A physical-quantity detection sensor as recited in claim 2, wherein the checking signal generation portion (20) comprises a D/A conversion circuit of an R-2R ladder structure.

8. A physical-quantity detection sensor as recited in claim 2, further comprising an analog multiplexer for inputting the voltage outputted from the sensor portion (10) into the signal processing circuit (4) during the physical-quantity sensing mode of operation, and for inputting the reference voltage into the signal processing circuit (4) from the checking signal generation portion (20) during the checking mode of operation.

9. A physical-quantity detection sensor as recited in claim 1, wherein the signal processing circuit (4) comprises means for amplifying the voltage outputted from the sensor portion (10), and means for compensating for an offset and an offset-temperature-characteristic of the sensor portion (10).

10. A physical-quantity detection sensor as recited in claim 9, further comprising comparing means (33) for, during the checking mode of operation, comparing the output signal from the signal processing circuit (4) with a predetermined reference signal, and means for, during the checking mode of operation, detecting a malfunction of the signal processing circuit (4) on the basis of a result of the comparing by the comparing means.

11. A physical-quantity detection sensor as recited in claim 10, further comprising means (34) for generating an output voltage which depends on whether or not a malfunction of the signal processing circuit (4) is detected on the basis of the result of the comparing by the comparing means (33).

12. A physical-quantity detection sensor as recited in claim 1, further comprising a diagnosis command signal generating portion for outputting a diagnosis command signal which provides change between the physical-quantity sensing mode of operation and the checking mode of operation.

13. A physical-quantity detection sensor as recited in claim 12, wherein the diagnosis command signal generating portion comprises:
   a load (352) subjected to a prescribed power supply voltage;
   a transistor (351) connected in series with the load;
   first and second resistors (R1, R2) for generating a voltage which controls the transistor; and
   means for outputting a voltage at a junction between the load and the transistor as the diagnosis command signal.

14. A physical-quantity detection sensor as recited in claim 1, further comprising a first memory for storing corrective data for the signal processing circuit and corrective data for the sensor portion, a second memory for storing corrective data for the signal processing circuit, and means provided in the signal processing circuit for using the corrective data stored in the second memory during the checking mode of operation.

15. A physical-quantity detection sensor as recited in claim 14, further comprising a chip on which the signal processing circuit and the sensor portion are formed.

16. A Physical-quantity detection sensor as recited in claim 1, further comprising a memory for storing corrective data for the signal processing circuit, and means provided in the signal processing circuit for using the corrective data stored in the memory during the physical-quantity sensing mode of operation and the checking mode of operation.

17. A physical-quantity detection sensor as recited in claim 16, further comprising a first chip on which the sensor portion is formed, a second chip on which the signal processing circuit is formed, the second chip differing from the first chip, the memory being formed on the second chip.

18. A physical-quantity detection sensor as recited in claim 1, further comprising an output circuit (34) for generating a voltage signal in response to the output signal from the signal processing circuit (4), a comparator (33) for comparing the voltage signal generated by the output circuit (34) with a predetermined reference signal to detect a malfunction of the signal processing circuit (4) during the checking mode of operation, and means for controlling the output circuit (34) in response to a result of the comparing by the comparator (33) to cause the output circuit (34) to generate an output voltage which depends on whether or not a malfunction of the signal processing circuit (4) is detected.

19. A physical-quantity detection sensor as recited in claim 1, further comprising a comparator (33) for comparing the output signal from the signal processing circuit (4) with a predetermined reference signal to detect a malfunction of the signal processing circuit (4) during the checking mode of operation, and outputting a signal representing whether or not a malfunction of the signal processing circuit (4) is detected during the checking mode of operation.

20. A physical-quantity detection sensor comprising:
 a sensor portion (10) for generating and outputting a voltage depending on a physical quantity;
 a signal processing circuit (4);
 a checking signal generation portion (20) including a bridge circuit for outputting a reference voltage for check which is insensitive to the physical quantity;
 means for, during a physical-quantity sensing mode of operation, inputting the voltage outputted from the sensor portion (10) into the signal processing circuit (4) to implement detection of the physical quantity;
 means for, during a checking mode of operation which differs from the physical-quantity sensing mode of operation, inputting the reference voltage into the signal processing circuit (4) from the checking signal generation portion (20); and
 a system control circuit for, during the checking mode of operation, detecting a malfunction of the signal processing circuit (4) on the basis of an output signal from the signal processing circuit (4) which responds to the reference voltage inputted thereinto.

21. A physical-quantity detection sensor comprising:
 a sensor portion (510) for generating and outputting a voltage depending on a physical quantity;
 a checking signal generation portion (520) for outputting a reference voltage for check;
 a signal processing circuit (504, 533);
 means for, during a physical-quantity sensing mode of operation, selecting the voltage outputted from the sensor portion and inputting the selected voltage into the signal processing circuit;
 means for, during a checking mode of operation after the physical-quantity sensing mode of operation, selecting the reference voltage outputted from the checking signal generation portion and inputting the reference voltage into the signal processing circuit; and
 means (534) for continuously outputting a sensor output signal during the checking mode of operation, the sensor output signal being an output signal from the signal processing circuit occurring at a moment in the physical-quantity sensing mode of operation which immediately precedes the checking mode of operation.

22. A physical-quantity detection sensor as recited in claim 21, wherein the continuously outputting means comprises means (534) for latching an output signal from the signal processing circuit at a moment in the physical-quantity sensing mode of operation which immediately precedes the checking mode of operation, and continuously outputting the latched signal as the sensor output signal during the checking mode of operation.

23. A physical-quantity detection sensor as recited in claim 22, wherein the checking signal generation portion comprises a Wheatstone bridge circuit including a tetragonal closed circuit having a series combination of resistors (523, 524, 525, 526), and means for outputting a difference between voltages at opposite junctions (529, 530) in the Wheatstone bridge circuit as the reference voltage.

24. A physical-quantity detection sensor as recited in claim 23, wherein the checking signal generation portion comprises a constant-current circuit (521) for controlling a current in the Wheatstone bridge circuit.

25. A physical-quantity detection sensor as recited in claim 24, further comprising a memory (522) storing data related to a current, and means for controlling the constant-current circuit (521) in response to the data stored in the memory (522).

26. A physical-quantity detection sensor as recited in claim 22, wherein the checking signal generation portion comprises a D/A conversion circuit of an R-2R ladder structure.

27. A physical-quantity detection sensor as recited in claim 22, further comprising an analog multiplexer (503) for inputting the voltage outputted from the sensor portion into the signal processing circuit during the physical-quantity sensing mode of operation, and for inputting the reference voltage into the signal processing circuit from the checking signal generation portion during the checking mode of operation.

28. A physical-quantity detection sensor comprising:
 a sensor portion (510) for generating and outputting a voltage depending on a physical quantity;
 a checking signal generation portion (520) for outputting a reference voltage for check;
 a signal processing circuit (504, 533);
 means for, during a physical-quantity sensing mode of operation, inputting the voltage outputted from the sensor portion into the signal processing circuit;
 means for, during a checking mode of operation after the physical-quantity sensing mode of operation, inputting the reference voltage into the signal processing circuit from the checking signal generation portion;
 means for, during the checking mode of operation, detecting a malfunction of the signal processing circuit on the basis of an output signal from the signal processing circuit which responds to the reference voltage inputted thereinto; and
 means (534) for latching the output signal from the signal processing circuit at a moment in the physical-quantity sensing mode of operation which immediately precedes the checking mode of operation, and continuously outputting the latched signal during the checking mode of operation.

29. A physical-quantity detection sensor as recited in claim 28, wherein the signal processing circuit comprises an amplifier (504) for amplifying the voltage outputted from the sensor portion, and an A/D converter (533) for converting an output signal of the amplifier into a corresponding digital signal, and the latching means comprises means for latching the digital signal generated by the A/D converter at a moment in the physical-quantity sensing mode of operation which immediately precedes the checking mode of operation, and continuously outputting the latched digital signal during the checking mode of operation.

30. A physical-quantity detection sensor as recited in claim 29, further comprising a memory (537) for storing reference data, a comparator (538) for comparing the digital signal generated by the A/D converter with the reference data stored in the memory, and means for detecting a malfunction of the signal processing circuit in response to a result of the comparing by the comparator.

31. A physical-quantity detection sensor as recited in claim 30, further comprising a D/A converter (535) for converting the digital signal generated by the A/D converter into an analog signal, an output circuit (536) for generating a voltage depending on the analog signal generated by the D/A converter, and means for, when a malfunction of the signal processing circuit is detected in response to the result of the comparing by the comparator, controlling the output circuit to output a voltage indicating the malfunction of the signal processing circuit.

32. A physical-quantity detection sensor as recited in claim 31, wherein the voltage outputted by the output circuit when a malfunction of the signal processing circuit is detected is outside a prescribed range for the voltage generated by the output circuit during the physical-quantity sensing mode of operation.

33. A physical-quantity detection sensor as recited in claim 21, further comprising a first memory for storing corrective data for the signal processing circuit and corrective data for the sensor portion, a second memory for storing corrective data for the signal processing circuit, and means provided in the signal processing circuit for using the corrective data stored in the second memory during the checking mode of operation.

34. A physical-quantity detection sensor as recited in claim 33, further comprising a chip on which the signal processing circuit and the sensor portion are formed.

35. A physical-quantity detection apparatus comprising:
a first sensor circuit (710) including a first sensing portion (711) for generating and outputting a signal depending on a physical quantity;
reference generation means (720) for generating a reference signal (V1, V2) depending on the physical quantity;
comparing means (730) directly connected with the first sensor circuit and the reference generation means for comparing the signal outputted by the first sensor circuit with the reference signal generated by the reference generation means; and
means for generating a malfunction detection signal on the basis of a result of the comparing by the comparing means.

36. A physical-quantity detection apparatus as recited in claim 35, wherein the reference generation means (720) comprises a second sensor circuit (720) including a second sensing portion (721) for generating a signal representing an upper-limit reference value (V1) and a signal representing a lower-limit reference value (V2), and the comparing means comprises means for determining whether or not the signal outputted by the first sensor circuit is in a range between the upper-limit reference value and the lower-limit reference value.

37. A physical-quantity detection apparatus as recited in claim 36, wherein the reference generation means (720) comprises a positive power supply terminal (701a) subjected to a power supply voltage, a series combination of resistors connected between the positive power supply terminal and an output terminal of the second sensor circuit for executing voltage division to generate the signal representing the upper-limit reference value, a ground terminal (701c), and a series combination of resistors connected between the ground terminal and the output terminal of the second sensor circuit for executing voltage division to generate the signal representing the lower-limit reference value.

38. A physical-quantity detection apparatus as recited in claim 35, further comprising a first terminal (701a), means for applying a power supply voltage (Vcc) to the first sensor circuit via the first terminal, and current controlling means (740) connected to the first terminal for varying a current in response to the result of the comparing by the comparing means, and generating the malfunction detection signal on the basis of a variation in a current flowing through the first terminal.

39. A physical-quantity detection apparatus as recited in claim 38, further comprising a second terminal (701b) for the signal outputted by the first sensor circuit, and a third terminal (701c) connected to a ground.

40. A physical-quantity detection apparatus as recited in claim 38, wherein the reference generation means (720) comprises a second sensor circuit (720) including a second sensing portion (721) for generating a signal representing an upper-limit reference value (V1) and a signal representing a lower-limit reference value (V2), and the comparing means comprises means for determining whether or not the signal outputted by the first sensor circuit is in a range between the upper-limit reference value and the lower-limit reference value, and wherein the current controlling means comprises a first element (742), a second element (743, 744), means responsive to the result of the comparing by the comparing means for enabling a current to flow through the first element and inhibiting a current from flowing through the second element when the signal outputted by the first sensor circuit is in the range between the upper-limit reference value and the lower-limit reference value, means responsive to the result of the comparing by the comparing means for inhibiting a current from flowing through the first element and enabling a current to flow through the second element when the signal outputted by the first sensor circuit is not in the range between the upper-limit reference value and the lower-limit reference value, and means for generating the malfunction detection signal on the basis of a variation in a current flowing through the first element and a variation in a current flowing through the second element.

41. A physical-quantity detection apparatus comprising:
a first sensor circuit (710) including a first sensing portion (711) for generating and outputting a signal depending on a physical quantity;
reference generation means (720) for generating a reference signal (V1, V2) depending on the physical quantity;
comparing means (730) directly connected with the first sensor circuit and the reference generation means for comparing the signal outputted by the first sensor circuit with the reference signal generated by the reference generation means; and
means for outputting information of a result of the comparing by the comparing means via power fed to the first sensor circuit.

42. A physical-quantity detection apparatus as recited in claim 41, further comprising a first terminal (701a), means for applying a power supply voltage (Vcc) to the first sensor circuit via the first terminal, and current controlling means (740) connected to the first terminal for varying a current in response to the result of the comparing by the comparing means, and generating the information of the result of the comparing by the comparing means on the basis of a variation in a current flowing through the first terminal.

43. A physical-quantity detection apparatus as recited in claim 41, wherein the reference generation means (720) comprises a second sensor circuit (720) including a second sensing portion (721) for generating a signal representing an upper-limit reference value (V1) and a signal representing a lower-limit reference value (V2), and the comparing means comprises means for determining whether or not the signal outputted by the first sensor circuit is in a range between the upper-limit reference value and the lower-limit reference value, and wherein the reference generation means (720) further comprises a positive power supply terminal (701a) subjected to a power supply voltage, a series combination of resistors connected between the positive power supply terminal and an output terminal of the second sensor circuit for executing voltage division to generate the signal representing the upper-limit reference value, a ground terminal (701c), and a series combination of resistors connected between the ground terminal and the output terminal of the second sensor circuit for executing voltage division to generate the signal representing the lower-limit reference value.

44. A physical-quantity detection apparatus as recited in claim 43, wherein the second sensor circuit is higher in sensitivity than the first sensor circuit.

45. A sensor-signal processing apparatus comprising:

a power supply terminal;

means for feeding, via the power supply terminal, a power supply voltage for operating a sensor;

current detecting means (759, 760) for generating a voltage depending on a current flowing through the power supply terminal;

signal converting means (761) for converting an output voltage from the sensor into a first conversion-resultant signal, and converting the voltage generated by the current detecting means into a second conversion-resultant signal; and signal processing means (762) for processing the first conversion-resultant signal generated by the signal converting means, and detecting a malfunction of the sensor in response to the second conversion-resultant signal generated by the signal converting means.

46. A physical-quantity detection apparatus as recited in claim 35, wherein the comparing means comprises a window comparator (730).

47. A sensor-signal processing apparatus as recited in claim 45, wherein the sensor is connected with the current detecting means and the signal converting means via only three terminals including the power supply terminal.

48. A sensor-signal processing apparatus as recited in claim 45, wherein the current detecting means comprises a current mirror circuit (759) and a resistor (760) connected with the current mirror circuit.

* * * * *